United States Patent
Shimada et al.

[11] Patent Number: 6,033,828
[45] Date of Patent: Mar. 7, 2000

[54] PARTIALLY HYDROGENATED POLYMERS AND CHEMICALLY AMPLIFIED POSITIVE RESIST COMPOSITIONS

[75] Inventors: Junji Shimada; Osamu Watanabe; Satoshi Watanabe; Shigehiro Nagura; Toshinobu Ishihara, all of Nakakubiki-gun, Japan

[73] Assignee: Shin-Etsu Chemical Co., Ltd., Tokyo, Japan

[21] Appl. No.: 09/012,583

[22] Filed: Jan. 26, 1998

[30] Foreign Application Priority Data

Jan. 27, 1997 [JP] Japan ................................. 9-27218

[51] Int. Cl.$^7$ .......................... G03C 1/492; C03F 12/08; C08F 12/24
[52] U.S. Cl. .................. 430/270.11; 525/333.3; 525/328.8; 526/313
[58] Field of Search .......... 430/270.1; 526/313, 526/333, 346, 347; 525/333.3, 328.8

[56] References Cited

U.S. PATENT DOCUMENTS

| | | | |
|---|---|---|---|
| 4,631,247 | 12/1986 | Tise | 430/281 |
| 5,714,559 | 2/1998 | Schacht et al. | 526/313 |
| 5,731,386 | 3/1998 | Thackeray et al. | 525/328.2 |
| 5,834,531 | 11/1998 | Schacht et al. | 522/178 |
| 5,846,688 | 12/1998 | Fukui et al. | 430/270.1 |
| 5,928,818 | 7/1999 | Mertesdorf et al. | 430/18 |

FOREIGN PATENT DOCUMENTS

| | | |
|---|---|---|
| 62-115440 | 5/1987 | Japan . |
| 63-27829 | 2/1988 | Japan . |
| 2-27660 | 6/1990 | Japan . |
| 3-223858 | 10/1991 | Japan . |
| 4-211258 | 8/1992 | Japan . |
| 5-127386 | 5/1993 | Japan . |
| 6-100488 | 4/1994 | Japan . |
| 8-25353 | 10/1996 | Japan . |
| 8-253534 | 10/1996 | Japan . |

OTHER PUBLICATIONS

English Abstract of JP–A 6–100488/1994.
English Abstract of JP–A 3–223858/1991.
English Abstract of JP–A 62–115440/1987.
English Abstract JP–A 63–27829/1988.
English Abstract of JP–A 4–211258/1992.
English Abstract of JP–A 8–253533/1996.
English Abstract of JP–A 5–127386/1993.
English Abstract of JP–A 8–253534/1996.
English Abstract of JP–B 2–27660/1990.

*Primary Examiner*—Janet Baxter
*Assistant Examiner*—Rosemary Ashton
*Attorney, Agent, or Firm*—Millen, White, Zelan, & Branigan, P.C.

[57] ABSTRACT

A polymer comprising recurring units of formula (1) is provided wherein some of the hydrogen atoms of phenolic hydroxyl groups and/or alcoholic hydroxyl groups are replaced by acid labile groups. The polymer is crosslinked within a molecule and/or between molecules with a crosslinking group having a C—O—C linkage resulting from reaction of some of the remaining phenolic hydroxyl groups and/or alcoholic hydroxyl groups with an alkenyl ether compound or halogenated alkyl ether compound. The amount of the acid labile group and the crosslinking group combined is on the average from more than 0 mol % to 80 mol % of the entirety of the phenolic hydroxyl group and alcoholic hydroxyl group. The polymer has Mw of 1,000–500,000.

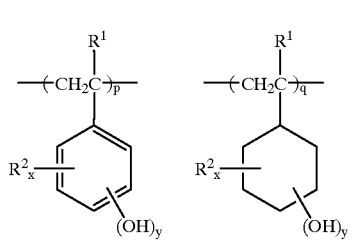

(1)

$R^1$ is H or methyl, $R^2$ is $C_1$–$C_8$ alkyl, letter x is 0 or a positive integer, y is a positive integer, $x+y \leq 5$, letters p and q are positive numbers satisfying $p+q=1$ and $0<q/(p+1) \leq 0.9$. A chemically amplified positive resist composition comprising the polymer as a base resin has high sensitivity and resolution and forms resist patterns having plasma etching resistance, heat resistance, overhang prevention, and dimensional controllability.

23 Claims, No Drawings

PARTIALLY HYDROGENATED POLYMERS AND CHEMICALLY AMPLIFIED POSITIVE RESIST COMPOSITIONS

BACKGROUND OF THE INVENTION

1. Field of the Invention

This invention relates to a partially hydrogenated polymer having acid labile groups of at least one type in which some of the phenolic hydroxyl groups and/or alcoholic hydroxyl groups are crosslinked with a crosslinking group having a C—O—C linkage within a molecule and/or between molecules. It also relates to a chemically amplified positive resist composition comprising the polymer as a base resin which has a high alkali dissolution contrast before and after exposure, high sensitivity and high resolution and is thus suitable as a fine pattern forming material for use in the manufacture of ultra-LSIs.

2. Prior Art

As the LSI technology tends toward higher integration and higher speed, further refinement of pattern rules is required. Under such circumstances, deep-ultraviolet lithography is regarded promising as the next generation of fine patterning technology. The deep-UV lithography is capable of working on the order of 0.5 $\mu$m or less and makes it possible to form a resist pattern having a side wall nearly perpendicular to the substrate if a less light absorbing resist material is used.

A number of chemically amplified positive working resist materials using acid catalysts were recently developed as disclosed in JP-B 27660/1990, JP-A 27829/1988, U.S. Pat. Nos. 4,491,628 and 5,310,619. They utilize a high illuminance KrF excimer laser as a deep-UV light source. Since these materials have high sensitivity, resolution and dry etching resistance, they are promising as resist materials especially suited for deep-UV lithography.

The chemically amplified, positive resist materials being known include those of the two-component system comprising a base resin and a photoacid generator and those of the three-component system comprising a base resin, a photoacid generator, and a dissolution inhibitor having an acid labile group.

JP-A 115440/1987 discloses a resist composition comprising poly-4-butoxystyrene and a photoacid generator. Similarly, JP-A 223858/1991 discloses a two-component system resist composition comprising a resin having a tert-butoxy group in its molecule and a photoacid generator and JP-A 211258/1992 discloses a two-component system resist composition comprising a polyhydroxystyrene containing a methyl, isopropyl, tert-butyl, tetrahydro-pyranyl or trimethylsilyl group in its molecule and a photoacid generator.

Furthermore, JP-A 100488/1994 proposes a resist composition comprising a polyhydroxystyrene derivative such as poly[3,4-bis(2-tetrahydropyranyloxy)styrene], poly[3,4-bis(tert-butoxycarbonyloxy)styrene], and poly[3,5-bis(2-tetrahydropyranyloxy)styrene] and a photoacid generator.

The base resins used in these resist compositions have an acid labile group in a side chain. If the acid labile group is a strong acid-decomposable one such as tert-butyl and tert-butoxycarbonyl group, the acid labile group is deactivated through reaction with air-borne basic compounds and becomes unlikely to decompose. Such a resist composition tends to form a pattern having a T-top profile. On the other hand, if the acid labile group is an alkoxyalkyl group such as ethoxyethyl which is decomposable with weak acid, the resist composition is little affected by air-borne basic compounds, but forms a pattern which will become extremely thin with the lapse of time from exposure to heat treatment. The inclusion of a bulky group in a side chain can detract from heat resistance. The composition is less satisfactory in sensitivity and resolution.

Also, polyvinylphenol resins have been widely used as the base resin although resist films thereof are not satisfactorily transparent to deep UV radiation. Since deep UV radiation is not transmitted to the interface between the resist film and the substrate, the dissolution of the resist film in a developer solution becomes uneven in a film thickness direction, resulting in poorly configured resist patterns. No polyvinylphenol resin bases resist materials have reached the practically acceptable level.

In this connection, it is known from JP-A 127386/1993 and 253533/1996 to use a hydrogenated polyvinylphenol derivative as the base resin for the purpose of improving transmittance. Although this approach is successful in improving the pattern configuration to some extent, further improvements in resolution and heat resistance are desired in order to meet the enhanced demand for modern resists.

JP-A 253534/1996 discloses a crosslinked polymer which is suitable as a binder for DUV resist materials having processing stability, high contrast, and good resolution. A by-product is formed as a result of elimination of an acid labile group from the polymer. The by-product can be attached to the base resin again to reduce the differential dissolution rate and hence, the contrast and also causes the exposed region to be partially left undissolved after development, causing scum to generate. The desired resolution enhancement is nut fully accomplished. Further, since both an acetal or ketal group and a crosslinking group are attached to the base resin with an identical reagent, molecular weight control is difficult. Since the choice of the acetal or ketal group and the crosslinking group is constrained, the problem of heat resistance is not fully solved. With these and other problems unsolved, none of the resist compositions thus far proposed are practically satisfactory. There is a desire to overcome these problems.

SUMMARY OF THE INVENTION

Therefore, an object of the invention is to provide a partially hydrogenated polymer suitable as a base resin of a chemically amplified positive resist composition. Another object of the invention is to provide a chemically amplified positive resist composition comprising the polymer as a base resin which has superior sensitivity, resolution, exposure latitude, and process adaptability to conventional resist compositions.

We have found that a novel partially hydrogenated polymer bearing at least one acid labile group, crosslinked within a molecule and/or between molecules with a crosslinking group having a C—O—C linkage, and having a weight average molecular weight of 1,000 to 500,000 can be produced by a method to be described later and is useful as a base resin. By blending this novel polymer as a base resin with a photoacid generator and optionally, a dissolution regulator and a basic compound, there is obtained a chemically amplified positive resist composition which is improved in that the dissolution contrast of a resist film is increased, especially a dissolution rate after exposure is increased. By further blending an aromatic compound having a group ≡C—COOH in a molecule, there is obtained a chemically amplified positive resist composition which is improved in that the resist is improved in PED stability and edge roughness on a nitride film substrate is improved. By further blending an acetylene alcohol derivative, the resist composition is improved in coating and storage stability, forms resists having high resolution, improved latitude of exposure, and improved process adaptability, and is well suited for practical use and advantageously used in precise fine patterning, especially in ultra-LSI manufacture.

In a first aspect, the present invention provides a partially hydrogenated polymer comprising recurring units of the following general formula (1). Some of the hydrogen atoms of phenolic hydroxyl groups and/or alcoholic hydroxyl groups are replaced by acid labile groups of at least one type. The polymer is crosslinked within a molecule and/or between molecules with a crosslinking group having a C—O—C linkage resulting form reaction of some of the remaining phenolic hydroxyl groups and/or alcoholic hydroxyl groups with an alkenyl ether compound or halogenated alkyl ether compound. The amount of the acid labile group and the crosslinking group combined is on the average from more than 0 mol % to 80 mol % of the entirety of the phenolic hydroxyl group and alcoholic hydroxyl group. The polymer has a weight average molecular weight of 1,000 to 500,000.

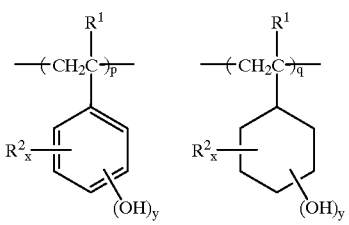

(1)

$R^1$ is hydrogen or methyl, $R^2$ is a normal, branched or cyclic alkyl group of 1 to 8 carbon atoms, letter x is 0 or a positive integer, y is a positive integer, the sum of x+y is up to 5, letters p and q are positive numbers satisfying p+q=1 and $0<q/(p+q)\leq 0.5$.

In one preferred embodiment, the partially hydrogenated polymer comprises recurring units of the following general formula (2). The polymer is crosslinked within a molecule and/or between molecules with a crosslinking group having a C—O—C linkage resulting from reaction of some of the phenolic hydroxyl groups and/or alcoholic hydroxyl groups represented by R with an alkenyl ether compound or halogenated alkyl ether compound. The amount of the acid labile group and the crosslinking group combined is on the average from more than 0 mol % to 80 mol % of the entirety of the phenolic hydroxyl group and alcoholic hydroxyl group in formula (1). The polymer has a weight average molecular weight of 1,000 to 500,000.

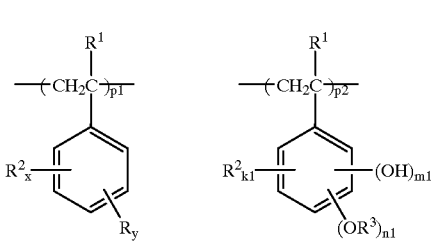

(2)

-continued

R is a hydroxyl group or $OR^3$, at least one of R groups is a hydroxyl group, $R^1$ is hydrogen or methyl, $R^2$ is a normal, branched or cyclic alkyl group of 1 to 8 carbon atoms, $R^3$ is an acid labile group, letter x is 0 or a positive integer, y is a positive integer, the sum of x+y is up to 5, letters k1, m1 and n1 are 0 or positive integers, the sum of k1+m1+n1 is up to 5, letters k2, m2 and n2 are 0 or positive integers, the sum of k2+m2+n2 is up to 5, with the proviso that n1 and n2 are not equal to 0 at the same time, letters p1 and p2 are 0 or positive numbers, q1 and q2 are 0 or positive numbers, and p1, p2, q1 and q2 satisfy $0 \leq p1/(p1+p2+q1+q2) \leq 0.8$, $0 \leq q1/(p1+p2+q1+q2) \leq 0.5$, $0.5 \leq (p1+p2)/(p1+p2+q1+q2) < 1$, $9 \leq (q1+q2)/(p1+p2+q1+q2) \leq 0.5$, and $p1+p2+q1+q2=1$, with the proviso that p1 and q1 are not equal to 0 at the same time and p2 and q2 are not equal to 0 at the same time.

In a further preferred embodiment, the partially hydrogenated polymer comprises recurring units of the following general formula (3). Some hydrogen atoms are eliminated from phenolic hydroxyl groups and/or alcoholic hydroxyl groups represented by R to leave oxygen atoms which are crosslinked with a crosslinking group having a C—O—C linkage of the following general formula (4a) or (4b) within a molecule and/or between molecules. The amount of the acid labile group and the crosslinking group combined is on the average from more than 0 mol % to 80 mol % of the entire hydrogen atoms of the phenolic hydroxyl group and alcoholic hydroxyl group in formula (1). The polymer has a weight average molecular weight of 1,000 to 500,000.

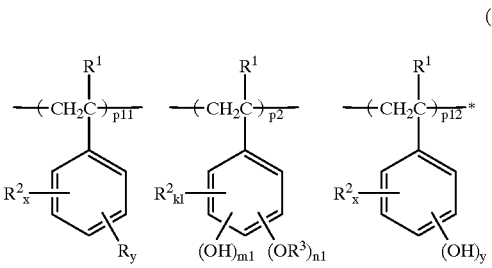

(3)

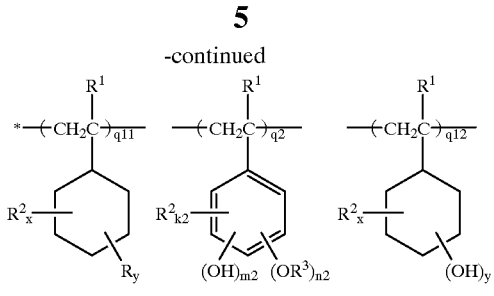
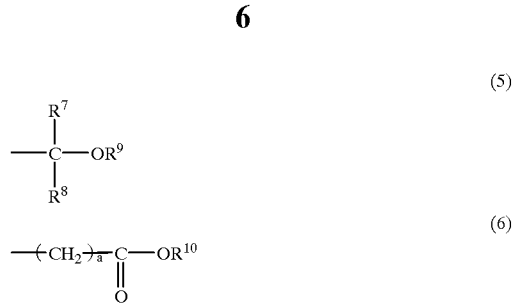

R is a hydroxyl group or $OR^3$, at least one of R groups is a hydroxyl group, $R^1$ is a hydrogen or methyl, $R^2$ is a normal, branched or cyclic alkyl group of 1 to 8 carbon atoms, $R^3$ is a group of the following general formula (5), a group of the following general formula (6), a tertiary alkyl group of 4 to 20 carbon atoms, a trialkylsilyl group whose alkyl groups each have 1 to 6 carbon atoms or an oxoalkyl group of 4 to 20 carbon atoms, letters p11, p12, p2, q11, q12 and q2 are 0 or positive numbers and satisfy $0 \leq p11/(p11+p12+p2+q11+q12+q2) \leq 0.8$, $0 \leq p2/(p11+p12+p2+q11+q12+q2) \leq 0.8$, $0 \leq q11/(p11+p12+p2+q11+q12+q2) \leq 0.5$, $0 \leq q2/(p11+p12+p2+q11+q12+q2) \leq 0.5$, $0.5 \leq (p11+p12+p2)/(p11+p12+p2+q11+q12+q2) < 1$, $0 < (q11+q12+q2)/(p11+p12+p2+q11+q12+q2) \leq 0.5$, and $p11+p12+p2+q11+q12+q2=1$, with the proviso that p11 and q11 are not equal to 0 at the same time and p2 and q2 are not equal to 0 at the same time, letters x, y, k1, m1, n1, k2, m2, and n2 are defined as above.

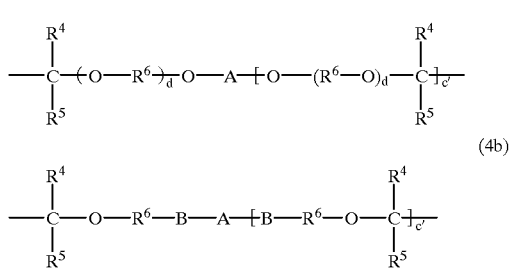

$R^4$ and $R^5$ each are hydrogen or a normal, branched or cyclic alkyl group of 1 to 8 carbon atoms, or $R^4$ and $R^5$, taken together, may form a ring, with the proviso that each or $R^4$ and $R^5$ is a normal or branched alkylene group of 1 to 8 carbon atoms when they form a ring, $R^6$ is a normal or branched alkylene group of 1 to 10 carbon atoms, letter d is 0 or an integer of 1 or 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c is an integer of 2 to 8, and c' is an integer of 1 to 7.

$R^7$ and $R^8$ each are hydrogen or a normal, branched or cyclic alkyl group of 1 to 8 carbon atoms, $R^9$ is a monovalent hydrocarbon group of 1 to 18 carbon atoms which may have a hetero atom, or $R^7$ and $R^8$, $R^7$ $R^9$, or $R^8$ and $R^9$, taken together, may form a ring, with the proviso that each of $R^7$, $R^8$ and $R^9$ is a normal or branched alkylene group of 1 to 6 carbon atoms when they form a ring, $R^{10}$ is a tertiary alkyl group of 1 to 12 carbon atoms, a trialkylsilyl group whose alkyl groups each have 1 to 6 carbon atoms, an oxoalkyl group of 4 to 20 carbon atoms or a group of formula (5), and letter $\underline{a}$ is an integer of 0 to 6.

Further preferably, the crosslinking group having a C—O—C linkage represented by the following general formula (4a) or (4b) is represented by the following general formula (4a''') or (4b''):

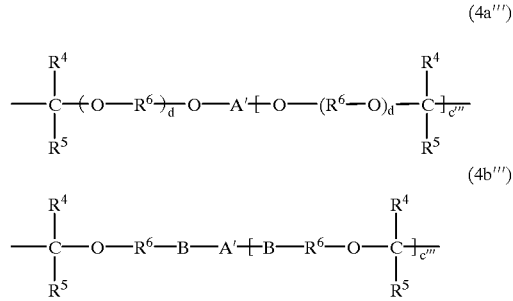

wherein $R^{4\ and\ R5}$ each are hydrogen or a normal, branched or cyclic alkyl group of 1 to 8 carbon atoms, or $R^4$ and $R^5$, taken together, may form a ring, with the proviso that each of $R^4$ and $R^5$ is a normal or branched alkylene group of 1 to 8 carbon atoms when they form a ring, $R^6$ is a normal or branched alkylene group of 1 to 10 carbon atoms, letter d is 0 or an integer of 1 to 5, A' is a C"-valent normal or branched alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c" is an integer of 2 to 4, and c''' is an integer of 1 to 3.

In a second aspect, the present invention provides a chemically amplified positive resist composition comprising
 (A) an organic solvent,
 (B) a base resin in the form of the partially hydrogenated polymer of any one of claims 1 to 4, and
 (C) a photoacid generator.

The resist composition may further contain (D) another base resin in the form of a polymer comprising recurring units of the following general formula (1), some of the hydrogen atoms of phenolic hydroxyl groups and/or alcoholic hydroxyl groups being replaced by acid labile groups of at least one type in an average proportion of 0 mol % to 80 mol % of the entirety, said polymer having a weight average molecular weight of 3,000 to 300,000,

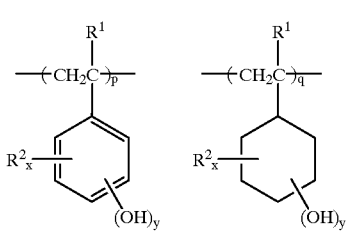

(1)

wherein $R^1$ is hydrogen or methyl, $R^2$ is a normal, branched or cyclic alkyl group of 1 to 8 carbon atoms, letter x is 0 or a positive integer, y is a positive integer, the sum of x+y is up to 5, letters p and q are positive numbers satisfying p+q=1 and $0 < q/(p+q) \leq 0.5$.

The resist composition may further contain at least one of (E) a dissolution regulator, (F) a basic compound, (G) an aromatic compound having a group: $\equiv$C—COOH in a molecule, and (H) an acetylene alcohol derivative.

When the partially hydrogenated polymer defined above is blended in a resist composition as a base resin, advantages of a significant dissolution inhibitory effect and a greater dissolution contrast after exposure are obtained especially by virtue of the crosslinking through a crosslinking group having a C—O—C linkage.

In the case of a polymer having an alkoxyalkyl group attached simply to a side chain, formation of a T-top profile is avoided because deblocking reaction takes place with weak acid. However, since that polymer is sensitive to acid, the pattern configuration is significantly thinned with the lapse of time from exposure to heat treatment. Since the alkali dissolution inhibitory effect is low, a high substitution product must be used to insure dissolution contrast at the sacrifice of heat resistance. On the other hand, a polymer wherein a phenolic hydroxyl group on a side chain is protected with a tert-butoxycarbonyl group, when blended in a resist material, has advantages that the alkali dissolution inhibitory effect is improved, a high dissolution contrast is obtained with a low degree of substituting, and heat resistance is good. In order to eliminate the protective group to render the polymer alkali soluble, a photoacid generator capable of generating a strong acid such as trifluoromethanesulfonic acid is necessary. The use of such acid leads to the undesirable tendency to form a T-top profile.

In contrast to these polymers, a partially hydrogenated polymer crosslinked within a molecule and/or between molecules with a crosslinking group having a C—O—C linkage as obtained by reacting some phenolic hydroxyl groups and/or alcoholic hydroxyl groups with an alkenyl ether compound or halogenated alkyl ether compound is advantageous in that a resist composition having the partially hydrogenated/crosslinked polymer blended therein overcomes the drawback of low heat resistance of a polymer having a side chain protected with an acetal group and the drawback of T-top profile forming tendency of a polymer protected with a tert-butoxycarbonyl group.

The partially hydrogenated polymer used in the chemically amplified positive resist composition according to the invention has further advantages. Since the partially hydrogenated polymer of the invention is crosslinked with a crosslinking group having an acid labile C—O—C linkage and protected with an acid labile group, unexposed areas of a resist film remain unchanged with respect to weight average molecular weight and solubility in alkaline developer whereas the weight average molecular weight of exposed areas is restored to the weight average molecular weight of alkali soluble base resin prior to the protection with the crosslinking and acid labile groups, through decomposition by the generated acid and further through elimination of the acid labile group. Then the rate of alkali dissolution in the exposed areas is significantly increased as compared with the unexposed areas, resulting in an increased dissolution contrast. Since the by-product resulting from the elimination of the crosslinking group is a diol compound, the re-attachment of the by-product to the base resin in constrained. This restrains a drop of the dissolution rate difference between exposed and unexposed regions, that is, a contrast drop and prevents scum generation.

The use of a partially hydrogenated polymer as the base resin has the advantage of improved transparency of a resist film to the deep UV radiation. This allows the reaction of eliminating the protective group to proceed uniformly in a film thickness direction. The hydrophilic nature of the deblocked by-product or diol compound to a developer solution is effective in improving the penetration of the developer solution to the exposed regions for providing uniform dissolution in a film thickness direction. Then the resist pattern configuration is improved and as a result, high resolution is achieved. By introducing the acetal or ketal group and the crosslinking group using different reagents, there is obtained a polymer exhibiting more heat resistance for any combination of protective groups.

DETAILED DESCRIPTION OF THE INVENTION

Polymer

The novel polymer of the present invention is a partially hydrogenated high molecular weight compound which has at least one type of acid labile group, is crosslinked within a molecule and/or between molecules with a crosslinking group having a C—O—C linkage, and has a weight average molecular weight of 1,000 to 500,000.

Specifically, the inventive polymer is a partially hydrogenated polymer having recurring units of the following general formula (1), wherein the hydrogen atom of some phenolic hydroxyl groups and/or alcoholic hydroxyl groups is partially replaced by an acid labile group of at least one type. The polymer is crosslinked within a molecule and/or between molecules with a crosslinking group having a C—O—C linkage resulting from reaction between some of the remaining phenolic hydroxyl groups and/or alcoholic hydroxyl groups and an alkenyl ether compound or a halogenated alkyl ether compound.

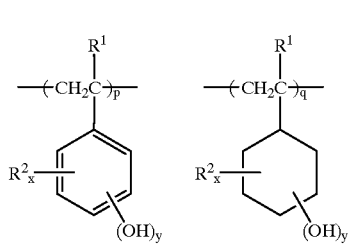

(1)

In formula (1), $R^1$ is a hydrogen atom or methyl group. $R^2$ is a normal, branched or cyclic alkyl group having 1 to 8 carbon atoms, preferably 1 to 5 carbon atoms, more preferably 1 to 3 carbon atoms. Example of the normal, branched or cyclic alkyl group include methyl, ethyl, propyl, isopropyl, n-butyl, iso-butyl, tert-butyl, cyclohexyl and cyclopentyl.

Letter x is 0 or a positive integer, y is a positive integer, the sum of x+y is up to 5. Preferably y is an integer of 1 to 5, especially 1 to 3. Letters p and q representative of the proportions of styrene and hydroxystyrene units, respectively, are positive numbers satisfying p+1=1 and 0<q/(p+q)≦0.5, especially 0.1≦q/(p+q)≦0.3. If q/(p+q) is more than 0.5, then the hydrogenated resin moiety becomes alkali insoluble and thus inadequate as a base resin for resists. As q/(p+q) becomes lower, the performance improving effect of hydrogenation diminishes. By properly selecting the values of p and q in the above-described range, the size and configuration of a resist pattern can be controlled as desired.

More particularly, the inventive polymer is a partially hydrogenated polymer having recurring units of the following general formula (2), which is crosslinked within a molecule and/or between molecules with a crosslinking group having a C—O—C linkage resulting from reaction of some of the phenolic hydroxyl groups and/or alcoholic hydroxyl groups represented by R with an alkenyl ether compound or halogenated alkyl ether compound.

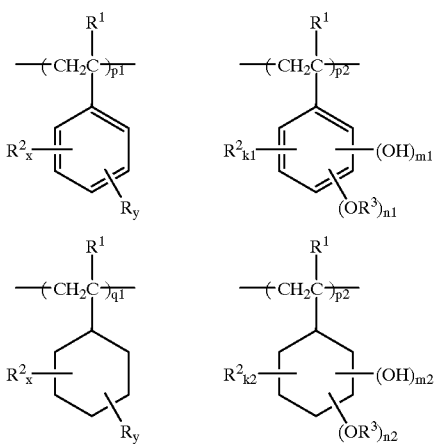

(2)

In formula (2), R is a hydroxyl group or $OR^3$, and at least one R groups is a hydroxyl group. $R^1$ is hydrogen or methyl. $R^2$ is a normal, branched or cyclic alkyl group of 1 to 8 carbon atoms. $R^3$ is an acid labile group. Letter x is 0 or a positive integer, y is a positive integer, and the sum of them is up to 5, that is, x+y≦5. Letters k1, m1 and n1 are 0 or positive integers, and the sum of them is up to 5, that is, k1+m1+n1≦5. Letters k2, m2 and n2 are 0 or positive integers, and the sum of them is up to 5, that is , k2+m2+n2≦5. Letters n1 and n2 are not equal to 0 at the same time. Letters p1 and p2 are 0 or positive numbers, q1 and q2 satisfy 0≦p1/(p1+p2 +q1+q2)≦0.8, 0≦q1/(p1+p2+q1+q2) ≦0.5, 0.5≦(p1+p1)/(p1+p2+q1+q2)<1, 0<(q1+q2)/(p1+p2+q1+q2)≦0.5, and p1+p1+q1+q2=1. Letters p1 and q1 are not equal to 0 at the same time, and p2 and q2 are not equal to 0 at the same time. It is noted that p1+p2+p and q1+q2=q, and p and q are as defined above.

Illustrative examples of $R^1$ and $R^2$ and the preferred range of y are as described above in connection with formula (1). Preferably n1 is equal to 1 to 3, m1 is equal to 0 to 2 , n2 is equal to 1 to 3, and m2 is equal to 0 to 2.

The acid labile group which substitutes for the hydrogen atom of a phenolic hydroxyl group and/or alcoholic hydroxyl group or which is represented by $R^3$ may be selected from a variety of acid labile groups, preferably from groups of the following formulae (5) and (6), tert-alkyl groups of 4 to 20 carbon atoms, trialkylsilyl groups whose alkyl groups each have 1 to 6 carbon atoms, and oxoalkyl groups of 4 to 20 carbon atoms.

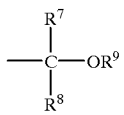

(5)

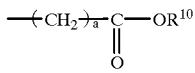

(6)

In formulae (5) and (6), $R^7$ and $R^8$ each are a hydrogen atom or normal, branched or cyclic alkyl group having 1 to 8 carbon atoms, preferably 1 to 6 carbon atoms, more preferably 1 to 5 carbon atoms. $T^⊖$ is a monovalent hydrocarbon group of 1 to 18 carbon atoms, preferably 1 to 10 carbon atoms, more preferably 1 to 8 carbon atoms, which may have a hetero atom such as oxygen. Alternatively, $R^7$ and $R^{8, R7}$ and $R^9$, or $R^8$ and $R^9$, taken together, may form a ring, with the proviso that $R^7$, $R^8$ and $R^9$ each are a normal or branched alkylene group having 1 to 18 carbon atoms, preferably 1 to 10 carbon atoms, more preferably 1 to 8 carbon atoms, when they form a ring. $R^{10}$ is a tertiary alkyl group having 4 to 20 carbon atoms, preferably 4 to 15 carbon atoms, more preferably 4 to 10 carbon atoms, a trialkylsilyl group whose alkyl groups each have 1 to 6 carbon atoms, an oxoalkyl group of 4 to 20 carbon atoms, preferably 4 to 15 carbon atoms, more preferably 4 to 10 carbon atoms, or a group of formula (5). Letter a is an integer of 0 to 6.

Examples of the normal, branched or cyclic alkyl group of 1 to 8 carbon atoms represented by $R^7$ and $R^8$ are as described for $R^2$.

Examples of the hydrocarbon group represented by $R^9$ include normal, branched or cyclic alkyl groups, substituted or unsubstituted aryl groups such as phenyl, p-methylphenyl, p-ethylphenyl, and alkoxyphenyl groups (e.g., p-methoxyphenyl,), and aralkyl groups such as benzyl and phenethyl, as well as modified ones of these groups, for example, alkyl groups in which an oxygen atom intervenes, or the hydrogen atom attached to a carbon atom is replaced by a hydroxyl group, or two hydrogen atoms are replaced by an oxygen atom to form a carbonyl group, as shown below.

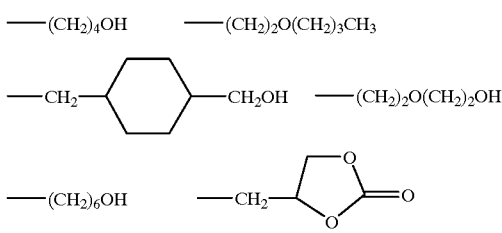

Examples of the tertiary alkyl group of 4 to 20 carbon atoms represented by $R^{10}$ include tert-butyl, 1-methylcyclohexyl, 2-(2-methyl)adamantyl and tert-amyl groups.

Examples of the trialkylsilyl group whose alkyl groups each have 1 to 6 carbon atoms, represented by $R^{10}$, include trimethylsilyl, triethylsilyl and dimethyl-tert-butyl groups.

Examples of the oxoalkyl group of 4 to 20 carbon atoms, represented by $R^{10}$, include 3-oxocyclohexyl and groups of the following formulae.

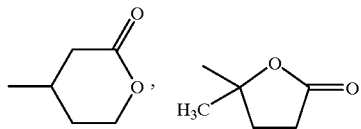

Examples of the acid labile group of formula (5) include linear or branched acetal groups such as 1-methoxyethyl, 1-ethoxyethyl, 1-n-propoxyethyl, 1-iso-propoxyethyl, 1-n-butoxyethyl, 1-iso-butoxyethyl, 1-sec-butoxyethyl, 1-tert-butoxyethyl, 1-tert-amyloxyethyl, 1-ethoxy-n-propyl, 1-cyclohexyloxyethyl, methoxypropyl, ethoxypropyl, 1-methoxy-1-methylethyl, and 1-ethoxy-1-methylethyl; and cyclic acetal groups such as tetrahydrofuranyl and tetrahydropyranyl, with the ethoxyethyl, butoxyethyl and ethoxypropyl groups being preferred. Examples of the acid labile group of formula (6) include tert-butoxycarbonyl, tert-butoxycarbonylmethyl, tert-amyloxycarbonyl, tert-amyloxycarbonylmethyl, 1-ethoxyethoxycarbonylmethyl, 2-tertahydropyranyloxycarbonylmethyl, and 2-tetrahydrofuranyloxycarbonylmethyl groups.

The crosslinking group having a C—O—C linkage is exemplified by groups of the following general formulae (4a) and (4b).

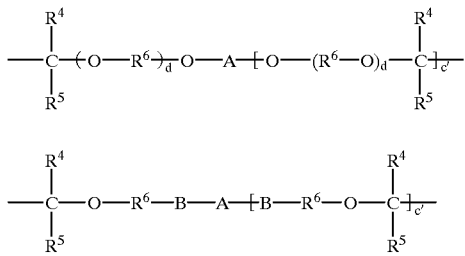

In these formulae, $R^4$ and $R^5$ each are hydrogen or a normal, branched or cyclic alkyl group of 1 to 8 carbon atoms. Alternatively, $R^4$ and $R^5$, taken together, may form a ring, with the proviso that each of $R^4$ and $R^5$ is a normal or branched alkylene group of 1 to 8 carbon atoms when they form a ring. $R^6$ is a normal or branched alkylene group of 1 to 10 carbon atoms. Letter d is 0 or an integer of 1 to 10. A is a c-valent aliphatic or alicyclic saturated hydrocarbon group, aromatic hydrocarbon group or heterocyclic group of 1 to 50 carbon atoms (preferably, normal or branched alkylene, alkyltriyl and alkyltetrayl groups of 1 to 20 carbon atoms or arylene groups of 6 to 30 carbon atoms), which may have an intervening hetero atom and in which the hydrogen atom attached to a carbon atom may be partially replaced by a hydroxyl group, carboxyl group, acyl group or fluorine atom. B is —CO—)—, —NHCO—O— or —NHCONH—. Letter c is an integer of 2to 8, and c' is an integer of 1 to 7.

The normal, branched or cyclic alkyl groups of 1 to 8 carbon atoms are as exemplified above. Examples of the group represented by A are described later. These crosslinking groups of formulae (4l) and (4b) originate from compounds to be described later.

As understood from the value of c' in formula (4a) or (4b), the crosslinking group is not limited to a divalent one and trivalent to octavalent groups are acceptable. For example, the divalent crosslinking group is exemplified by groups of the following formulae (4a') and (4b') and the trivalent crosslinking group is exemplified by groups of the following formulae (4a") and (4b").

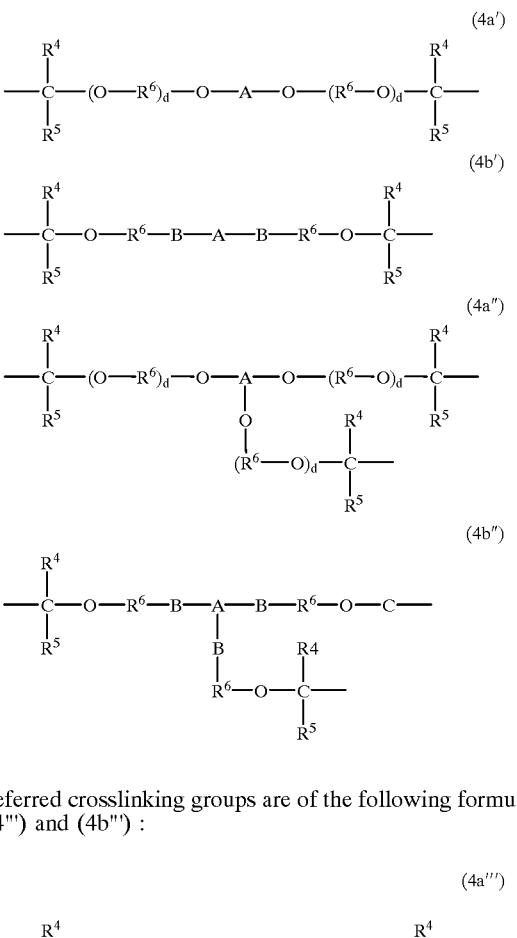

Preferred crosslinking groups are of the following formulae (4'") and (4b'") :

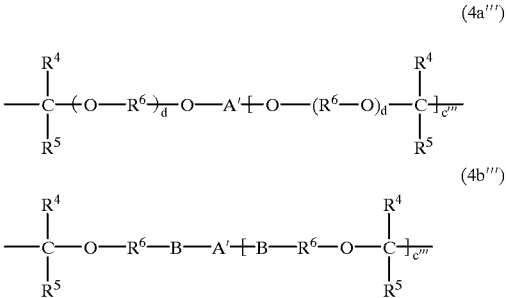

wherein $R^4$ and $R^5$ each are hydrogen or a normal, branched or cyclic alkyl group of 1 to 8 carbon atoms, or $R^4$ and $R^5$, taken together, may form a ring, with the proviso that each of $R^4$ and $R^5$ is a normal or branched alkylene group of 1 to 8 carbon atoms when they form a ring, $R^6$ is a normal or branched alkylene group of 1 to 10 carbon atoms, letter d is 0 or an integer of 1 to 5, A' is a c"-valent normal or branched alkylene, alkyltriyl or alkyltetrayl group of 1 to 20 carbon atoms or an arylene group of 6 to 30 carbon atoms, which may have an intervening hetero atom and in which the hydrogen atom attached to the carbon atom may be partially replaced by a hydroxyl group, carboxyl group, acyl group or fluorine atom, B is —CO—)—, —NHCO—O— or —NHCONH—, letter c" is an integer of 2 to 4, and C'" is an integer of 1 to 3.

More specifically, the inventive polymer is a partially hydrogenated polymer having recurring units of the following general formula (3) which is crosslinked within a molecule and/or between molecules through the mechanism that hydrogen atoms are eliminated form phenolic hydroxyl groups and/or alcoholic hydroxyl groups represented by R to leave oxygen atoms which are connected by a crosslinking groups having a C—O—C linkage of the general formula (4a) or (4b).

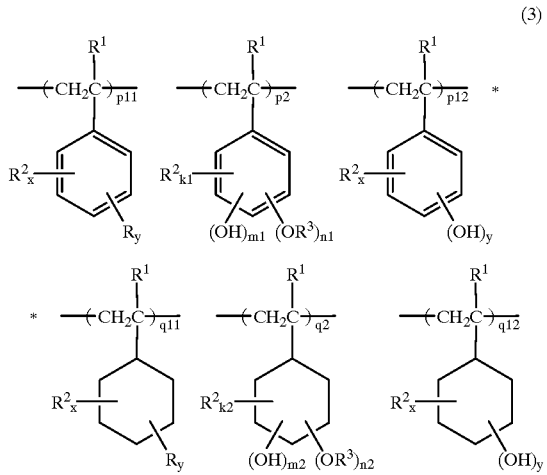

(3)

In formula (3), R is a hydroxyl group or OR, with at least one of R groups being a hydroxyl group. $R^1$ is hydrogen or methyl. $R^2$ is a normal, branched or cyclic alkyl group of 1 to 8 carbon atoms. $R^3$ is a group of the following general formula (5), a group of the following general formula (6), a tertiary alkyl group of 4 to 20 carbon atoms, a trialkylsilyl group whose alkyl groups each have 1 to 6 carbon atoms or an oxoalkyl group of 4 to 20 carbon atoms. Letters p11, p12, p2, q11, q12 and q2 are 0 or positive numbers and satisfy $0 \leq p11/(p11+p12+p2+q11+q12+q2) \leq 0.8$, $0 \leq p2/(p11+p12+p2+q11+q12+q2) \leq 0.8$, $0 \leq q11/(p11+p12+p2+q11+q12+q2) \leq 0.5$, $0 \leq q2/(p11+p12+p2+q11+q12+q2)(\leq 0.5$, $0.5 \leq (p11+p12+p2)/(p11+p12+p2+q11+q12+q2)<1$, $0<(q11+q12+q2)/(p11+p12+p2+q11+q12+q2) \leq 0.5$, and $p11+p12+p2+q11+q12+q2=1$, with the proviso that p11 and q11 are not equal to 0 at the same time and p2 and q2 are not equal to 0 at the same time. Letters x, y, k1, m1, n1 k2, m2, and n2 are as defined above.

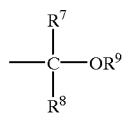

(5)

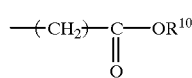

(6)

In formulae (5) and (6), $R^7$ and $R^8$ each are a hydrogen atom or normal, branched or cyclic alkyl group having 1 to 8 carbon atoms. $R^9$ is a monovalent hydrocarbon group of 1 to 18 carbon atoms which may have a hetero atom. Alternatively, $R^7$ and $R^8$, $R^7$ and $R^9$, or $R^8$ and $R^9$, taken together, may form a ring, with the proviso that $R^7$, $R^8$ and $R^9$ each are a normal or branched alkylene group having 1 to 6 carbon atoms when they form a ring. $R^{10}$ is a tertiary alkyl group whose alkyl groups each have 1 to 6 carbon atoms, an oxoalkyl group having 1 to 12 carbon atoms, a trialkylsilyl group of 4 to 20 carbon atoms, or a group of formula (5). Letter a is an integer of 0 to 6.

Illustrative examples of R, $R^1$ to $R^{20}$ and the preferred ranges of b, x, y, k1, m1, n1, k2, m2, n2 and a in formula (3) are as described above.

Letters p11, p12, p2, q11, q12 and q2 are numbers as defined above. In formula (3), p11, p12, p2, q11, q12 and q2 preferably satisfy the following ranges:

$$0 < \frac{p11}{p11+p12+p2+q11+q12+q2} \leq 0.6,$$

$$\text{especially } 0.002 \leq \frac{p11}{p11+p12+p2+q11+q12+q2} \leq 0.4$$

$$0 \leq \frac{p12}{p11+p12+p2+q11+q12+q2} \leq 0.8,$$

$$\text{especially } 0.2 \leq \frac{p12}{p11+p12+p2+q11+q12+q2} \leq 0.8$$

$$0 \leq \frac{p2}{p11+p12+p2+q11+q12+q2} \leq 0.6,$$

$$\text{especially } 0.01 \leq \frac{p2}{p11+p12+p2+q11+q12+q2} \leq 0.4$$

$$0 < \frac{q11}{p11+p12+p2+q11+q12+q2} \leq 0.5,$$

$$\text{especially } 0.01 \leq \frac{q11}{p11+p12+p2+q11+q12+q2} \leq 0.4$$

$$0 \leq \frac{q12}{p11+p12+p2+q11+q12+q2} \leq 0.4,$$

$$\text{especially } 0.01 \leq \frac{q12}{p11+p12+p2+q11+q12+q2} \leq 0.4$$

$$0 \leq \frac{q2}{p11+p12+p2+q11+q12+q2} \leq 0.5,$$

$$\text{especially } 0.01 \leq \frac{q2}{p11+p12+p2+q11+q12+q2} \leq 0.4$$

$$0.5 \leq \frac{p11+p12+p2}{p11+p12+p2+q11+q12+q2} < 1,$$

$$\text{especially } 0.7 \leq \frac{p11+p12+p2}{p11+p12+p2+q11+q12+q2} < 1$$

$$0 < \frac{q11+q12+q2}{p11+p12+p2+q11+q12+q2} \leq 0.4,$$

$$\text{especially } 0.01 \leq \frac{q11+q12+q2}{p11+p12+p2+q11+q12+q2} \leq 0.4$$

$$0 < \frac{p11+q11}{p11+p12+p2+q11+q12+q2} \leq 0.4,$$

$$\text{especially } 0.01 \leq \frac{p11+q11}{p11+p12+p2+q11+q12+q2} \leq 0.4$$

$$0 < \frac{p2+q2}{p11+p12+p2+q11+q12+q2} \leq 0.4,$$

$$\text{especially } 0.01 \leq \frac{p2+q2}{p11+p12+p2+q11+q12+q2} \leq 0.4$$

Illustrative, non-limiting examples of the inventive polymer are represented by the following formulae (3'-1) to (3'-4).

(3'-1)
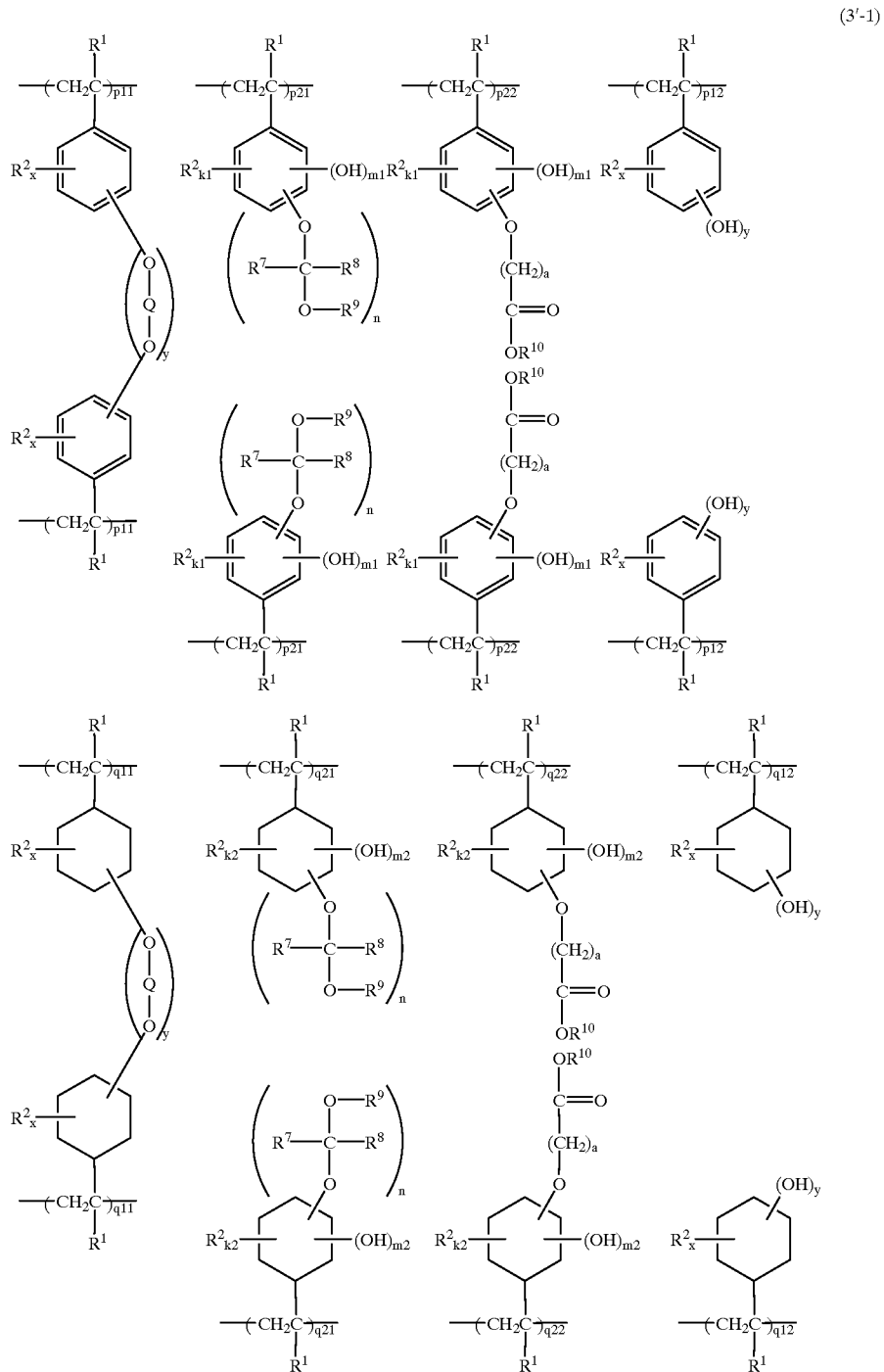

(3'-2)
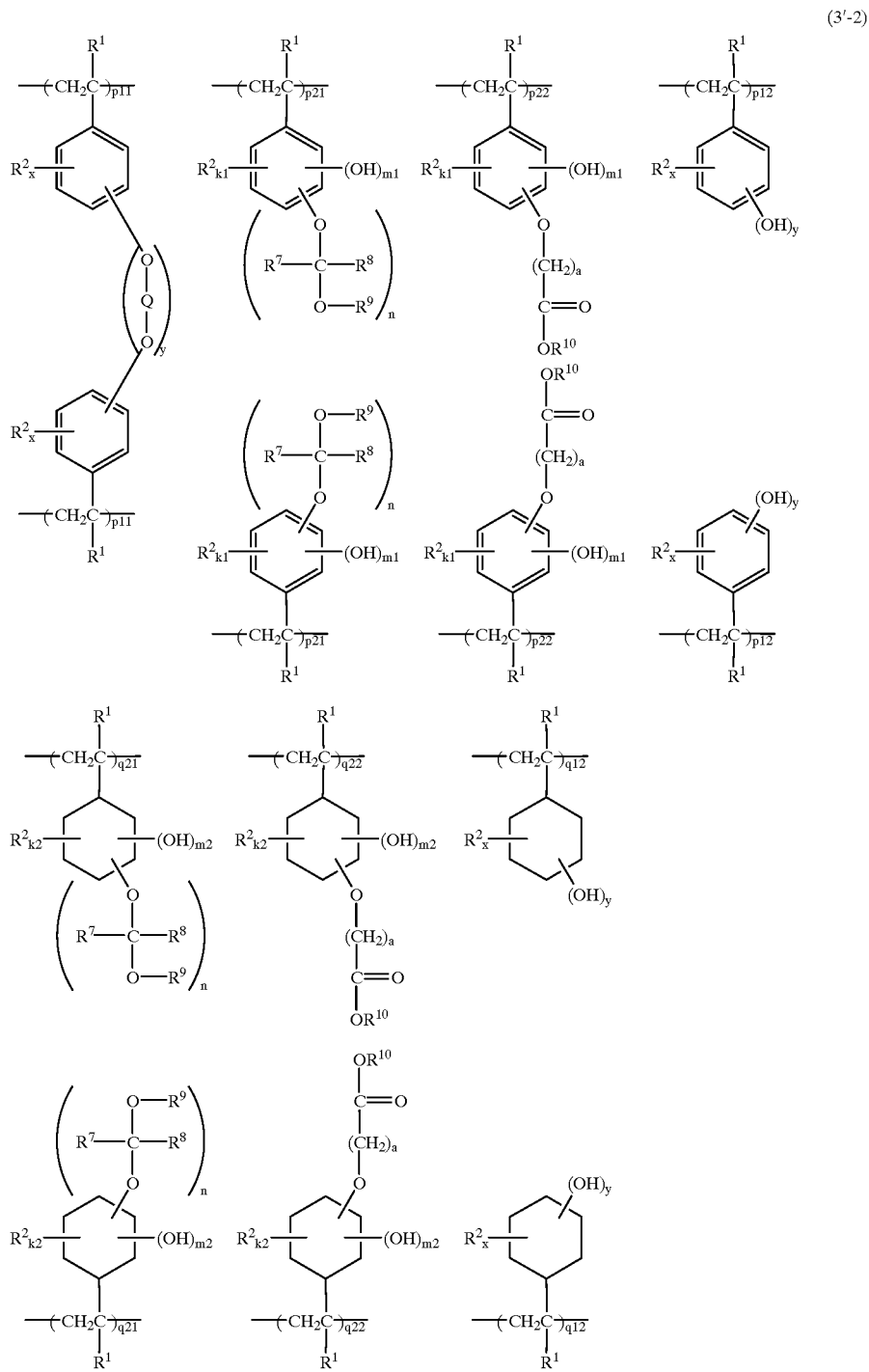

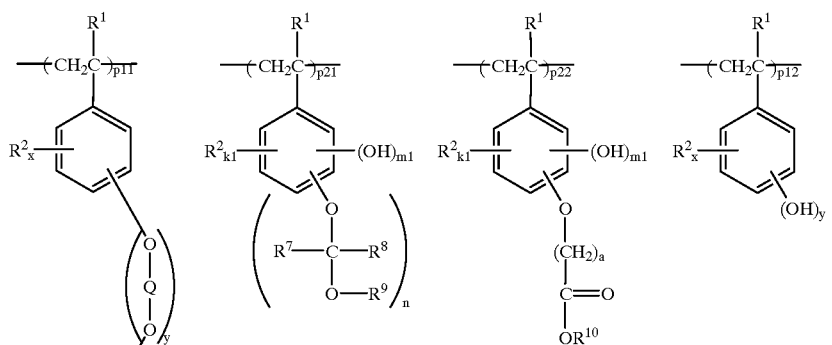
(3'-3)
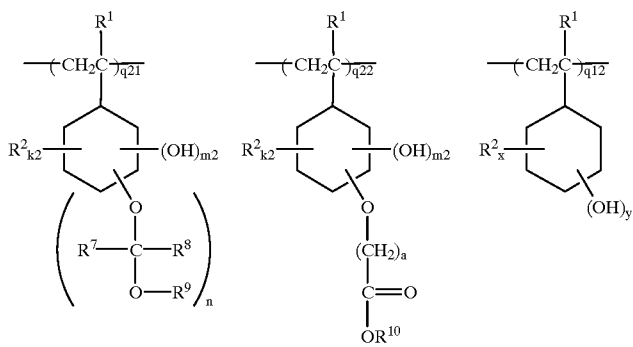
(3'-4)
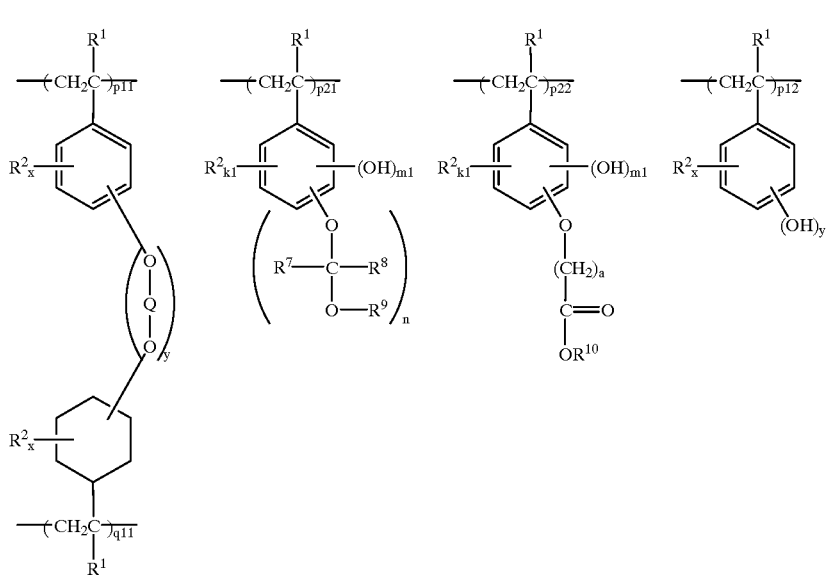

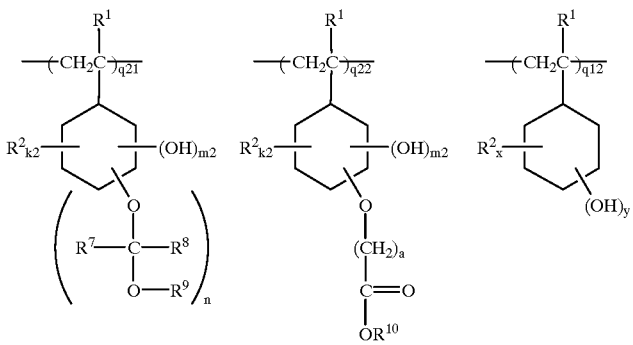

In the above formulae, $R^1$, $R^2$, $R^7$ to $R^{10}$, p11, p12, q11, q12, x, y, k1, m1, n1, k2, m2 and n2 are as defined above. Letters p21, p22, q21 and q22 are 0 or positive numbers, satisfying p21+p22=p2 and q21+q22=q2. The value of (p21+q21)/(p21+p22+q21+q22) ranges from 0 to 1, preferably from 0.5 to 1, more preferably from 0.7 to 1.

It is noted that formulae (3'-1) and (3'-2) show an intermolecular linkage and formulae (3'-3) and (3'-4) show an intramolecular linkage. They may present alone or in admixture.

Q is a crosslinking group having a C—O—C linkage, typically a crosslinking group of formula (4a) or (4b), preferably formula (4a'), (4b'), (4a") or (4b"), more preferably formula (4a''') or (4b'''). Where the crosslinking group is trivalent or more, Q is attached to at least three units of the following formulae in formula (3).

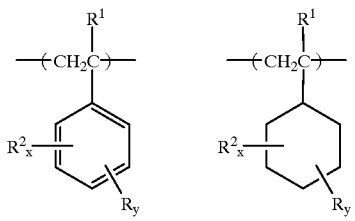

In this regard, the total of crosslinking groups having a C—O—C linkage is on the average from more then 0 mol % to 80 mol %, especially from 0.2 to 20 mol % of the entire hydrogen atoms of the phenolic hydroxyl groups and alcoholic hydroxyl groups in formula (1). With 0 mole %, no benefits of the crosslinking group are obtained, resulting in a reduced contrast of alkali dissolution rate and low resolution. With more than 80 mol %, a too much crosslinked polymer will gel, become insoluble in alkali, induce a film thickness change, internal stresses or bubbles upon alkali development, and lose adhesion to the substrate due to less hydrophilic groups.

The total of acid labile groups is on the average from more than 0 mole % to 80 mol %, especially from 10 to 50 mol % of the entire hydrogen atoms of the phenolic hydroxyl groups and alcoholic hydroxyl groups in formula (1). With 0 mol %, no benefits of the acid labile group are obtained, resulting in a reduced contrast of alkali dissolution rate and low resolution. With more than 80 mol %, alkali solubility will be lost and the affinity to an alkaline developer becomes low, resulting in low resolution.

By properly selecting the amounts of the crosslinking group having a C—O—C linkage and the acid labile group within the above-defined ranges, the size and configuration of a resist pattern can be controlled as desired. In the polymer according to the invention, the contents of the crosslinking group having a C—O—C linkage and the acid labile group have substantial influence on the dissolution rate contrast of a resist film and govern the properties of a resist composition relating to the size and configuration of a resist pattern.

The polymer of the invention should have a weight average molecular weight of 1,000 to 500,000, preferably 3,000 to 30,000. With a weight average molecular weight of less than 1,000, resists would be less resistant to heat. With a weight average molecular weight of more than 500,000, alkali solubility and resolution lowers.

It is understood that prior to crosslinking, a polymer having a wide molecular weight dispersity (Mw/Mn) contains more polymers of low molecular weight and high molecular weight. Such a wide dispersity obstructs the design of the number of crosslinks and it is rather difficult to produce resist materials having the same properties. The influence of a molecular weight and its dispersity becomes greater as the pattern rule becomes finer. In order that a resist material be advantageously used in patterning features to a finer size, the polymer should preferably be a monodisperse one having a molecular weight dispersity of 1.0 to 1.5, especially 1.0 to 1.3. However, the invention is not limited thereto, and it is, of course, acceptable to use a polymer having a dispersity of more than 1.5.

Next, the method for preparing the partially hydrogenated polymer of the invention is described. The partially hydrogenated polymer of formula (1) can be prepared either by hydrogenating a phenolic resin or by copolymerizing a vinylphenol monomer with a hydrogenated vinylphenol monomer. The hydrogenation of a phenolic resin can be performed by well-known techniques and may be accomplished by dissolving a phenolic resin or phenol monomer in an organic solvent and introducing hydrogen therein in the presence of a homogeneous or heterogeneous hydrogenation catalyst. For hydrogeneration reaction, the concentration of phenolic resin or phenol monomer is usually about 1 to 70% by weight, preferably about 1 to 40% by weight. The solvent is not critical insofar as it does not adversely affect the hydrogenation catalyst and the phenolic resin or phenol monomer is dissolvable therein. The hydrogeneration catalyst is a metallic or non-metallic catalyst which is active in hydrogeneration reaction. Exemplary are Fe, Co, Ni, Ru, Rh, Pd, Ir, Os, Pt, Cr, Te, Mn, Ti, V, Zr, Mo, and W-based catalysts. These catalysts may be used alone or in admixture of two or more.

For hydrogeneration reaction, the reaction temperature is usually form about 0° C. to about 300° C., preferably from about 20° C. to about 150° C. Temperatures above 300° C.

are acceptable, but undesirable because of possible side reaction. The pressure of hydrogen usually ranges from atmospheric pressure to about 400 kg/cm², preferably from about 5 to 200 kg/cm². At the end of hydrogenation reaction, the catalyst can be removed from the reaction solution by appropriate means such as re-precipitation, sedimentation, centrifugation or filtration. The resulting partially hydrogenated polymers may be used alone or in admixture of two or more.

Thereafter, the polymer according to the invention may be prepared in various ways, for example, by a method of partially introducing an acid labile group of formula (5) into a phenolic hydroxyl group and/or alcoholic hydroxyl group of a polymer comprising recurring units of formula (1), isolating the polymer, and reacting it with an alkenyl ether compound of halogenated alkyl ether compound whereby the polymer is crosslinked within a molecule and/or between molecules with a crosslinking group having a C—O—C linkage; a method of reacting a polymer comprising recurring units of formula (1) with an alkenyl ether compound or halogenated alkyl ether compound whereby the polymer is crosslinked within a molecule and/or between molecules with a crosslinking group having a C—O—C linkage, isolating the polymer, and introducing an acid labile group of formula (5) therein; or a method of simultaneously carrying out reaction with an alkenyl ether compound or halogenated alkyl ether compound and introduction of an acid labile group of formula (5). The last-mentioned combination method is preferred. It is possible to further introduce into the thus obtained polymer an acid labile group of formula (6), tert-alkyl, trialkylsilyl or oxoalkyl group, if necessary.

More illustratively, the polymer of the invention may be prepared by either a first method using a polymer comprising recurring units of formula (1'), an alkenyl ether compound of formula (I) or (II), and a compound of formula (5a) or a second method using a polymer comprising recurring units of formula (1'), a halogenated alkyl ether compound of formula (VI) or (VII), and a compound of formula (5b).

First Method

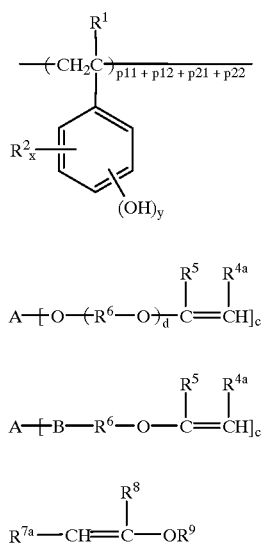

Here, $R^1$, $R^2$, $R^6$, $R^8$, $R^9$, x, y, p11, p12, p21, p22, q11, q12, q21 and q22 are as defined above, and p11+p12+p21+p22+q11+q12+q21+q22=1. $R^{4a}$ and $R^{7a}$ each are hydrogen or a normal, branched or cyclic alkyl group of 1 to 7 carbon atoms.

In formula (I) or (II) representing the vinyl ether compound, A is a c-valent aliphatic saturated hydrocarbon, alicyclic saturated hydrocarbon, aromatic hydrocarbon or heterocyclic group having 1 to 50 carbon atoms, B is —CO—O—, —NHCO—O— or —NHCONH—, and $R^6$ is a normal or branched alkylene group of 1 to 10 carbon atoms. Letter c is an integer of 2 to 8, and d is 0 or an integer of 1 to 10.

The c-valent (divalent to octavalent) aliphatic or alicyclic saturated hydrocarbon and aromatic hydrocarbon groups represented by A include hydrocarbon groups, for example, substituted or unsubstituted alkylene groups having 1 to 50 carbon atoms, especially 1 to 40 carbon atoms, substituted or unsubstituted arylene groups having 6 to 50 carbon atoms, especially 6 to 40 carbon atoms, a combination of an alkylene group and an arylene group, and c"-valent groups obtained by eliminating one hydrogen atom attached to a carbon atom from the foregoing groups wherein c" is an integer of 3 to 8; and c-valent heterocyclic groups, and a combination of a heterocyclic group with any one of the foregoing hydrocarbon atoms. In the alkylene and arylene groups, a hetero atom such as O, NH, N(CH₃), S and SO₂ may intervene and where substituted, the substituent is a hydroxyl, carboxyl, acyl group or fluorine atom.

The organic groups represented by A are exemplified below.

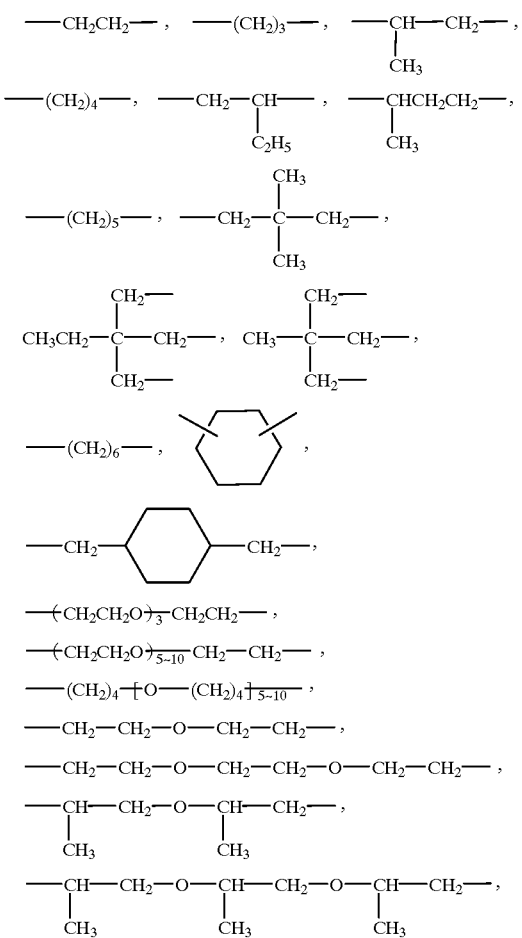

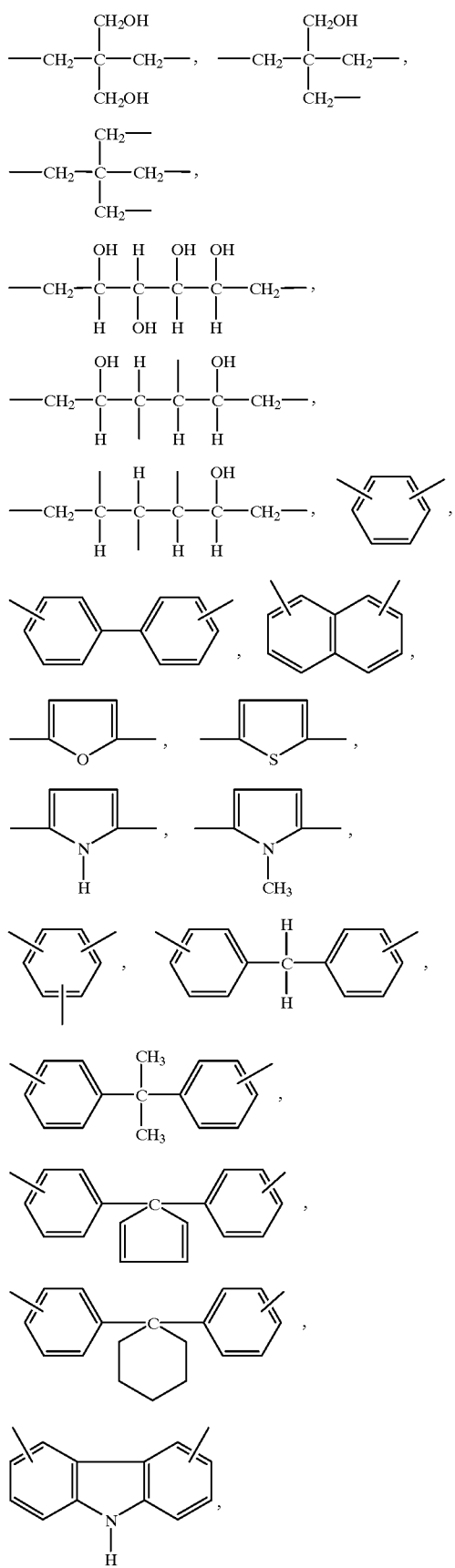

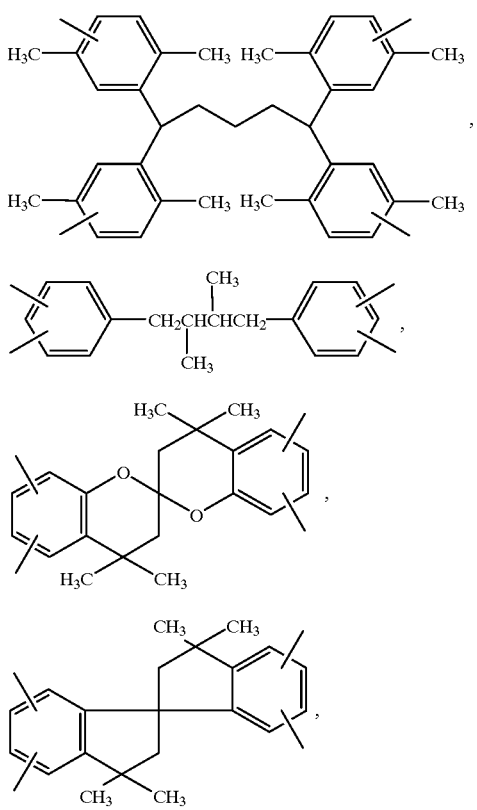

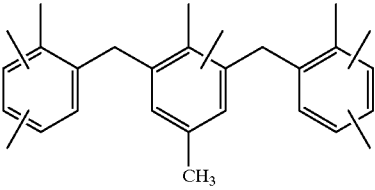

The compounds of formula (I) can be synthesized, for example, by the method described in Stephen C. Lapin, Polymers Paint Colour Journal, 179 (4237), 321 (1988), more specifically by reacting polyhydric alcohols or polyhydric phenols with acetylene or reacting polyhydric alcohols or polyhydric phenols with halogenated alkyl vinyl ethers.

Illustrative, non-limiting examples of the compound of formula (I) include ethylene glycol divinyl ether, triethylene glycol divinyl ether, 1,2-propane diol divinyl ether, 1,3-propane diol divinyl ether, 1,3-butane diol divinyl ether, 1,4-butane diol divinyl ether, tetramethylene glycol divinyl ether, neopentyl glycol divinyl ether, trimethylol propane trivinyl ether, trimethylol ethane trivinyl ether, hexane diol divinyl ether, 1,4-cyclohexane diol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylol propane triethylene vinyl ether, trimethylol propane diethylene vinyl ether, pentaerythritol diethylene vinyl ether, pentaerythritol triethylene vinyl ether, pentaerythritol tetraethylene vinyl ether as well as the compounds of the following formulae (I-1) through (I-31).

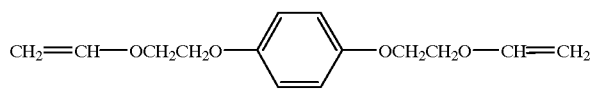
(I-1)

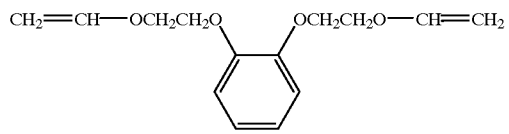
(I-2)

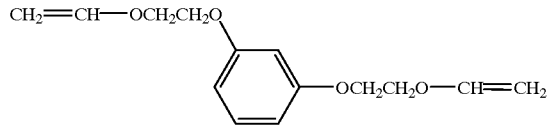
(I-3)

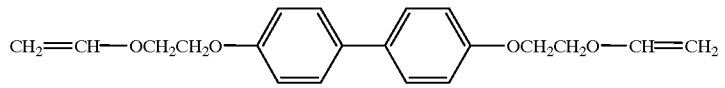
(I-4)

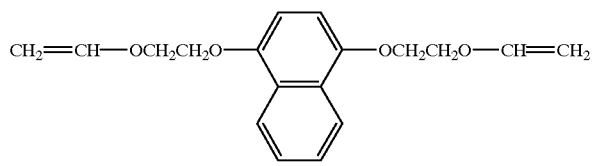
(I-5)

(I-6)
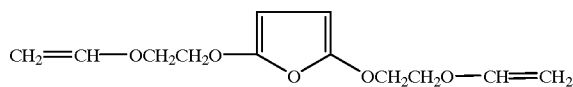
(I-7)
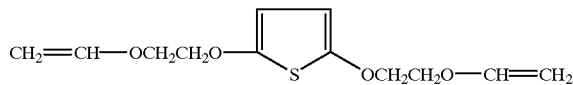
(I-8)
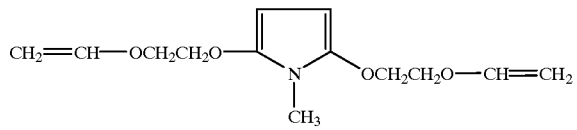
(I-9)
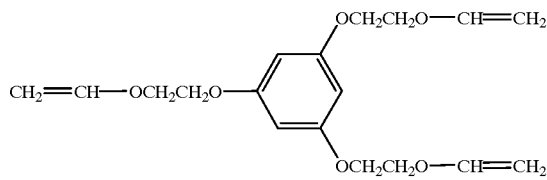
(I-10)
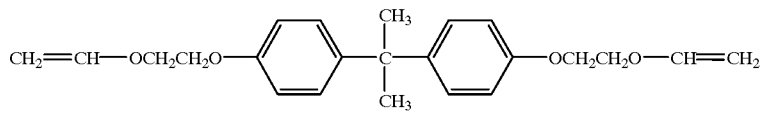
(I-11)
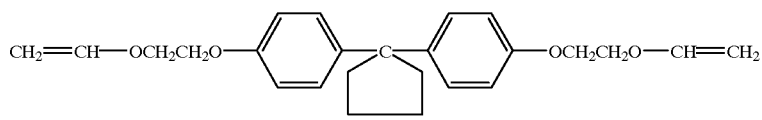
(I-12)
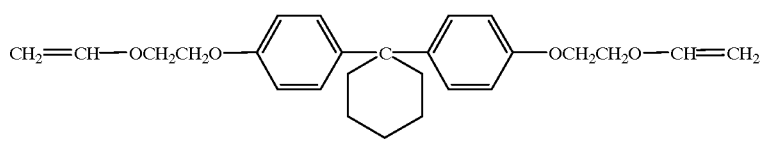
(I-13)
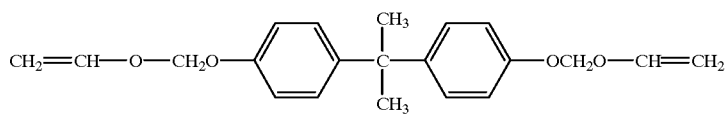
(I-14)
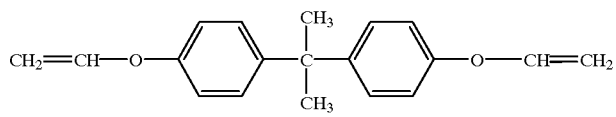
(I-15)
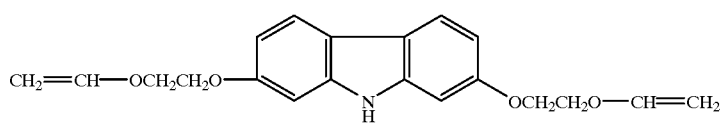
(I-16)
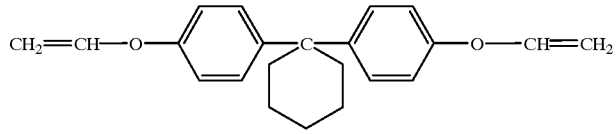

-continued
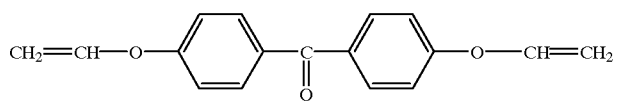
(I-17)
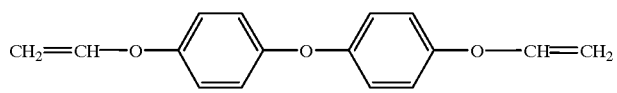
(I-18)
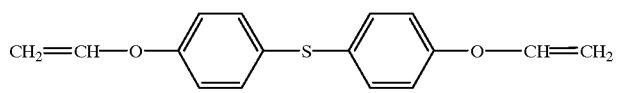
(I-19)
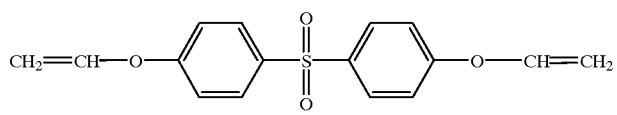
(I-20)
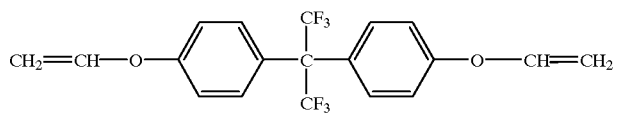
(I-21)
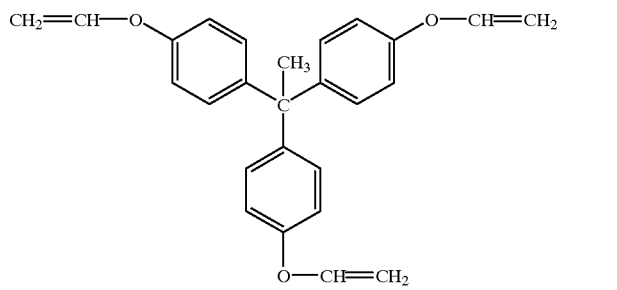
(I-22)
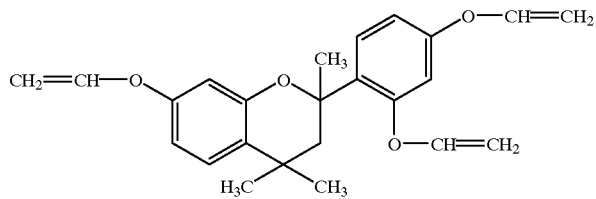
(I-23)
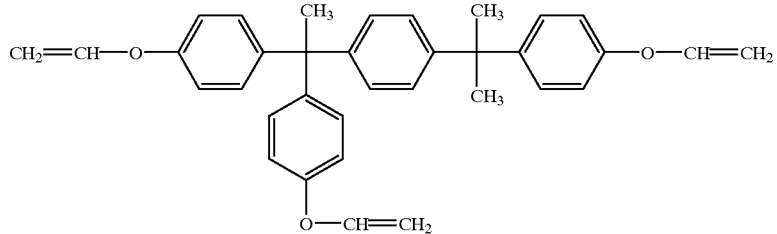
(I-24)

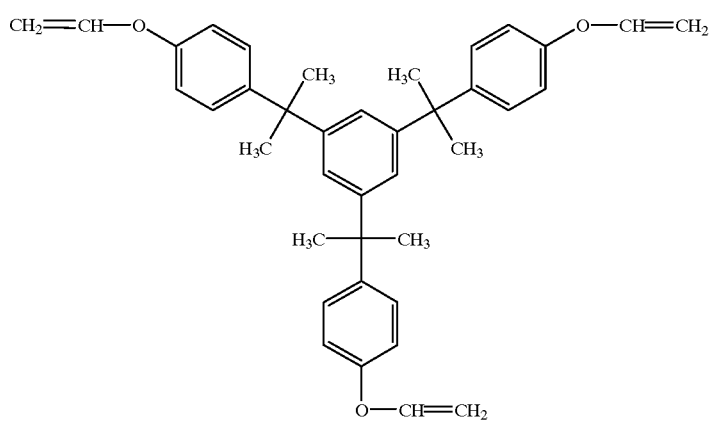
(I-25)
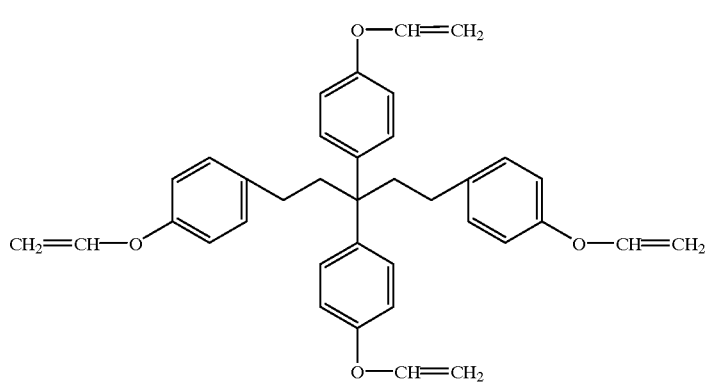
(I-26)
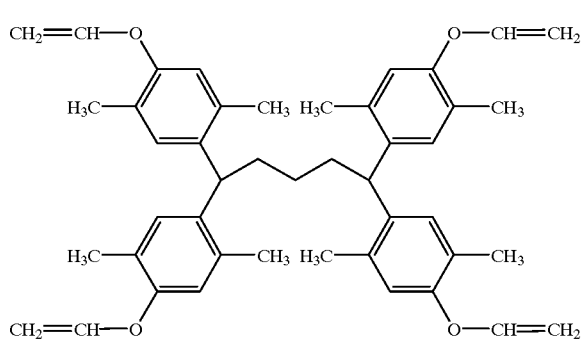
(I-27)
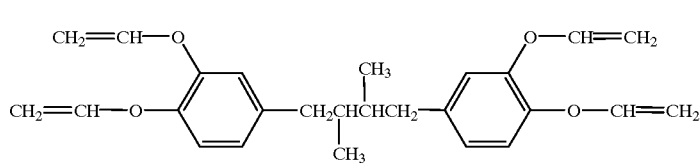
(I-28)
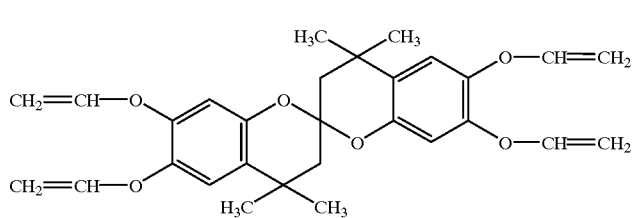
(I-29)

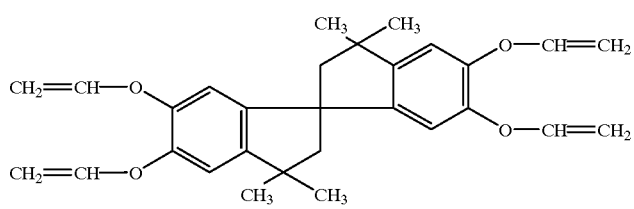
(I-30)

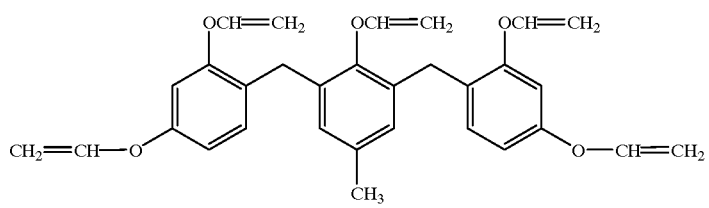
(I-31)

The compounds of formula (II) wherein B is —CO—O— can be synthesized by reacting polyvalent carboxylic acids with halogenated alkyl vinyl ethers. Illustrative, non-limiting examples include terephthalic diethylene vinyl ether, phthalic diethylene vinyl ether, isophthalic diethylene vinyl ether, phthalic dipropylene vinyl ether, terephthalic dipropylene vinyl ether, isophthalic dipropylene vinyl ether, maleic diethylene vinyl ether, fumaric diethylene vinyl ether, and itaconic diethylene vinyl ether.

Other useful alkenyl ether group-containing compounds which can be used herein are alkenyl ether group-containing compounds which are synthesized by reacting alkenyl ether compounds having active hydrogen as represented by the following formulae (III), (IV), and (V) with compounds having an isocyanato group.

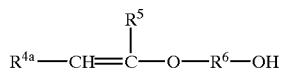
(III)

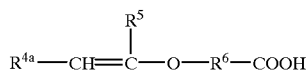
(IV)

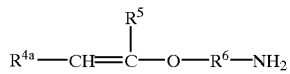
(V)

$R^{4a}$, $R^5$, and $R^6$ are as defined above.

Where B is —NHCOO— or —NHCONH—, the compounds having an isocyanato group of formula (II) may be those compounds described in "Handbook of Crosslinking Agents," Taiseisha, 1981, for example. Exemplary are polyisocyanates such as triphenylmethane triisocyanate, diphenylmethane diisocyanate, tolylene diisocyanate, 2,4-tolylene diisocyanate dimer, naphthalene-1,5-diisocyanate, o-tolylene diisocyanate, polymethylene polyphenyl isocyanate, and hexamethylene diisocyanate; and polyisocyanate adducts such as an addition product of tolylene diisocyanate and trimethylolpropane, an addition product of hexamethylene diisocyanate and water, and an addition product of xylene diisocyanate and trimethylolpropane. By reacting isocyanato group-containing compounds with active hydrogen-containing vinyl ether compounds, there are obtained various compounds having an alkenyl ether group at an end. These compounds are exemplified by the following formulae (II-1) through (II-11), though not limited thereto.

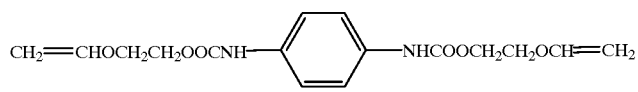
(II-1)

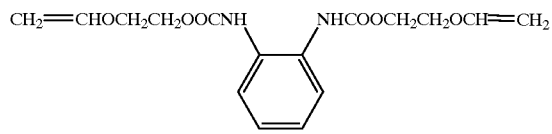
(II-2)

-continued

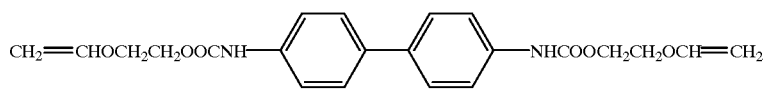
(II-3)

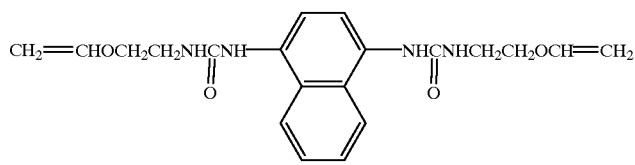
(II-4)

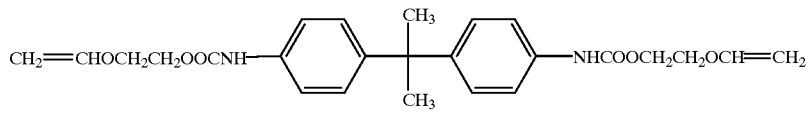
(II-5)

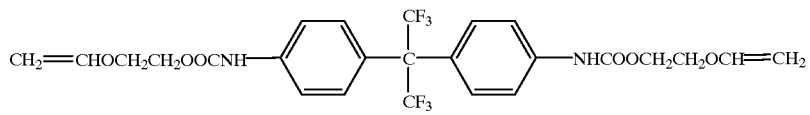
(II-6)

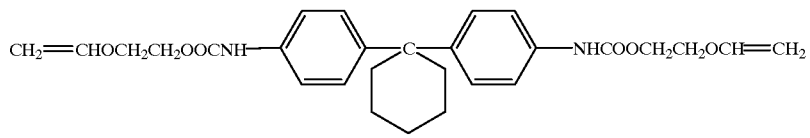
(II-7)

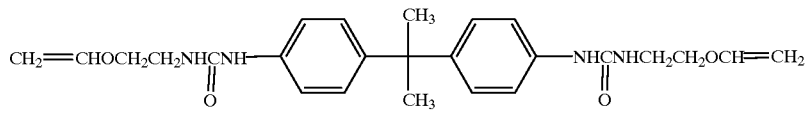
(II-8)

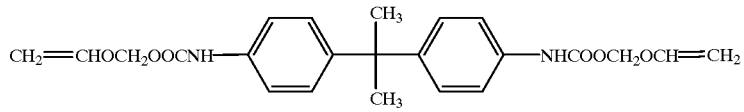
(II-9)

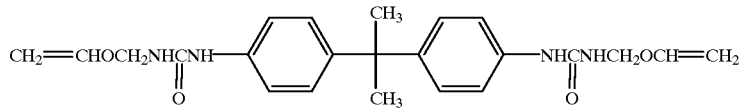
(II-10)

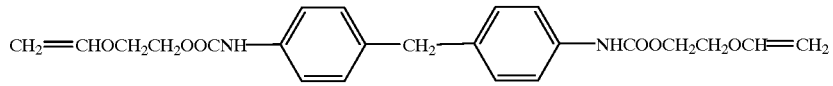
(II-11)

More particularly, in the first method, a polymer of formula (1') having a weight average molecular weight of 1,000 to 500,000 and preferably a dispersity of 1.0 to 1.5 is reacted with (p11+q11) mol of an alkenyl ether compound of formula (I) or (II) and (p21+p22+q21+q22) mol of a compound of formula (5a) per mol of the entire hydroxyl groups, phenolic hydroxyl groups and alcoholic hydroxyl groups, in the polymer of formula (1'), thereby forming a polymer having recurring units of the general formulae (3a'-1) to (3a'-4).

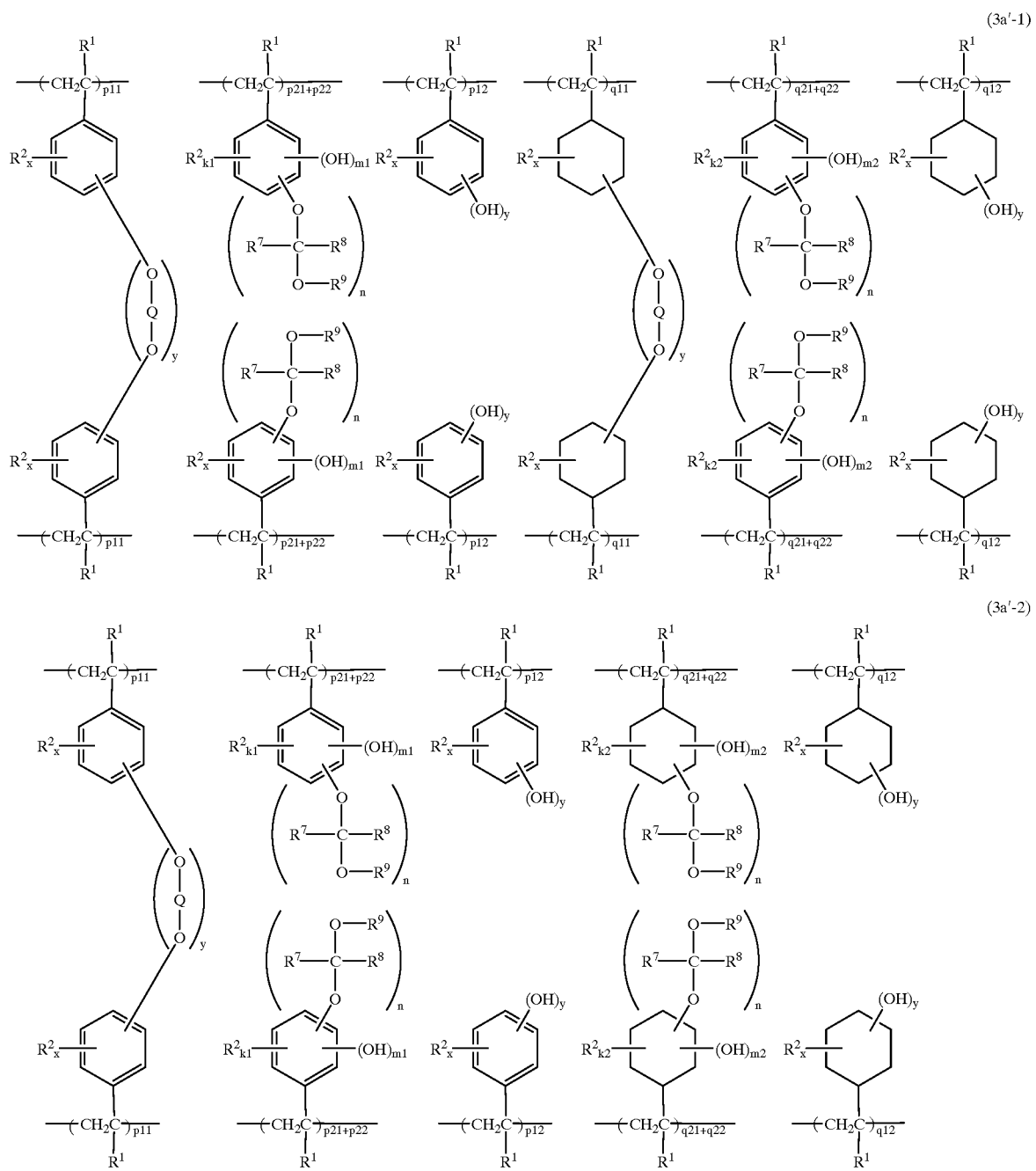

(3a'-3)

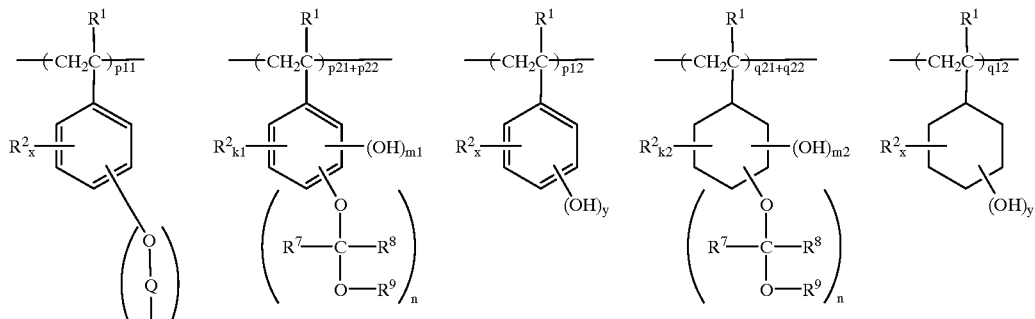

(3a'-4)

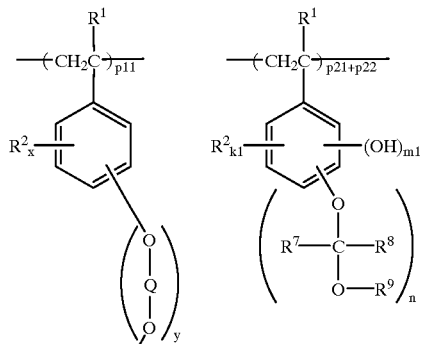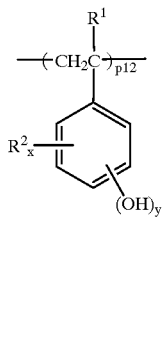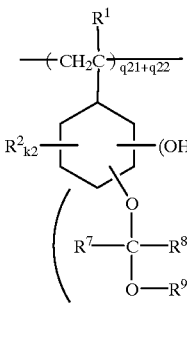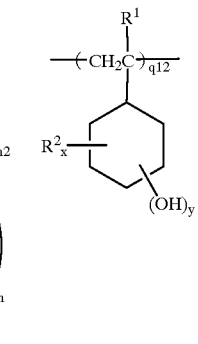

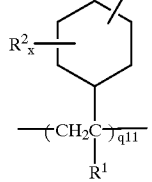

Here, letters x, y, k1, m1, n1, k2, m2, n2, p11, p12, p21, p22, q11, q12, q21, q22, and groups $R^1$, $R^2$, $R^7$ to $R^9$, and Q are as defined above.

In the first method, reaction is preferably carried out in a solvent in the presence of an acid. The reaction solvent used herein is preferably selected from aprotic polar solvents such as dimethylformamide, dimethylacetamide, tetrahydrofuran, and ethyl acetate, and mixtures thereof. The acid catalyst used herein is preferably selected from hydrochloric acid, sulfuric acid, trifluoromethanesulfonic acid, p-toluenesulfonic acid, methanesulfonic acid, trifluoroacetic acid, and pyridinium p-toluenesulfonate. The amount of the acid catalyst used is preferably 0.1 to 50 mol % based on the moles of the entire hydroxyl groups, phenolic hydroxyl groups and alcoholic hydroxyl groups, in the polymer of formula (1') to be reacted. Reaction is preferably carried out at a temperature of −20° C. to 100° C., more preferably 0° C. to 60° C. The reaction time is generally about 10 minutes to 100 hours, preferably ½ to 20 hours.

Where two types of reaction are carried out in a contiguous manner without once isolating an intermediate product, the order of addition of the alkenyl ether compound of formula (I) or (II) and the compound of formula (5a) is not critical. Preferably, the compound of formula (5a) is first added and after reaction proceeds to a full extent, the alkenyl ether compound of formula (I) or (II) is added. If the alkenyl ether compound of formula (I) or (II) and the compound of formula (5a) are simultaneously added or if the alkenyl ether compound of formula (I) or (II) is first added, then some of reactive sites of the alkenyl ether compound of formula (I) or (II) can be hydrolyzed with water in the reaction system whereby there is formed a polymer of complex structure which is difficult to control its physical properties.

Second Method

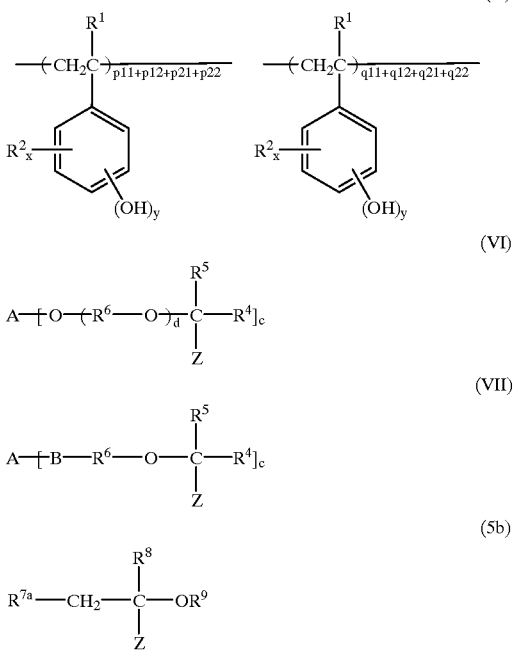

(1')

(VI)

(VII)

(5b)

Here, $R^1$, $R^2$, $R^4$ to $R^6$, $R^8$, $R^9$, $R^{7a}$, x, y, p11, p12, p21, p22, q11, q12, q21, q22, A, B, c, and d are as defined above, and Z is a halogen atom such as Cl, Br or I.

It is understood that the compounds of formulae (VI), (VII) and (5b) can be produced by reacting the compounds of formulae (I), (II) and (5a) with hydrogen chloride, hydrogen bromide or hydrogen iodide, respectively.

In the second method, a polymer comprising recurring units of formula (1') and having a weight average molecular weight of 1,000 to 500,000 and preferably a dispersity of 1.0 to 1.5 is reacted with (p11+q11) mol of a halogenated alkyl ether compound of formula (VI) or (VII) and (p21+p22+q21+q22) mol of a compound of formula (5b) per mole of the entire hydroxyl groups, phenolic hydroxyl groups and alcoholic hydroxyl groups, in the polymer of formula (1'), thereby forming a polymer having recurring units of the formulae (3a'-1) to (3a'-4) shown above.

In the second method, reaction is preferably carried out in a solvent in the presence of a base. The reaction solvent used herein is preferably selected from aprotic polar solvents such as acetonitrile, acetone, dimethylformamide, dimethylacetamide, tetrahydrofuran, and dimethylsulfoxide, and mixtures thereof. The base used herein is preferably selected from triethylamine, pyridine, diisopropylamine and potassium carbonate. The amount of the base used is preferably at least (p1+q1) mol per mol of the entire hydroxyl groups, phenolic hydroxyl groups and alcoholic hydroxyl groups, in the polymer of formula (1') to be reacted. Reaction is preferably carried out at a temperature of −50° C. to 100° C., more preferably 0° C. to 60° C. The reaction time is generally about ½ to 100 hours, preferably 1 to 20 hours.

It is acceptable to take a reaction sequence of first reacting a polymer having recurring units of formula (1') with a compound of formula (5a) or (5b) to form a compound of the following general formula (7), isolating the compound of formula (7), and then crosslinking the compound of formula (7) using a compound of formula (I), (II), (VI) or (VII).

(7)

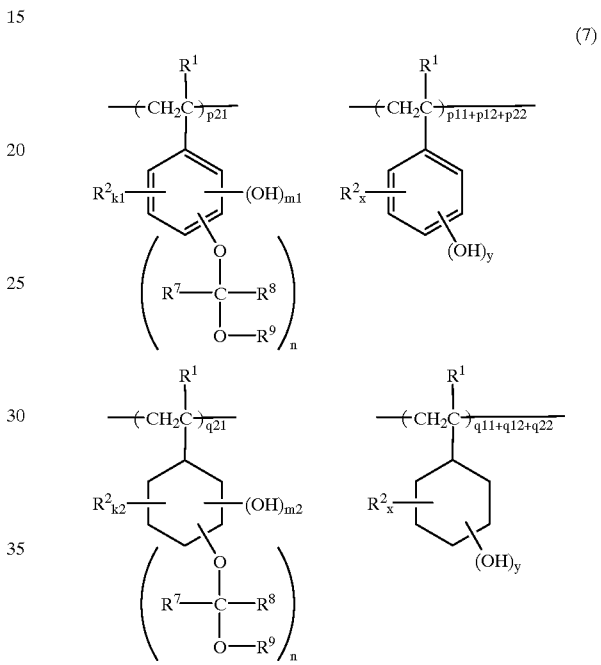

Furthermore, by introducing another acid labile group into the polymers of formulae (3a'-1) to (3a'-4) obtained by the first or second method, polymers having recurring units of the following general formulae (3b'-1) to (3b'-4) can be produced if necessary. This is done by reacting the polymer of formula (3a'-1) to (3a'-4) with p22+q22 mol of a dialkyl dicarbonate compound or alkoxycarbonylalkyl halide per mol of the phenolic hydroxyl group and alcoholic hydroxyl group in the original polymer of formula (1') to introduce an acid labile group of the following general formula (6); or by reacting the polymer of formula (3a'-1) to (3a'-4) with a tert-alkyl halide, trialkylsilyl halide or oxoalkyl compound to introduce an acid labile group.

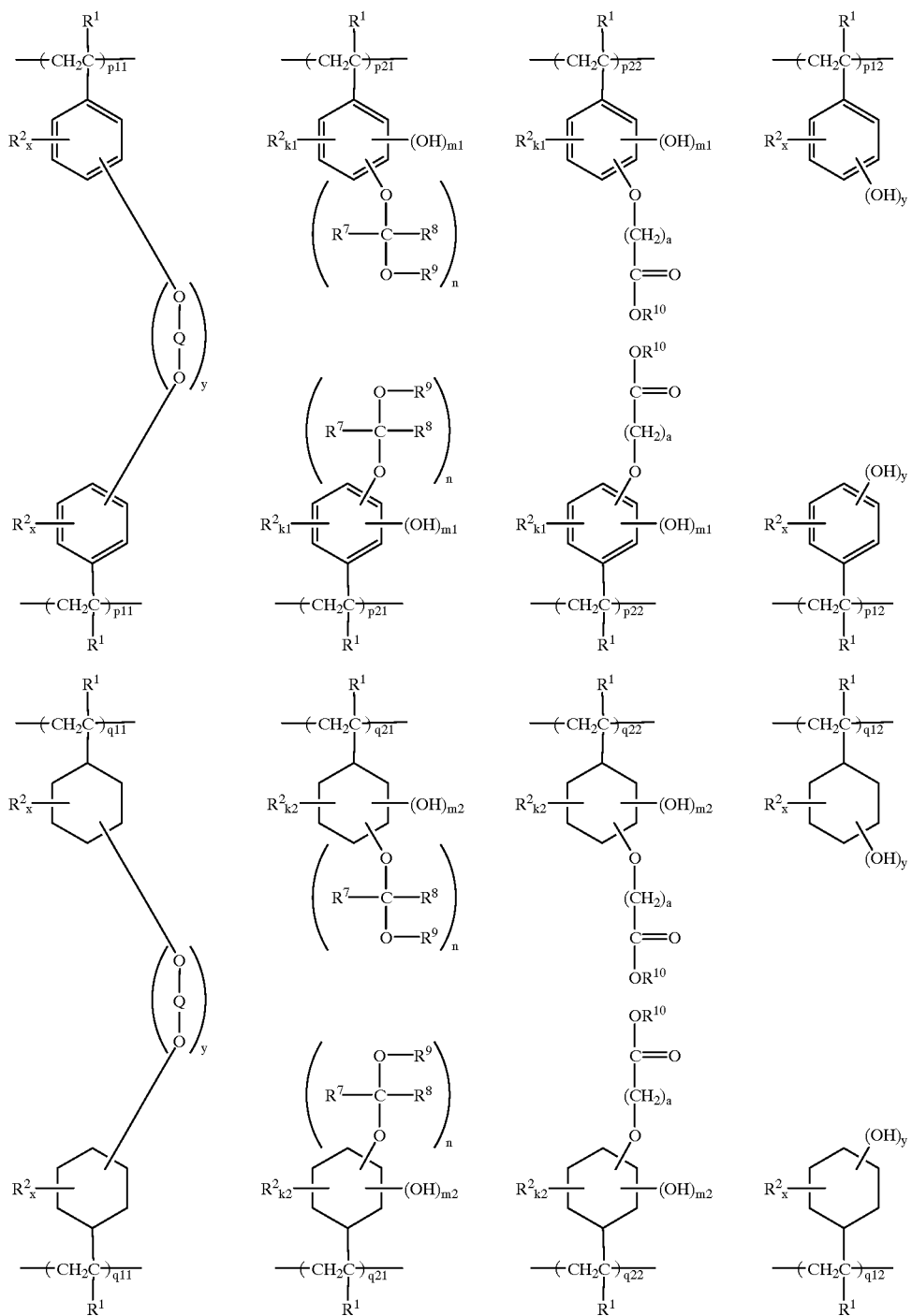
(3b'-1)

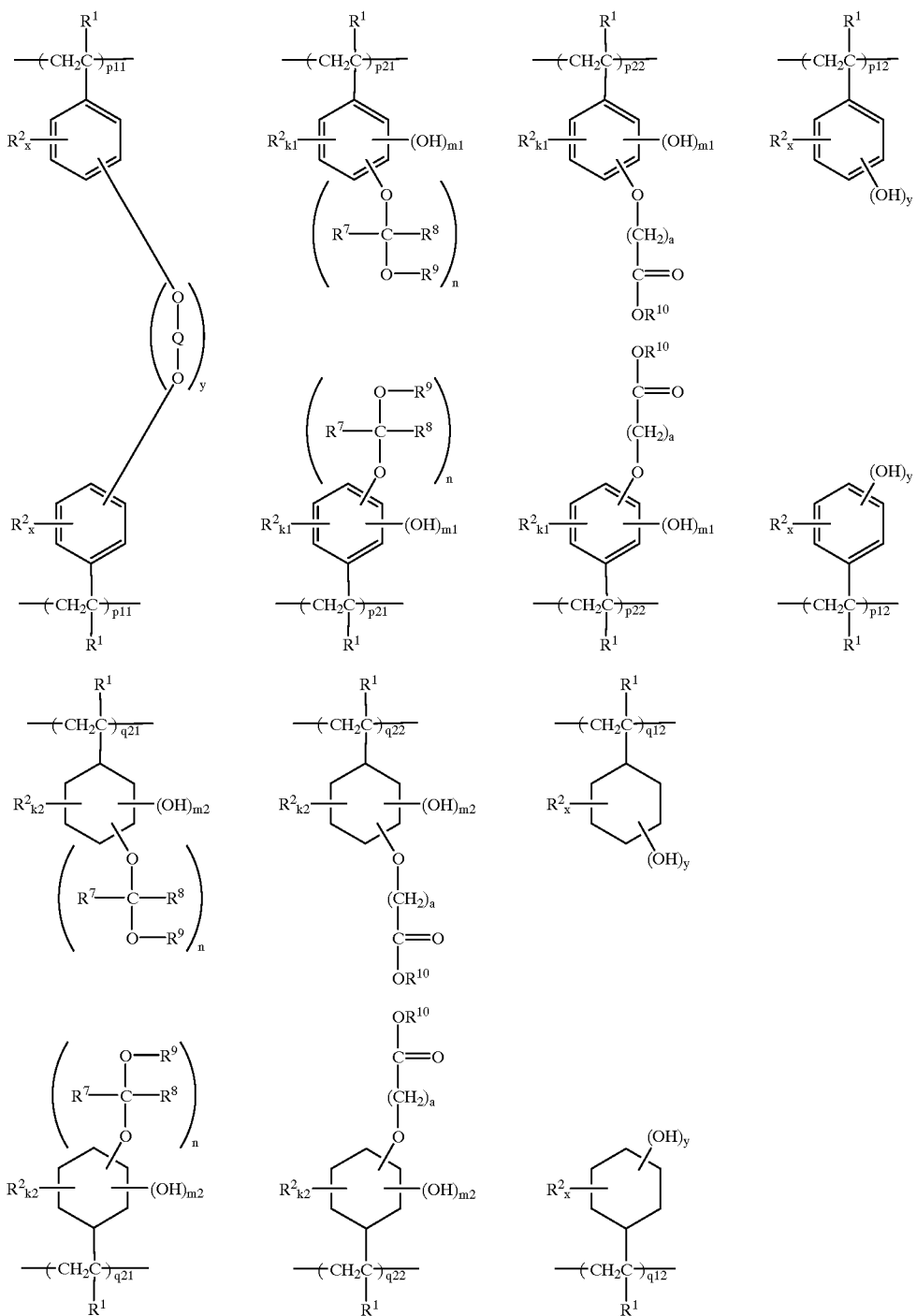
(3b'-2)

-continued
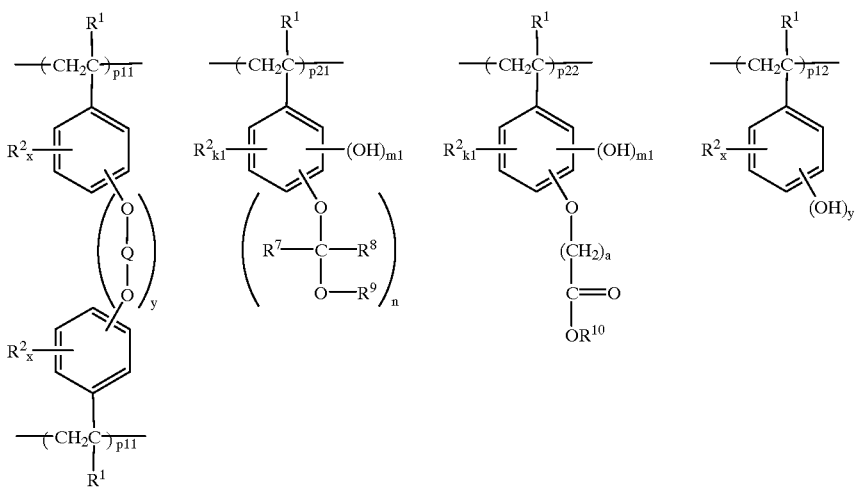
(3b'-3)
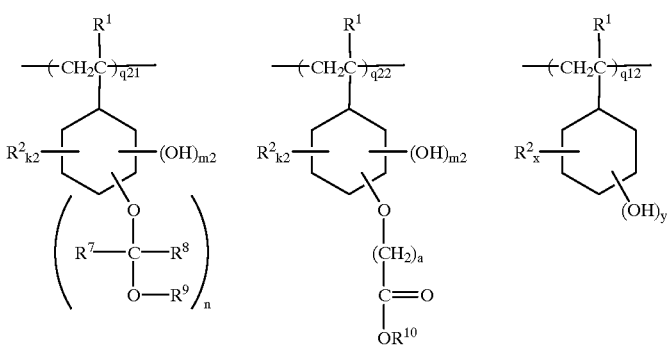
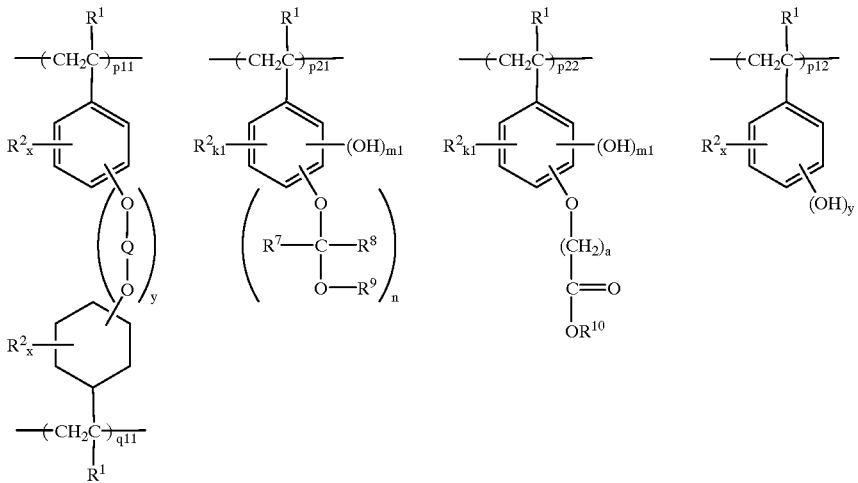
(3b'-4)

-continued

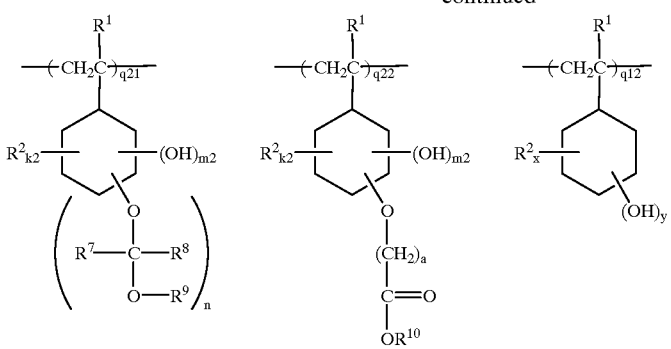

Here, $R^1$, $R^2$, $R^7$ to $R^{10}$, Q, x, y, k1, m1, n1, k2, m2, n2, p11, p12, p21, p22, q11, q12, q21, and q22 are as defined above.

Preferably the introduction of an acid labile group of formula (6) is carried out in a solvent in the presence of a base. The reaction solvent used herein is preferably selected from aprotic polar solvents such as acetonitrile, acetone, dimethylformamide, dimethylacetamide, tetrahydrofuran, and dimethylsulfoxide, and mixtures thereof. The base used herein is preferably selected from triethylamine, pyridine, imidazole, diisopropylamine and potassium carbonate. The amount of the base used is preferably at least 0.1–50 mol per mol of the phenolic hydroxyl group and alcoholic hydroxyl group in the original polymer of formula (1'). Reaction is preferably carried out at a temperature of 0° C. to 100° C., more preferably 0° C. to 60° C. The reaction time is generally about 10 minutes to 100 hours, preferably 1 to 10 hours.

Examples of the dialkyl dicarbonate compound include di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide, tert-butoxycarbonylethyl chloride, ethoxyethoxycarbonylmethyl chloride, ethoxyethoxycarbonyl methyl bmomide, tetrahydropyranyloxycarbonylmethyl chloride, tetrahydropyranyloxycarbonylmethyl bromide, tetrahydrofuranyloxycarbonylmethyl chloride, and tetrahydrofuranyloxycarbonylmethyl bromide. Examples of the trialkylsilyl halide include trimethylsilyl chloride, triethylsilyl chloride, and dimethyl-tert-butylsilyl chloride.

Furthermore, if necessary, the polymer of formula (3a'-1) to (3a'-4) obtained by the first or second method can be tert-alkylated or oxoalkylated by reacting the polymer with (p22+q22) mol of a tert-alkylating agent or oxoalkyl compound per mol of the phenolic hydroxyl group and alcoholic hydroxyl group in the original polymer of formula (1').

Preferably this reaction is carried out in a solvent in the presence of an acid. The reaction solvent used herein is preferably selected from aprotic polar solvents such as dimethylformamide, dimethylacetamide, tetrahydrofuran, and ethyl acetate, and mixtures thereof. The acid used herein is preferably selected from hydrochloric acid, sulfuric acid, trifluoromethanesulfonic acid, p-toluenesulfonic acid, methanesulfonic acid, trifluoroacetic acid and pyridinium p-toluenesulfonate. The amount of the acid catalyst used is preferably 0.1 to 50 mol % based on the moles of the phenolic hydroxyl group and alcoholic hydroxyl group in the original polymer of formula (1'). Reaction is preferably carried out at a temperature of –20° C. to 100° C., more preferably 0° C. to 60° C. The reaction time is generally about 10 minutes to 100 hours, preferably ½ to 20 hours.

Examples of the tert-alkylating agent include isobutene, 2-methyl-1-butene, and 2-methyl-2-butene. Examples of the oxoalkyl compound include α-angelica lactone, 2-cyclohexen-1-one, and 5,6-dihydro-2H-pyran-2-one.

Apart from the route of once forming a polymer of formula (3a'-1) to (3a'-4), it is possible to directly introduce an acid labile group of formula (6), tertiary alkyl group, trialkylsilyl group or oxoalkyl group into a polymer comprising recurring units of the following general formula (3c'-1) or (3c'-2) and optionally further introduce an acid labile group of formula (5).

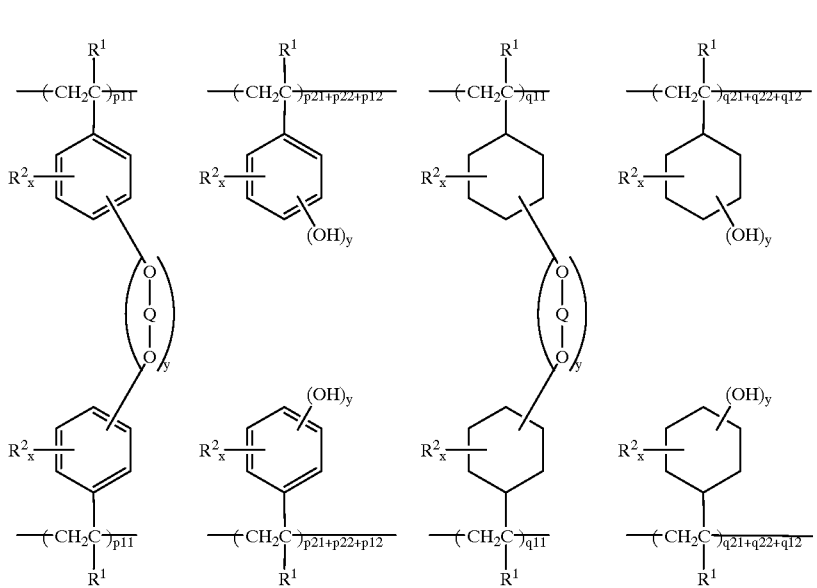
(3c'-1)
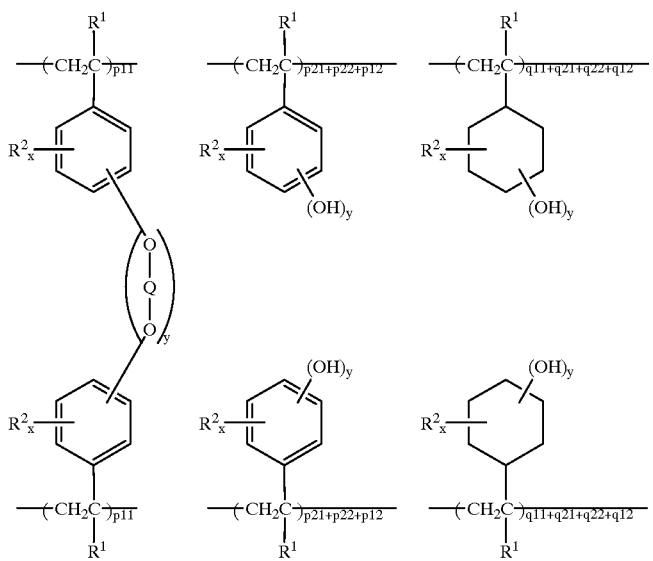
(3c'-2)

-continued

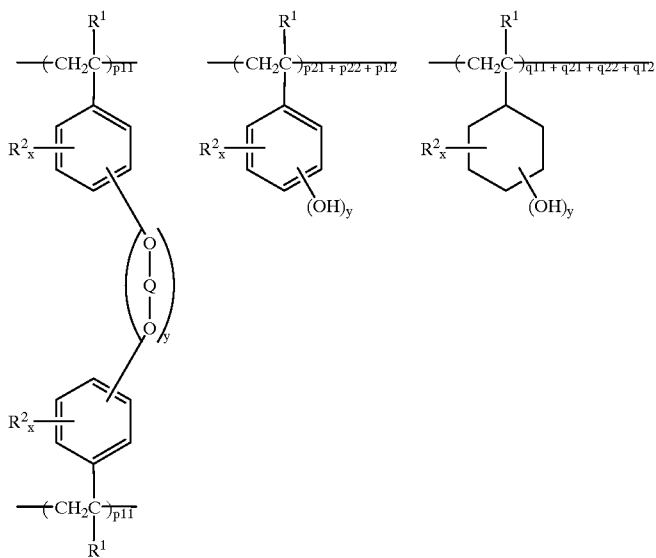

(3c'-3)

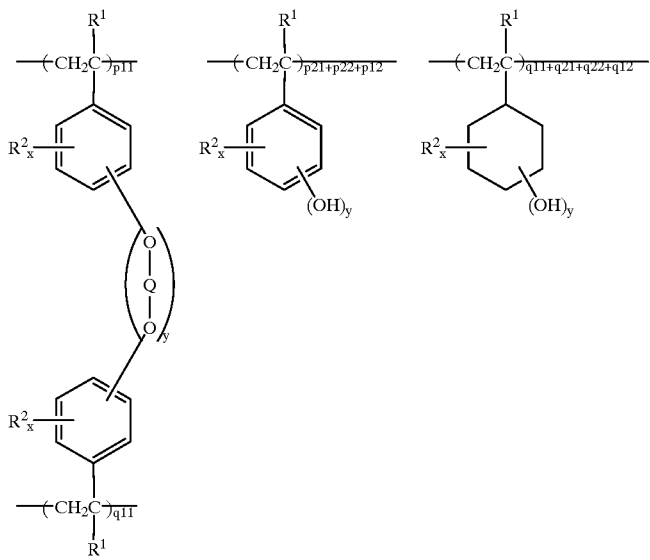

(3c'-4)

Here, $R^1$, $R^2$, Q, p11, p12, p21, p22, q11, q12, q21, q22, x, and y are as defined above.

In the polymer of the invention, the acid labile group represented by $R^3$ is not limited to one type. Acid labile groups of two or more types can be introduced into the polymer. A polymer having acid labile groups of two or more types can be obtained by first introducing (p21+q21) mol of a first acid labile group per mole of the entire hydroxyl groups in the polymer of formula (1') as above, then introducing (p22+q22) mol of a second different acid labile group by the same procedure as above, and in the case of three or more types, repeating such introduction appropriate times.

Resist

The polymer of the invention is useful as a base resin of a chemically amplified positive resist composition. The present invention provides a chemically amplified positive resist composition using the above-defined polymer as a base resin. Illustratively, the resist composition contains (A) an organic solvent, (B) a base resin in the form of a polymer of formula (1), preferably formula (2), more preferably formula (3), and (C) a photoacid generator.

In addition to these components, the resist composition of the invention may further contain (D) another base resin, separately from the base resin (B), in the form of a polymer comprising recurring units of the following general formula (1), some of the hydrogen atoms of phenolic hydroxyl groups and/or alcoholic hydroxyl groups being replaced by acid labile groups in an average proportion of 0 mol % to 80 mol % of the entirety, the polymer having a weight average molecular weight of 3,000 to 300,000.

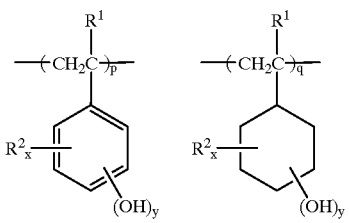

R¹, R², x, y, p and q are as defined above.

In addition to these components, the resist composition of the invention may further contain at least one of the following components (E) to (H):

(E) a dissolution regulator,
(F) a basic compound,
(G) an aromatic compound having a group ≡C—COOH in a molecule, and
(H) an acetylene alcohol derivative.

the organic solvent (A) used herein may be any desired one of organic solvents in which the photoacid generator, base resin, and dissolution regulator are soluble. Illustrative, non-limiting examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate alone or in admixture of two or more. The preferred solvents are diethylene glycol dimethyl ether and 1-ethoxy-2-propanol ensuring the maximum solubility of photoacid generators and propylene glycol monomethyl ether acetate ensuring safety. These solvents may be used alone or in admixture of two or more.

The amount of the organic solvent used is preferably about 200 to 1,000 parts, more preferably about 400 to 800 parts by weight per 100 parts by weight of the base resin consisting of components (B) and (D) combined.

The photoacid generator (C) used herein is selected from onium salts of the following general formula (8), diazomethane derivatives of the following general formula (9), glyoxime derivatives of the following general formula (10), β-ketosulfone derivatives, disulfone derivatives, nitrobenzylsulfonate derivatives, sulfonate derivatives, and imideylsulfonate derivatives, for example.

$$(R^{60})_b M^+ K^- \tag{8}$$

$R^{60}$ is a normal, branched or cyclic alkyl group of 1 to 12 carbon atoms, aryl group of 6 to 12 carbon atoms, or aralkyl group of 7 to 12 carbon atoms; $M^+$ is iodonium or sulfonium; $K^-$ is a non-nucleophilic counter ion; and letter b is equal to 2 or 3.

Examples of the alkyl group represented by $R^{60}$ include methyl, ethyl, propyl, butyl, cyclohexyl, 2-oxocyclohexyl, norbornyl, and adamantyl. Exemplary aryl groups are phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkyl phenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups are benzyl and phenethyl. Examples of the non-nucleophilic counter ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

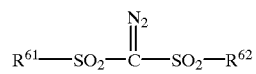

$R^{61}$ and $R^{62}$ are normal, branched or cyclic alkyl groups of 1 to 12 carbon atoms which may be halogenated, aryl groups of 6 to 12 carbon atoms which may be halogenated, or aralkyl groups of 7 to 12 carbon atoms.

Examples of the alkyl group represented by $R^{61}$ and $R^{62}$ include methyl, ethyl, propyl, butyl, amyl, cyclopentyl, cyclohexyl, norbornyl, and adamantyl. Examples of the halogenated alkyl group include trifluoromethyl, 1,1,1-trifluoroethyl, 1,1,1-trichloroethyl, and nonafluorobutyl. Examples of the aryl group include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkyl phenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups are fluorobenzene, chlorobenzene, and 1,2,3,4,5-pentafluorobenzene. Exemplary aralkyl groups are benzyl and phenethyl.

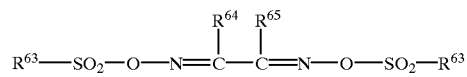

$R^{63}$, $R^{64}$ and $R^{65}$ are normal, branched or cyclic alkyl groups of 1 to 12 carbon atoms which may be halogenated, aryl groups of 6 to 12 carbon atoms which may be halogenated, or aralkyl groups of 7 to 12 carbon atoms. Alternatively, $R^{64}$ and $R^{65}$, taken together, form a cyclic structure with the proviso that $R^{64}$ and $R^{65}$ each are a normal or branched alkylene group of 1 to 6 carbon atoms when they form a cyclic structure.

Examples of the alkyl, halogenated alkyl, aryl, halogenated aryl, and aralkyl groups represented by $R^{63}$, $R^{64}$ and $R^{65}$ are the same as described for $R^{61}$ and $R^{62}$. Examples of the alkylene group represented by $R^{64}$ and $R^{65}$ include methylene, ethylene, propylene, butylene, and hexylene.

Typical examples of the photoacid generator (C) are:
onion salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonate ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imide-yl sulfonates such as phthalimide-yl triflate, phthalimide-yl tosylate, 5-norbornene-2,3-dicarboxyimide-yl triflate, 5-norbornene-2,3-dicarboxyimide-yl tosylate, and 5-norbornene-2,3-dicarboxyimide-yl n-butylsulfonate.

Preferred among these are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-diphenylglyoxime. It is noted that the photoacid generators mentioned above may be used alone or in admixture of two or more. The onium salts are effective for improving rectangularity while the diazomethane derivatives and glyoxime derivatives are effective for reducing standing wave. A combination of an onium salt with a diazomethane or glyoxime derivative allows for finer profile adjustment.

Desirably, the photoacid generator is added in an amount of about 0.5 to 15 parts, especially about 1 to 8 parts by weight per 100 parts by weight of the base resin. Sensitivity would be low with less than 0.5 part of the photoacid generator. More than 15 parts of the photoacid generator would lower an alkali dissolution rate to detract from resolution. Additionally heat resistance lowers because monomeric components become excessive.

Component (D) is another base resin in the form of a high molecular weight compound or polymer different from the crosslinked polymer defined as component (B). More preferably, component (D) is a polymer comprising recurring units of the following general formula (11) and having a weight average molecular weight of 3,000 to 300,000.

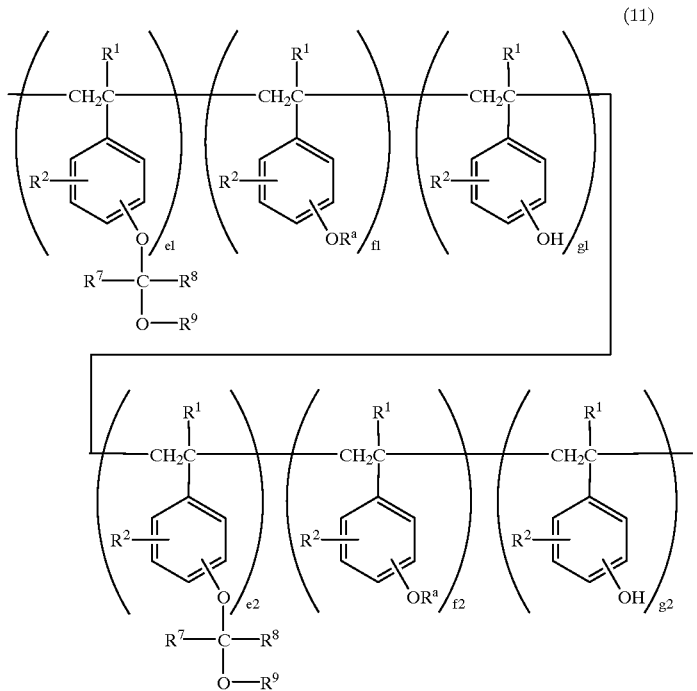

(11)

$R^1$, $R^2$, $R^7$ to $R^9$ are as defined above. $R^{11}$ is an acid labile group different from formula (5), for example, a group of the general formula (6), tert-alkyl group of 4 to 20 carbon atoms, trialkylsilyl group whose alkyl groups each have 1 to 6 carbon atoms, or oxoalkyl group of 4 to 20 carbon atoms. Letters e1, f1, e2 and f2 each are 0 or a positive number, e1, f1, e2 and f2 can be 0 at the same time, g1 and g2 are positive numbers satisfying e1+e2+f1+f2+g1+g2=1. Their ratios are preferably $0\leq(e1+e2)/(e1+e2+f1+f2+g1+g2)\leq0.5$, $0\leq(f1+f2)/(e1+e2+f1+f2+g1+g2)\leq0.5$ and $0.4\leq(g1+g2)/(e1+e2+f1+f2+g1+g2)\leq0.9$, preferably $0.1\leq(e1+e2)/(e1+e2+f1+f2+g1+g2)\leq0.4$, $0\leq(f1+f2)/(e1+e2+f1+f2+g1+g2)\leq0.2$ and $0.6\leq(g1+g2)/(e1+e2+f1+f2+g1+g2)\leq0.8$. If the proportion of (e1+e2) to the total (e1+e2+f1+f2+g1+g2) is more than 0.5, if the proportion of (f1+f2) to the total is more than 0.5, or if the proportion of (g1+g2) to the total is more than 0.9 or less than 0.4, then the contrast between alkali dissolution rates would lower to detract from resolution. If the proportion of (e2+f2+g2) to the total is more than 0.5, the hydrogenated resin becomes alkali insoluble and thus inadequate as a base resin for resists. If (e2+f2+g2) is too small, the performance improving effect of hydrogenation diminishes. By properly selecting the values of e1, e2, f1, f2, g1 and g2 within the above-defined range, the size and shape of a resist pattern can be controlled as desired.

The polymer has a weight average molecular weight (Mw) of 3,000 to 300,000, preferably 5,000 to 30,000. With Mw<3,000, a resist composition is less resistant to heat. With Mw>300,000, a resist composition becomes low in alkali dissolution and hence, resolution.

In the base resin as component (D), a wide molecular weight dispersity (Mw/Mn) means that there are present low molecular weight polymers and high molecular weight polymers. If low molecular weight polymers are predominant, heat resistance would be poor. If high molecular weight polymers are predominant, which means the presence of less alkali soluble components, a footing phenomenon occurs after pattern formation. As the pattern rule becomes finer, the influence of molecular weight and its dispersity becomes more significant. In order to provide a resist composition suitable for processing to fine pattern dimensions, the base resin is preferably a monodisperse polymer having a dispersity of 1.0 to 2.5, especially 1.0 to 1.5.

Preferably the base resin (D) is blended with the base resin (B) in the form of a crosslinked polymer in a weight ratio of from 0:100 to 90:10, more preferably from 0:100 to 50:50. If the base resin (D) is blended in excess of this weight ratio range relative to the base resin (B), the desired effect of the crosslinked polymer as base resin (B) would be somewhat lost.

In the resist composition of the invention, a dissolution regulator may be added as component (E).

The dissolution regulator (E) is a compound having an average molecular weight of 100 to 1,000, preferably 150 to 800 and at least two phenolic hydroxyl groups in a molecule, the hydrogen atom of the phenolic hydroxyl group being replaced by an acid labile group in an average proportion of 0% to 100% of the entire phenolic hydroxyl groups. The percent average replacement of the hydrogen atom of phenolic hydroxyl group by an acid labile group is 0 to 100 mol %, preferably 30 to 80 mol % of the entire phenolic hydroxyl groups.

The compound having at least two phenolic hydroxyl groups in a molecule as dissolution regulator (E) is exemplified by compounds of the following general formulae (i) to (xi):

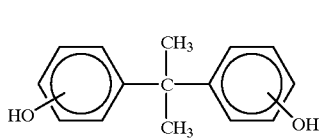

(i)

(ii)

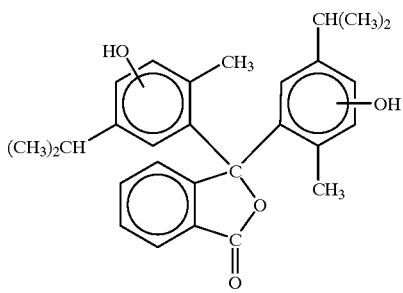

(iii)

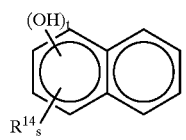

(iv)

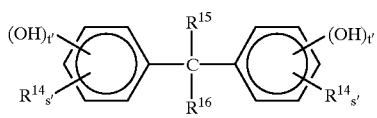

(v)

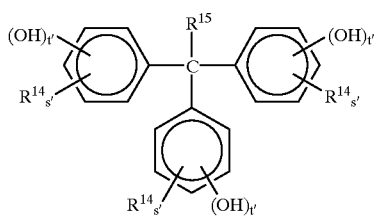

(vi)

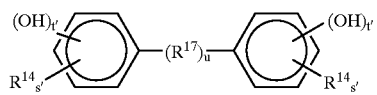

(vii)

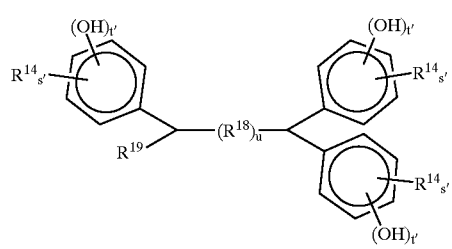

(viii)

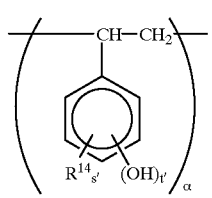

(ix)

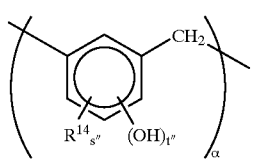

(x)

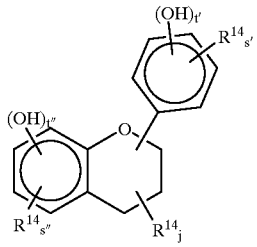

(xi)

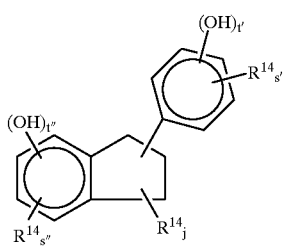

In the formulae, $R^{14}$ and $R^{15}$ are independently a hydrogen atom or normal or branched alkyl or alkenyl group having 1 to 8 carbon atoms. $R^{16}$ is a hydrogen atom, normal or branched alkyl or alkenyl group having 1 to 8 carbon atoms, or $-(R^{20})_n-COOH$. $R^{17}$ is a group $-(CH_2)_i-$ wherein i is 2 to 10, arylene group having 6 to 10 carbon atoms, carbonyl group, sulfonyl group, oxygen atom or sulfur atom. $R^{18}$ is an alkylene group having 1 to 10 carbon atoms, arylene group having 6 to 10 carbon atoms, carbonyl group, sulfonyl group, oxygen atom or sulfur atom. $R^{19}$ is a hydrogen atoms, normal or branched alkyl group having 1 to 8 carbon atoms, alkenyl group, hydroxyl-substituted phenyl group or hydroxyl-substituted naphthyl group. $R^{20}$ is a normal or branched alkylene group having 1 to 10 carbon atoms. Letter j is an integer of 0 to 5, u and h each are 0 or 1, and s, t, s', t', s", and t" are numbers satisfying s+t=8, s'+t'=5, and s"+t"=4 such that at least one hydroxyl group is attached to each phenyl skeleton. α is such a number that the compound of formula (viii) or (ix) may have a molecular weight of 100 to 1,000.

Exemplary groups represented by $R^{14}$ and $R^{15}$ are hydrogen, methyl, ethyl, propyl, butyl, ethynyl, and cyclohexyl groups. Exemplary groups represented by $R^{16}$ are as exemplified for $R^{14}$ and $R^{15}$ as well as —COOH and —CH$_2$COOH. Exemplary groups represented by $R^{17}$ are ethylene, phenylene, carbonyl, and sulfonyl groups, oxygen and sulfur atoms. Exemplary groups represented by $R^{18}$ are methylene and as exemplified for $R^{17}$. Exemplary groups represented by $R^{19}$ are hydrogen, methyl, ethyl, propyl, butyl, ethynyl, cyclohexyl, and hydroxyl-substituted phenyl and naphthyl groups.

The acid labile group in the dissolution regulator includes groups of formulae (5) and (6), tert-alkyl groups of 4 to 20 carbon atoms, trialkylsilyl groups whose alkyl groups each have 1 to 6 carbon atoms, and oxoalkyl groups of 4 to 20 carbon atoms.

The dissolution regulator in the form of a compound whose phenolic hydroxyl group is partially replaced by an acid labile group is preferably blended in the resist composition in an amount of 0 to about 50 parts, more preferably about 5 to 50 parts, most preferably 10 to 30 parts by weight per 100 parts by weight of the base resin. At least 5 parts of the dissolution regulator would be necessary to be effective for improving resolution whereas more than 50 parts would induce pattern thinning and detract from resolution.

The dissolution regulator mentioned above can be synthesized by chemically reacting an acid labile group with a compound having phenolic hydroxyl groups as in the preparation of the base resin.

As dissolution regulator (E), a compound having a weight average molecular weight of more than 1,000 to 3,000 and a phenolic hydroxyl group in a molecule wherein the hydrogen atom of the phenolic hydroxyl group being partially replaced by an acid labile group in an average proportion of 0% to 60% of the entirety may be blended in addition to or instead of the above-mentioned compound. This compound is referred to as second compound or dissolution regulator.

The second compound in which the hydrogen atom of a phenolic hydroxyl group is partially replaced by an acid labile group is preferably selected from compounds comprising recurring units of the following general formula (12) and having a weight average molecular weight of more than 1,000 to 3,000.

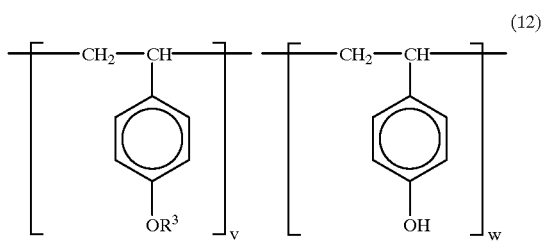

In formula (12), $R^3$ is an acid labile group, letters v and w are numbers satisfying $0 \leq v/(v+w) \leq 0.6$.

The acid labile group in the second dissolution regulator includes groups of formulae (5) and (6), tert-alkyl groups of 4 to 20 carbon atoms, trialkylsilyl groups whose alkyl groups each have 1 to 6 carbon atoms, and oxoalkyl groups of 4 to 20 carbon atoms.

The blending amount of the first and second dissolution regulators combined is preferably 0 to 50 parts, more preferably 0 to 30 parts, especially 1 to 30 parts by weight per 100 parts by weight of the base resin.

The second dissolution regulator can be synthesized by chemically reacting an acid labile group with a compound having phenolic hydroxyl groups as in the preparation of the base resin.

In the resist composition of the invention, a basic compound (F) is blended. The basic compound is preferably a compound which can suppress the diffusion rate at which the acid generated from the photoacid generator diffuses into a resist coating. The blending of such a basic compound suppresses the diffusion rate of acid in a resist coating to improve resolution, suppresses a change of sensitivity after exposure, and mitigates substrate and environment dependency, achieving improvements in exposure margin and pattern profile.

Included in the basic compound are primary, secondary and tertiary aliphatic amines, hybrid amines, aromatic amines, heterocyclic amines, carboxyl-bearing nitrogenous compounds, sulfonyl-bearing nitrogenous compounds, hydroxyl-bearing nitrogenous compounds, hydroxyphenyl-bearing nitrogenous compounds, alcoholic nitrogenous compounds, amide derivatives, and imide derivatives.

Examples of the primary aliphatic amine include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of the secondary aliphatic amine include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N-N-dimethylmethylenediamine, N,N-dimethylethylenediamine, and N,N-dimethyltetraethylenepentamine. Examples of the tertiary aliphatic amine include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the hybrid amine include dimethylethylamine, methylethylpropylamine, benzylamine, phenethylamine, and benzyldimethylamine. Examples of the aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinylpyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the carboxyl-bearing nitrogenous compound include aminobenzoic acid, indolecarboxylic acid, amino acid derivatives such as nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine. Examples of the sulfonyl-bearing nitrogenous compound include 3-pyridinesulfonic acid and pyridinium p-toluenesulfonate. Examples of the hydroxyl-bearing nitrogenous compound, hydroxyphenyl-bearing nitrogenous compound, and alcoholic nitrogenous compound include 2-hydroxypyridine, aminocresole, 2,4-quinoline diol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl) pyrrolidine, 1-(2-hydroxyethyl)-2-pyrrolidinone, 3-piperidino-1,2-propane diol, 3-pyrrolidino-1,2-propane diol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl) isonicotinamide. Examples of the amide derivative include formamide, N-methylformamide, N,N-dimethylformamide, acetamide, N-methylacetamide, N,N-dimethylacetamide, propionamide, and benzamide. Exemplary imide derivatives are phthalimide, succinimide, and maleimide.

Also included are basic compounds of the following general formulae (13) and (14).

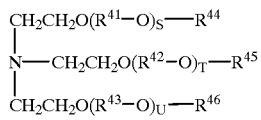

(13)

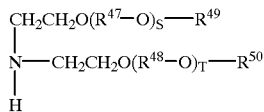

(14)

In formula (13) and (14), $R^{41}$, $R^{42}$, $R^{43}$, $R^{47}$, and $R^{48}$ are independently normal, branched or cyclic alkylene groups of 1 to 20 carbon atoms. $R^{44}$, $R^{45}$, $R^{46}$, $R^{49}$, and $R^{50}$ are independently hydrogen, alkyl groups of 1 to 20 carbon atoms, or amino groups. Alternatively, $R^{44}$ and $R^{45}$, $R^{45}$ and $R^{46}$, $R^{44}$ and $R^{46}$, or $R^{44}$ and $R^{45}$ and $R^{46}$, and $R^{49}$ and $R^{50}$, taken together, may form a ring. S, T and U are integers of 0 to 20, with the proviso that hydrogen is excluded from $R^{44}$, $R^{45}$, $R^{46}$, $R^{49}$, and $R^{50}$ when S, T and U are equal to 0.

The alkylene groups represented by $R^{41}$, $R^{42}$, $R^{43}$, $R^{47}$, and $R^{48}$ are preferably those of 1 to 20 carbon atoms, more preferably 1 to 10 carbon atoms, most preferably 1 to 8 carbon atoms, such as methylene, ethylene, n-propylene, isopropylene, n-butylene, isobutylene, n-pentylene, isopentylene, hexylene, nonylene, decylene, cyclopentylene, and cyclohexylene. The alkyl groups represented by $R^{44}$, $R^{45}$, $R^{46}$, $R^{49}$, and $R^{50}$ are preferably those of 1 to 20 carbon atoms, more preferably 1 to 8 carbon atoms, most preferably 1 to 6 carbon atoms, while they may be normal, branched or cyclic. Exemplary alkyl groups are methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl. Where $R^{44}$ and $R^{45}$, $R^{45}$ and $R^{46}$, $R^{44}$ and $R^{46}$, $R^{44}$ and $R^{45}$ and $R^{46}$, or $R^{49}$ and $R^{50}$ form a ring, the ring preferably has 1 to 20 carbon atoms, more preferably 1 to 8 carbon atoms, most preferably 1 to 6 carbon atoms and may have branched therefrom an alkylene group of 1 to 6 carbon atoms, especially 1 to 4 carbon atoms. Each of S, T and U is an integer of 0 to 20, preferably 1 to 10, more preferably 1 to 8.

Illustrative examples of the compounds of formulae (13) and (14) include tris{2-(methoxymethoxy)ethyl}amine, tris{2-(methoxyethoxy)ethyl}amine, tris [2-{(2-methoxyethoxy)methoxy}ethyl]amine, tris{2-(2-methoxyethoxy)ethyl}amine, tris{2-(1-methoxyethoxy) ethyl}amine, tris{2-(1-ethoxyethoxy)ethyl}amine, tris{2-(1-ethoxypropoxy)ethyl}amine, tris[2-{(2-hydroxyethoxy) ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6.

Especially preferred basic compounds are tertiary amines, aniline derivatives, pyrrolidine derivatives, pyridine derivatives, quinoline derivatives, amic acid derivatives, nitrogenous compounds having a hydroxyl group, nitrogenous compounds having a hydroxyphenyl group, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy) methyl}ethyl]amine, and 1-aza-15-crown-5.

The above-mentioned basic compounds may be used alone or in admixture of two or more. Preferably the basic compound is blended in an amount of 0 to about 2 parts, especially about 0.01 to 1 part by weight per 100 parts by weight of the base resin. More than 2 parts of the basic compound would adversely affect sensitivity.

Optional component (G) blended in the resist composition of the invention is an aromatic compound having a group ≡C—COOH in a molecule. It may be at least one compound selected from the following classes I and II although the invention is not limited thereto.

Class I

Compounds of the following general formulae (15) to (24) wherein some or all of the hydrogen atoms of phenolic hydroxyl groups are replaced by —$R^{21}$—COOH wherein $R^{21}$ is a normal or branched alkylene group having 1 to 10 carbon atoms and the molar fraction of the phenolic hydroxyl group (C mol) in the molecule to the group ≡C—COOH (D mol) is C/(C+D)=0.1 to 1.0.

Class II

Compounds of the following general formulae (25) to (26)

Class I

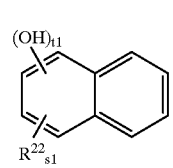

(15)

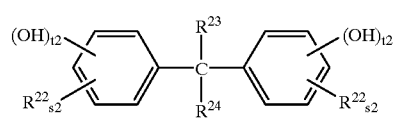

(16)

(17) 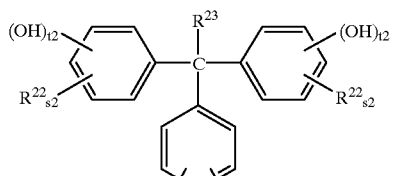

(18) 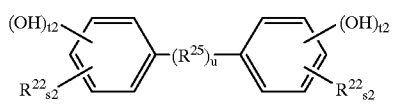

(19) 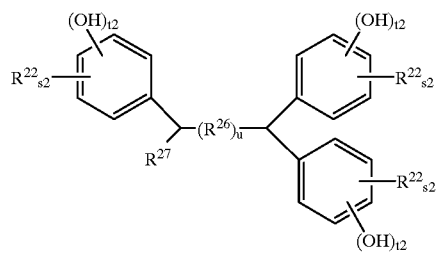

(20) 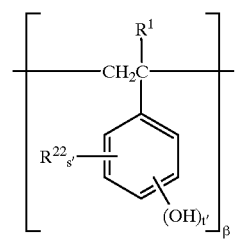

(21) 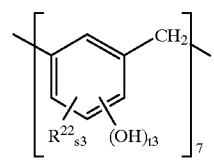

(22) 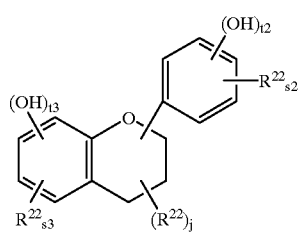

(23) 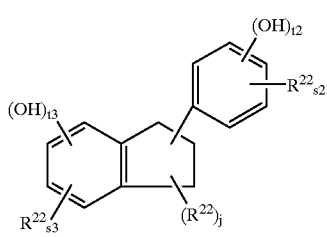

(24) 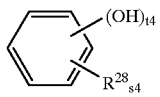

In the formulae, $R^1$ is a hydrogen atom or methyl group. $R^{22}$ and $R^{23}$ are independently a hydrogen atom or normal or branched alkyl or alkenyl group having 1 to 8 carbon atoms. $R^{24}$ is a hydrogen atom, normal or branched alkyl or alkenyl group having 1 to 8 carbon atoms, or $-(R^{29})_h-$COOR' wherein R' is a hydrogen atom or $-R^{29}-$COOH. $R^{25}$ is a group $-(CH_2)_i-$ wherein i is 2 to 10, arylene group having 6 to 10 carbon atoms, carbonyl group, sulfonyl group, oxygen atom or sulfur atom. $R^{26}$ is an alkylene group having 1 to 10 carbon atoms, arylene group having 6 to 10 carbon atoms, carbonyl group, sulfonyl group, oxygen atom or sulfur atom. $R^{27}$ is a hydrogen atom, normal or branched alkyl group having 1 to 8 carbon atoms, alkenyl group, hydroxyl-substituted phenyl group or hydroxyl-substituted naphthyl group. $R^{28}$ is a hydrogen atom, normal or branched alkyl or alkenyl group having 1 to 8 carbon atoms, or $-R^{29}-$COOH. $R^{29}$ is a normal or branched alkylene group having 1 to 10 carbon atoms. Letter j is an integer of 0 to 5, u and h each are 0 or 1, and s1, t1, s2, t2, s3, t3, s4, and t4 are numbers satisfying s1+t1=8, s2+t2=5, s3+t3=4, and s4+t4=6 such that at least one hydroxyl group is attached to each phenyl skeleton. β is such a number that the compound of formula (20) may have a weight average molecular weight of 1,000 to 5,000. γ is such a number that the compound of formula (21) may have a weight average molecular weight of 1,000 to 10,000.

Class II

(25) 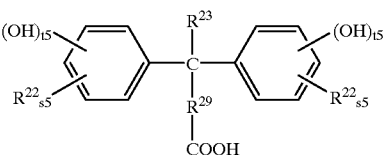

(26) 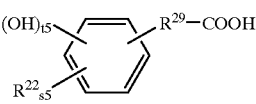

In the formulae, $R^{22}$, $R^{23}$, and $R^{29}$ are as defined above, and s5 and t5 are numbers satisfying s5≧0, t5≧0, and s5+t5=5.

Exemplary of component (G) are compounds of the following formulae VIII-1 to VIII-14 and IX-1 to IX-6.

[VIII-1]

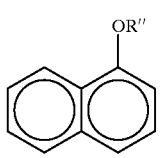

[VIII-2] 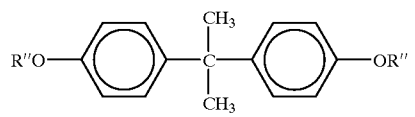
[VIII-3] 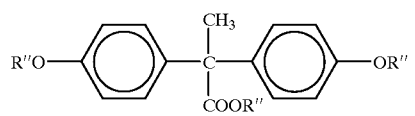
[VIII-4] 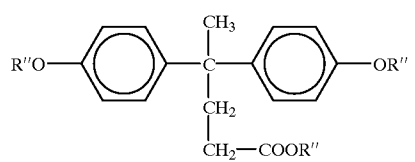
[VIII-5] 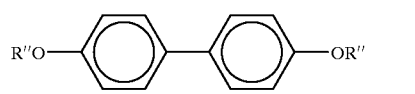
[VIII-6] 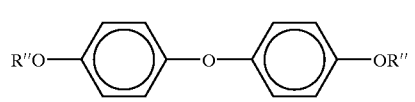
[VIII-7] 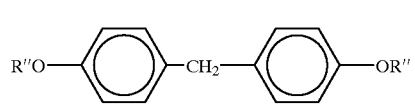
[VIII-8] 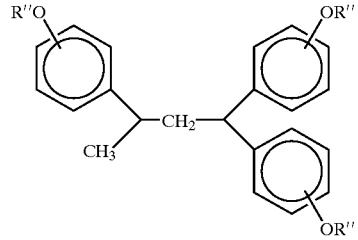
[VIII-9] 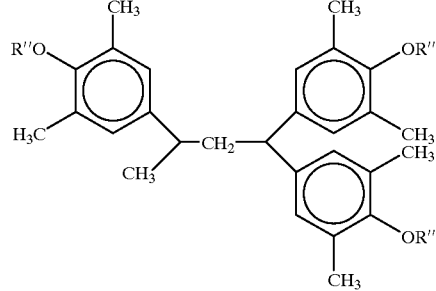
[VIII-10] 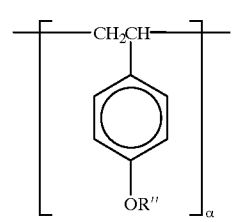
[VIII-11] 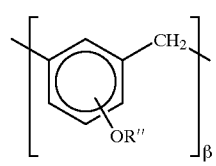
[VIII-12] 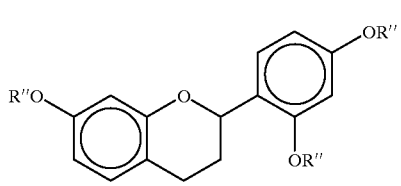
[VIII-13] 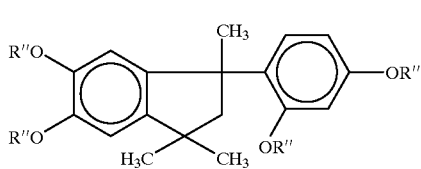
[VIII-14] 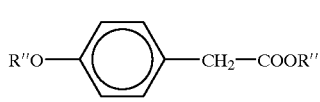
R″ is a hydrogen atom or a group $CH_2COOH$. In each compound, 10 to 100 mol % of R″ is $CH_2COOH$. α, β are the same meaning as above.
[IX-1] 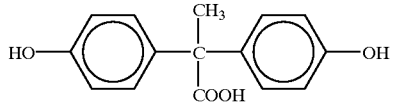
[IX-2] 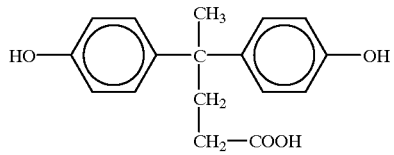
[IX-3] 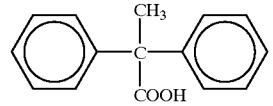
[IX-4] 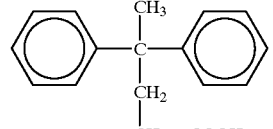
[IX-5] 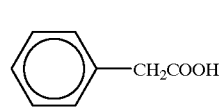

-continued

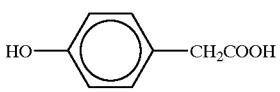

[IX-6]

The aromatic compounds having a group ≡C—COOH in a molecule may be used alone or in admixture of two or more. It is preferably blended in the resist composition in an amount of 0 to about 5 parts, preferably about 0.1 to 5 parts, more preferably about 1 to 3 parts by weight per 100 parts by weight of the base resin. More than 5 parts of the aromatic compound would adversely affect resolution.

In the resist composition of the invention, an acetylene alcohol derivative may be blended as component (H) for improving shelf stability. The acetylene alcohol derivative used herein is preferably selected from compounds of the following general formulae (27) and (28).

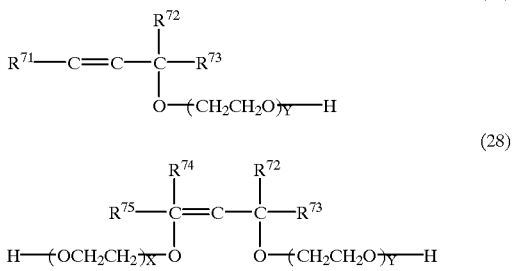

(27)

(28)

In formulae (27) and (28), $R^{71}$, $R^{72}$, $R^{73}$, $R^{74}$, and $R^{75}$ each are hydrogen or a normal, branched or cyclic alkyl group having 1 to 8 carbon atoms, X and Y are 0 or positive numbers satisfying $0 \leq X \leq 30$, $0 \leq Y \leq 30$, and $0 \leq X+Y \leq 40$.

Useful acetylene alcohol derivatives are commercially available under the trade name of Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc. and Surfynol E1004 from Nisshin Chemical Industry K.K.

The acetylene alcohol derivative is preferably added in an amount of 0.01 to 2%, more preferably 0.02 to 1% by weight based on the resist composition. Less than 0.01% by weight of the acetylene alcohol derivative would be ineffective for improving coating and shelf stability whereas more than 2% by weight would result in a resist composition with low resolution.

In the resist composition of the invention, a UV absorber may be added as component (I). It is a compound having a molar absorptivity of up to 10,000 at a wavelength of 248 nm.

Exemplary UV absorbers are fused polycyclic hydrocarbon derivatives, such as pentalene, indene, naphthalene, azulene, heptalene, biphenylene, indacene, fluorene, phenalene, phenanthrene, anthracene, fluoranthene, acephenanthrylene, aceanthrylene, triphenylene, pyrene, chrysene, naphthalene, pleiadene, picene, perylene, pentaphene, pentacene, benzophenanthrene, anthraquinone, anthrobenzanthrone, 2,7-dimethoxynaphthalene, 2-ethyl-9,10-dimethoxyanthracene, 9,10-dimethylanthracene, 9-ethoxyanthracene, 1,2-naphthoquinone, 9-fluorene, and compounds of the following formulae (29) and (30); fused heterocyclic derivatives such as thioxanthen-9-one, thianthrene, and dibenzothiophene; benzophenone derivatives such as 2,3,4-trihydroxybenzophenone, 2,3,4,4'-tetrahydroxybenzophenone, 2,4-dihydroxybenzophenone, 3,5-dihydroxybenzophenone, 4,4'-dihydroxybenzophenone, and 4,4'-bis(dimethylamino)benzophenone; and squalic acid derivatives such as squalic acid and dimethyl squalate.

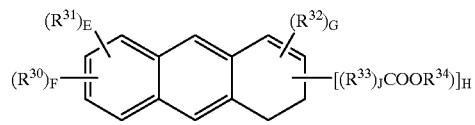

(29)

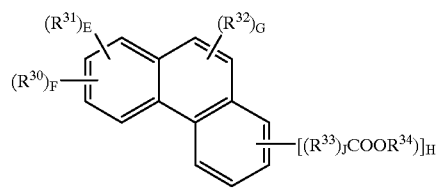

(30)

In formulae (29) and (30), $R^{30}$ to $R^{32}$ are independently hydrogen or a normal or branched alkyl, normal or branched alkoxy, normal or branched alkoxyalkyl, normal or branched alkenyl or aryl group. $R^{33}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. $R^{34}$ is an acid labile group. Letter J is equal to 0 or 1. Letters E, F and G are 0 or integers of 1 to 9, H is a positive integer of 1 to 10 satisfying $E+F+G+H \leq 10$.

More particularly, $R^{30}$ to $R^{32}$ in formulae (29) and (30) are independently hydrogen or a normal or branched alkyl, normal or branched alkoxy, normal or branched alkoxyalkyl, normal or branched alkenyl or aryl group. The normal or branched alkyl groups are preferably those having 1 to 10 carbon atoms, for example, methyl, ethyl, n-propyl, isopropyl, n-butyl, sec-butyl, tert-butyl, hexyl, cyclohexyl and adamantyl groups, with the methyl, ethyl, isopropyl and tert-butyl groups being especially preferred. The normal or branched alkoxy groups are preferably those having 1 to 8 carbon atoms, for example, methoxy, ethoxy, propoxy, isopropoxy, n-butoxy, sec-butoxy, tert-butoxy, hexyloxy, and cyclohexyloxy groups, with the methoxy, ethoxy, isopropoxy, and tert-butoxy groups being especially preferred. The normal or branched alkoxyalkyl groups are preferably those having 2 to 10 carbon atoms, for example, methoxymethyl, 1-ethoxyethyl, 1-ethoxypropyl, 1-propoxyethyl, and 1-tert-butoxyethyl groups, with the methoxymethyl, 1-ethoxyethyl, 1-ethoxypropyl and 1-propoxyethyl groups being especially preferred. The normal or branched alkenyl groups are preferably those having 2 to 4 carbon atoms, for example, vinyl, propenyl, allyl, and butenyl groups. The aryl groups are preferably those having 6 to 14 carbon atoms, for example, phenyl, xylyl, toluyl, and cumenyl groups.

$R^{33}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. Letter J is equal to 0 or 1. Where J=0, the —$R^{33}$—linkage is a valence bond. The substituted or unsubstituted divalent aliphatic hydrocarbon groups which may contain an oxygen atom are preferably those having 1 to 10 carbon atoms, for example, methylene, ethylene, n-propylene, isopropylene, n-butylene, sec-butylene, —CH$_2$O—, —CH$_2$CH$_2$O—, and —CH$_2$OCH$_2$— groups, with the methylene, ethylene, —CH$_2$O—, and —CH$_2$CH$_2$O— being especially preferred. The substituted or unsubstituted divalent alicyclic hydrocarbon groups which may contain an oxygen atom are preferably those having 5 to 10 carbon atoms, for example, 1,4-cyclohexylene, 2-oxacyclohexan-1,4-ylene, and 2-thiacyclohexan-1,4-ylene. The substituted or unsubstituted divalent aromatic hydrocarbon groups which may contain an oxygen atom include those having 6 to 14 carbon atoms, for example, o-phenylene, p-phenylene, 1,2-xylen-3,6-ylene, toluen-2,5-ylene, and 1-cumen-2,5-ylene groups, and arylalkylene groups having 6 to 14 carbon atoms, for example, —CH$_2$Ph—, —CH$_2$PhCH$_2$—, —OCH$_2$Ph—, and —OCH$_2$PhCH$_2$O— groups wherein Ph is phenylene.

$R^{34}$ is an acid labile group. The term acid labile group used herein is a carboxyl group which is replaced by at least one functional group decomposable in the presence of acid. The acid labile group is not particularly limited as long as it is decomposed in the presence of acid to release a functional group exhibiting alkali solubility. Preferred are groups of the following general formulae (31a), (31b), and (31c).

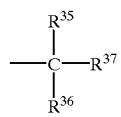
(31a)

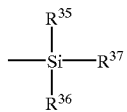
(31b)

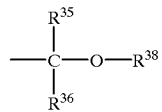
(31c)

In the formulae, $R^{35}$ to $R^{38}$ are independently hydrogen or a normal or branched alkyl, normal or branched alkoxy, normal or branched alkoxyalkyl, normal or branched alkenyl or aryl group, which may contain a carbonyl group in their chain. It is excluded that all of $R^{35}$ to $R^{38}$ are hydrogen. Alternatively, $R^{35}$ and $R^{36}$, taken together, may form a ring. $R^{38}$ is a normal or branched alkyl, normal or branched alkoxyalkyl, normal or branched alkenyl or aryl group, which may contain a carbonyl group in their chain. Alternatively, $R^{38}$ and $R^{35}$, taken together, may form a ring.

Examples of the normal or branched alkyl, normal or branched alkoxy, normal or branched alkoxyalkyl, normal or branched alkenyl, and aryl groups are as exemplified for $R^{30}$ to $R^{32}$.

The ring that $R^{35}$ forms with $R^{36}$ in formula (31a) includes those rings of 4 to 10 carbon atoms, for example, cyclohexylidene, cyclopentylidene, 3-oxycyclohexylidene, 3-oxo-4-oxacyclohexylidene, and 4-methylcyclohexylidene. The ring that $R^{35}$ forms with $R^{36}$ in formula (31b) includes those rings of 3 to 9 carbon atoms, for example, 1-silacyclohexylidene, 1-silacyclopentylidene, 3-oxo-1-silacyclopentylidene, and 4-methyl-1-silacyclopentylidene. The ring that $R^{38}$ forms with $R^{35}$ in formula (31c) includes those rings of 4 to 10 carbon atoms, for example, 2-oxacyclohexylidene, 2-oxacyclopentylidene, and 2-oxa-4-methylcyclohexylidene.

Examples of the group of formula (31a) include tertiary alkyl groups of 4 to 10 carbon atoms, such as tert-amyl, 1,1-dimethylethyl, 1,1-dimethylbutyl, 1-ethyl-1-methylpropyl, and 1,1-diethylpropyl, and 3-oxoalkyl groups such as 1,1-dimethyl-3-oxobutyl, 3-oxocyclohexyl, and 1-methyl-3-oxo-4-oxacyclohexyl groups.

Examples of the group of formula (31b) include trialkylsilyl groups of 3 to 10 carbon atoms, such as trimethylsilyl, ethyldimethylsilyl, dimethylpropylsilyl, diethylmethylsilyl, and triethylsilyl groups.

Examples of the groups of formula (31c) include groups of 2 to 8 carbon atoms, such as 1-methoxymethyl, 1-methoxyethyl, 1-ethoxyethyl, 1-ethoxypropyl, 1-ethoxyisobutyl, 1-n-propoxyethyl, 1-tert-butoxyethyl, 1-n-butoxyethyl, 1-iso-butoxyethyl, 1-tert-pentoxyethyl, 1-cyclohexyloxyethyl, 1-(2-n-butoxyethoxy)ethyl, 1-(2-ethylhexyl)oxyethyl, 1-{(4-acetoxymethyl)cyclohexylmethyloxy}ethyl, 1-{4-(tert-butoxycarbonyloxymethyl)cyclohexylmethyloxy}ethyl, 1-methoxy-1-methylethyl, 1-ehoxypropyl, dimethoxymethyl, diethoxymethyl, 2-tetrahydrofuranyl, and 2-tetrahydropyranyl groups.

In formulae (29) and (30), E, F and G are 0 or positive integers of 1 to 9, H is a positive integer of 1 to 10 satisfying E+F+G+H≦10.

Preferred examples of the compounds of formulae (29) and (30) are compounds of the general formulae (32a) to (32j) shown below.

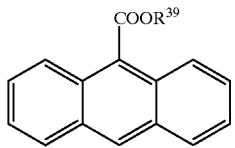
(32a)

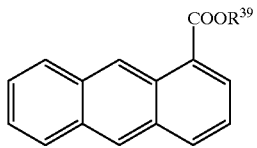
(32b)

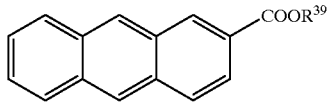
(32c)

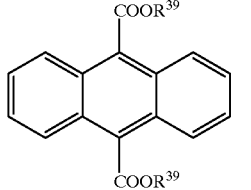
(32d)

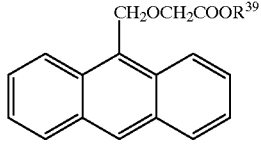
(32e)

-continued

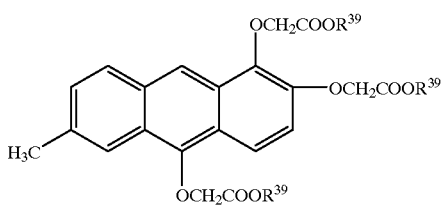 (32f)

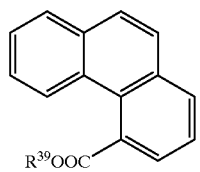 (32g)

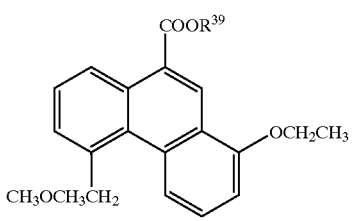 (32h)

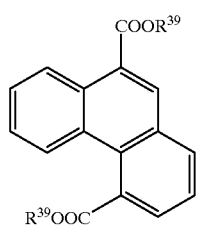 (32i)

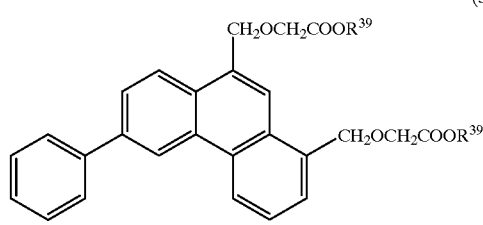 (32j)

In the formulae, $R^{39}$ is an acid labile group similar to $R^3$.

Other useful UV absorbers are diaryl sulfoxide derivatives such as bis(4-hydroxyphenyl) sulfoxide, bis(4-tert-butoxyphenyl) sulfoxide, bis(4-tert-butoxycarbonyloxyphenyl) sulfoxide, and bis[4-(1-ethoxyethoxy)phenyl] sulfoxide; diarylsulfone derivatives such as bis(4-hydroxyphenyl)sulfone, bis(4-tert-butoxyphenyl)sulfone, bis(4-tert-butoxycarbonyloxyphenyl)sulfone, bis[4-(1-ethoxyethoxy)phenyl]sulfone, and bis[4-(1-ethoxypropoxy)phenyl] sulfone; diazo compounds such as benzoquinonediazide, naphthoquinonediazide, anthraquinonediazide, diazofluorene, diazotetralone, and diazophenanthrone; and quinonediazide group-containing compounds such as complete or partial ester compounds between naphthoquinone-1,2-diazide-5-sulfonic acid chloride and 2,3,4-trihydroxybenzophenone and complete or partial ester compounds between naphthoquinone-1,2-diazide-4-sulfonic acid chloride and 2,4,4'-trihydroxybenzophenone.

Preferred UV absorbers are tert-butyl 9-anthracenecarboxylate, tert-amyl 9-anthracenecarboxylate, tert-methoxymethyl 9-anthracenecarboxylate, tert-ethoxyethyl 9-anthracenecarboxylate, tert-tetrahydropyranyl 9-anthracenecarboxylate, tert-tetrahydrofuranyl 9-anthracenecarboxylate, and partial ester compounds between naphthoquinone-1,2-diazide-5-sulfonic acid chloride and 2,3,4-trihydroxybenzophenone.

The amount of UV absorber (I) blended is preferably 0 to about 10 parts, more preferably about 0.5 to 10 parts, most preferably about 1 to 5 parts by weight per 100 parts by weight of the base resin.

The resist composition of the invention may further contain various additives, for example, a surface-active agent for facilitating coating. The amounts of such optional additives blended are conventional insofar as the objects of the invention are not impaired. Nonionic surfactants are preferred. Examples of the surfactant include perfluoroalkylpolyoxyethylene ethanols, fluorinated alkyl esters, perfluoroalkylamine oxides, and fluorinated organosiloxane compounds. Useful surfactants are commercially available under the trade name of Florade FC-430 and FC-431 from Sumitomo 3M K.K., Surflon S-141 and S-145 from Asahi Glass K.K., Unidine DS-401, DS-403 and DS-451 from Daikin Industry K.K., Megafac F-8151 from Dai-Nihon Ink Industry K.K., and X-70-092 and X-70-093 from Shin-Etsu Chemical Co., Ltd. Preferred surfactants are Florade FC-430 from Sumitomo 3M K.K. and X-70-093 from Shin-Etsu Chemical Co., Ltd.

Any well-known lithography may be used to form a resist pattern from a positive resist composition of the invention. For example, the resist composition is spin coated onto a silicon wafer and prebaked on a hot plate at a temperature of 60 to 150° C. for about 1 to 10 minutes, preferably 80 to 120° C. for 1 to 5 minutes. The resulting resist film is generally 0.5 to 2.0 μm thick. With a mask having a desired pattern placed above the resist film, the resist film is then exposed to actinic radiation having a wavelength of up to 300 nm such as deep-UV, excimer laser light, and X-ray or electron beam in an exposure dose of about 1 to 200 mJ/cm², preferably about 10 to 100 mJ/cm². The film is further baked on a hot plate at 60 to 150° C. for 1 to 5 minutes, preferably 80 to 120° C. for 1 to 3 minutes (post-exposure baking= PEB). Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably ½ to 2 minutes by a conventional technique such as dipping, puddling or spraying. In this way, a desired positive resist pattern is formed on the substrate. The chemically amplified positive resist composition of the invention is best suited for fine patterning with actinic radiation, especially radiation having a wavelength of 254 to 193 nm such as deep-UV, excimer laser light, and X-ray and electron beam. Outside the range, a failure to provide the desired pattern can occur.

The chemically amplified positive resist composition using the polymer of the invention as a base resin is sensitive to actinic radiation, has improved sensitivity, resolution and plasma etching resistance, and produces a heat resistant resist pattern. The pattern is unlikely to overhang and dimensional control is improved. Owing to these advantages, the chemically amplified positive resist composition of the invention provides a resist material having less absorption, especially at the exposure wavelength of a KrF excimer laser. A fine pattern having a wall perpendicular to the substrate is easily formed. Thus the composition is suitable as a fine patterning material for the manufacture of ultra-LSIs.

EXAMPLE

Examples of the present invention are given below by way of illustration and not by way of limitation. The following abbreviations are used.

Mw: weight average molecular weight
Mn: number average molecular weight
Tg: glass transition temperature

Synthesis Example 1

Synthesis of partially hydrogenated polymer

An autoclave was charged with 500 grams of a polyhydroxystyrene and 4,500 grams of ethanol. The polyhydroxystyrene had a Mw of 11,000 and a dispersity (Mw/Mn) of 1.4. A Raney nickel catalyst, 40 grams, was added to the system, which was purged with nitrogen. Hydrogen was introduced into the system under a pressure of 50 kg/cm$^2$ whereby hydrogenation was effected at 40° C. for 5 hours. The catalyst was filtered off and the reaction solution was poured into 50 liters of water whereupon white solids precipitated. The solids were collected by filtration, dissolved in 2,000 grams of acetone, and poured into 50 liters of water whereupon white solids precipitated again. The solids were collected by filtration and dried in vacuo. The yield was 95%. An analysis of the polymer by NMR showed a percent hydrogenation of 15%.

Synthesis Example 2

A partially hydrogenated polyhydroxystyrene having a percent hydrogenation of 28% was obtained by the same procedure as in Synthesis Example 1.

Synthesis Example 3

A partially hydrogenated polyhydroxystyrene having a percent hydrogenation of 19% was obtained by the same procedure as in Synthesis Example 1 except that poly-3,4-dihydroxystyrene was used instead of the polyhydroxystyrene.

Synthesis Example 4

In a 2-liter flask, 100 grams of the partially hydrogenated polymer obtained in Synthesis Example 1 was dissolved in 1,000 ml of dimethylformamide, and a catalytic amount of p-toluenesulfonic acid was added. With stirring at 20° C., 30 grams of ethyl vinyl ether and 2 grams of triethylene glycol divinyl ether were added to the reaction solution which was stirred for one hour for reaction. After neutralization with conc. aqueous ammonia, the neutralized reaction solution was added dropwise to 10 liters of water whereupon white solids precipitated. The solids were collected by filtration, dissolved in 500 ml of acetone, and added dropwise to 10 liters of water whereupon solids precipitated again. The solids were collected by filtration and dried in vacuum. On NMR analysis of the resulting polymer, designated Polym.1, it was found that 21% of the hydrogen atom of phenolic hydroxyl groups and 6% of the hydrogen atom of alcoholic hydroxyl groups on the polymer had been ethoxyethylated and 2% of the hydrogen atom of phenolic hydroxyl groups and 1% of the hydrogen atom of alcoholic hydroxyl groups had been crosslinked. This polymer had a Tg of 140° C. The polymer was measured for light transmittance at a film thickness 1 μm and a wavelength 248 nm by spin coating an ethoxypropanol solution of the polymer on a quartz wafer, drying the coating at 100° C. for one minute to form a polymer film of 1 μm thick, and performing measurement by means of a UV spectrometer by the transmission method, finding a transmittance of 65%.

Synthesis Example 5

In a 2-liter flask, 100 grams of the partially hydrogenated polymer obtained in Synthesis Example 1 was dissolved in 1,000 ml of dimethylformamide, and a catalytic amount of p-toluenesulfonic acid was added. With stirring at 20° C., 30 grams of ethyl vinyl ether and 2 grams of cyclohexane dimethanol divinyl ether were added to the reaction solution which was stirred for one hour for reaction. After neutralization with conc. aqueous ammonia, the neutralized reaction solution was added dropwise to 10 liters of water whereupon white solids precipitated. The solids were collected by filtration, dissolved in 500 ml of acetone, and added dropwise to 10 liters of water whereupon solids precipitated again. The solids were collected by filtration and dried in vacuum. On NMR analysis of the resulting polymer, it was found that 21% of the hydrogen atom of phenolic hydroxyl groups and 6% of the hydrogen atom of alcoholic hydroxyl groups on the polymer had been ethoxyethylated and 2% of the hydrogen atom of phenolic hydroxyl groups and 1% of the hydrogen atom of alcoholic hydroxyl groups had been crosslinked.

In 500 ml of pyridine was dissolved 50 grams of the partially crosslinked polymer. With stirring at 45° C., 7 grams of di-tert-butyl dicarbonate was added to the reaction solution which was stirred for one hour for reaction. The reaction solution was added dropwise to 3 liters of water whereupon white solids precipitated. The solids were collected by filtration, dissolved in 500 ml of acetone, and added dropwise to 2 liters of water whereupon solids precipitated again. The solids were collected by filtration and dried in vacuum. The resulting polymer had the structure represented by the rational formula (Polym.2). NMR analysis indicated that 21% of the hydrogen atom of phenolic hydroxyl groups and 6% of the hydrogen atom of alcoholic hydroxyl groups on the polymer had been ethoxyethylated, 2% of the hydrogen atom of phenolic hydroxyl groups and 1% of the hydrogen atom of alcoholic hydroxyl groups had been crosslinked, 4% of the hydrogen atom of phenolic hydroxyl groups and 4% of the hydrogen atom of alcoholic hydroxyl groups had been tert-butoxycarbonylated.

Synthesis Example 6

In a 2-liter flask, 50 grams of the partially hydrogenated polymer obtained in Synthesis Example 1 was dissolved in 500 ml of dimethylformamide, and a catalytic amount of p-toluenesulfonic acid was added. With stirring at 20° C., 27 grams of ethyl vinyl ether and 6.8 grams of Compound (II-5) were added to the reaction solution which was stirred for one hour for reaction. After neutralization with conc. aqueous ammonia, the neutralized reaction solution was added dropwise to 10 liters of water whereupon white solids precipitated. The solids were collected by filtration, dissolved in 250 ml of acetone, and added dropwise to 5 liters of water whereupon solids precipitated again. The solids were collected by filtration and dried in vacuum. The resulting polymer had the structure represented by the rational formula (Polym.3). On NMR analysis of the resulting polymer, it was found that 19% of the hydrogen atom of phenolic hydroxyl groups and 5% of the hydrogen atom of alcoholic hydroxyl groups on the polymer had been ethoxyethylated and 8% of the hydrogen atom of phenolic hydroxyl groups and 2% of the hydrogen atom of alcoholic hydroxyl groups had been crosslinked.

Synthesis Examples 7–10

Polymers represented by rational formulae (Polym.4) to (Polym.7) were obtained by the same procedure as in Synthesis Examples 4 to 6 except that the base resin was changed to the polymer obtained in Synthesis Example 2.

Synthesis Example 11

In a 2-liter flask, 100 grams of the partially hydrogenated polymer obtained in Synthesis Example 1 was dissolved in 900 grams of tetrahydrofuran, and a catalytic amount of methanesulfonic acid was added. With stirring at 30° C., 28.2 grams of ethyl-1-propenyl ether was added to the reaction solution, which was stirred for 3 hours for reaction. Thereafter, 3.8 grams of 1,4-butanediol divinyl ether was added to the reaction solution, which was stirred for ½ hour for reaction. After neutralization with conc. aqueous ammonia, the reaction solution was subjected to solvent exchange with ethyl acetate. Using a separatory funnel with pure water and a small amount of acetone, the reaction solution was purified 6 times. Solvent exchange with acetone and dropwise addition to 20 liters of pure water yielded white solids. The solids were filtered, washed two times with pure water, filtered again, and dried in vacuo. The resulting polymer had the structure represented by the rational formula (Polym.8). On NMR analysis of the resulting polymer, it was found that 21% of the hydrogen atom of phenolic hydroxyl groups and 5% of the hydrogen atom of alcoholic hydroxyl groups on the polymer had been ethoxypropylated and 4.5% of the hydrogen atom of phenolic hydroxyl groups and 1% of the hydrogen atom of alcoholic hydroxyl groups had been crosslinked.

Synthesis Example 12

In a 2-liter flask, 100 grams of the partially hydrogenated polymer obtained in Synthesis Example 1 was dissolved in 900 grams of tetrahydrofuran, and a catalytic amount of methanesulfonic acid was added. With stirring at 30° C., 28.2 grams of ethyl-1-propenyl ether was added to the reaction solution, which was stirred for 3 hours for reaction. Thereafter, 2.5 grams of 1,4-butanediol divinyl ether was added to the reaction solution, which was stirred for ½ for reaction. After neutralization with conc. aqueous ammonia, the neutralized reaction solution was subjected to solvent exchange with ethyl acetate. Using a separatory funnel with pure water and a small amount of acetone, the reaction solution was purified 6 times. Solvent exchange with acetone and dropwise addition to 20 liters of pure water yielded white solids. The solids were filtered, washed two times with pure water, filtered again, and dried in vacuo. The resulting polymer had the structure represented by the rational formula (Polym.8). On NMR analysis of the resulting polymer, it was found that 21% of the hydrogen atom of phenolic hydroxyl groups and 5% of the hydrogen atom of alcoholic hydroxyl groups on the polymer had been ethoxypropylated and 4.5% of the hydrogen atom of phenolic hydroxyl groups and 0% of the hydrogen atom of alcoholic hydroxyl groups had been crosslinked.

In 500 ml of pyridine was dissolved 50 grams of the partially crosslinked polymer. With stirring at 45° C., 7 grams of di-tert-butyl dicarbonate was added to the reaction solution, which was stirred for one hour for reaction. The reaction solution was added dropwise to 3 liters of water whereupon white solids precipitated. The solids were collected by filtration, dissolved in 50 ml of acetone, and added dropwise to 2 liters of water whereupon solids precipitated again. The solids were collected by filtration and dried in vacuum. The resulting polymer had the structure represented by the rational formula (Polym.9). NMR analysis indicated that 21% of the hydrogen atom of phenolic hydroxyl groups and 5% of the hydrogen atom of alcoholic hydroxyl groups on the polymer had been ethoxypropylated, 2% of the hydrogen atom of phenolic hydroxyl groups and 0% of the hydrogen atom of alcoholic hydroxyl groups had been crosslinked, and 4% of the hydrogen atom of phenolic hydroxyl groups and 4% of the hydrogen atom of alcoholic hydroxyl groups had been tert-butoxycarbonylated.

Synthesis Example 13

In 300 grams of pyridine was dissolved 50 grams of the polymer obtained in Synthesis Example 8. With stirring at 40° C., 4.5 grams of di-tert-butyl dicarbonate was added to the reaction solution, which was stirred for one hour for reaction. The reaction solution was added dropwise to 10 liters of water whereupon white solids precipitated. The solids were collected by filtration, dissolved in 200 ml of acetone, and added dropwise to 2 liters of water whereupon solids precipitated again. The solids were collected by filtration and dried in vacuum. The resulting polymer had the structure represented by the rational formula (Polym.10). NMR analysis indicated that 16% of the hydrogen atom of phenolic hydroxyl groups and 5% of the hydrogen atom of alcoholic hydroxyl groups on the polymer had been ethoxypropylated, 4% of the hydrogen atom of phenolic hydroxyl groups and 1.5% of the hydrogen atom of alcoholic hydroxyl groups had been crosslinked, and 3% of the hydrogen atom of phenolic hydroxyl groups and 4% of the hydrogen atom of alcoholic hydroxyl groups had been tert-butoxycarbonylated.

Synthesis Example 14

In a 2-liter flask, 100 grams of the partially hydrogenated polymer obtained in Synthesis Example 1 was dissolved in 900 grams of tetrahydrofuran, and a catalytic amount of methanesulfonic acid was added. With stirring at 30° C., 24.0 grams of ethyl vinyl ether was added to the reaction solution, which was stirred for one hour for reaction. Thereafter, 3.8 grams of 1,4-butanediol divinyl ether was added to the reaction solution, which was stirred for ½ hour for reaction. After neutralization with conc. aqueous ammonia, the neutralized reaction solution was subjected to solvent exchange with ethyl acetate. Using a separatory funnel with pure water and a small amount of acetone, the reaction solution was purified 6 times. Solvent exchange with acetone and dropwise addition to 20 liters of pure water yielded white solids. The solids were filtered, washed two times with pure water, filtered again, and dried in vacuo. The resulting polymer had the structure represented by the rational formula (Polym.11). On NMR analysis of the resulting polymer, it was found that 24% of the hydrogen atom of phenolic hydroxyl groups and 7% of the hydrogen atom of alcoholic hydroxyl groups on the polymer had been ethoxyethylated and 4% of the hydrogen atom of phenolic hydroxyl groups and 1.5% of the hydrogen atom of alcoholic hydroxyl groups had been crosslinked.

Synthesis Example 15

In a 2-liter flask, 100 grams of the partially hydrogenated polymer obtained in Synthesis Example 1 was dissolved in 900 grams of tetrahydrofuran, and a catalytic amount of methanesulfonic acid was added. With stirring at 30° C., 16.4 grams of ethyl vinyl ether was added to the reaction solution, which was stirred for one hour for reaction.

Thereafter, 3.8 grams of 1,4-butanediol divinyl ether was added to the reaction solution, which was stirred for ½ hour for reaction. After neutralization with conc. aqueous ammonia, the neutralized reaction solution was subjected to solvent exchange with ethyl acetate. Using a separatory funnel with pure water and a small amount of acetone, the reaction solution was purified 6 times. Solvent exchange with acetone and dropwise addition to 20 liters of pure water yielded white solids. The solids were filtered, washed two times with pure water, filtered again, and dried in vacuo.

In 500 ml of pyridine was dissolved 50 grams of the partially crosslinked polymer thus obtained. With stirring at 45° C., 4.5 grams of di-tert-butyl dicarbonate was added to the reaction solution, which was stirred for one hour for reaction. The reaction solution was added dropwise to 3 liters of water whereupon white solids precipitated. The solids were collected by filtration, dissolved in 50 ml of acetone, and added dropwise to 2 liters of water whereupon solids precipitated again. The solids were collected by filtration and dried in vacuum. The resulting polymer had the structure represented by the rational formula (Polym.12). NMR analysis indicated at 15% of the hydrogen atom of phenolic hydroxyl groups and 3% of the hydrogen atom of alcoholic hydroxyl groups on the polymer had been ethoxyethylated, 4% of the hydrogen atom of phenolic hydroxyl groups and 1.5% of the hydrogen atom of alcoholic hydroxyl groups had been crosslinked, and 3% of the hydrogen atom of phenolic hydroxyl groups and 2% of the hydrogen atom of alcoholic hydroxyl groups had been tert-butoxycarbonylated.

Synthesis Example 16

In a 2-liter flask, 100 grams of the partially hydrogenated polymer obtained in Synthesis Example 1 was dissolved in 1,000 ml of dimethylformamide, and a catalytic amount of p-toluenesulfonic acid was added. With stirring at 20° C., 2 grams of cyclohexane dimethanol divinyl ether was added to the reaction solution, which was stirred for one hour for reaction. After neutralization with conc. aqueous ammonia, the neutralized reaction solution was added dropwise to 10 liters of water whereupon white solids precipitated. The solids were collected by filtration, dissolved in 500 ml of acetone, and added dropwise to 10 liters of water whereupon solids precipitated again. The solids were collected by filtration and dried in vacuum. NMR analysis of the resulting polymer indicated that 2% of the hydrogen atom of phenolic hydroxyl groups and 1% of the hydrogen atom of alcoholic hydroxyl groups on the polymer had been crosslinked.

In 500 ml of pyridine was dissolved 50 grams of the partially crosslinked polymer thus obtained. With stirring at 45° C., 7 grams of di-tert-butyl dicarbonate was added to the reaction solution, which was stirred for one hour for reaction. The reaction solution was added dropwise to 3 liters of water whereupon white solids precipitated. The solids were collected by filtration, dissolved in 50 ml of acetone, and added dropwise to 2 liters of water whereupon solids precipitated again. The solids were collected by filtration and dried in vacuum. The resulting polymer had the structure represented by the rational formula (Polym.13). NMR Analysis indicated that 2% of the hydrogen atom of phenolic hydroxyl groups and 1% of the hydrogen atom of alcoholic hydroxyl groups on the polymer had been crosslinked, and 4% of the hydrogen atom of phenolic hydroxyl groups and 4% of the hydrogen atom of alcoholic hydroxyl groups had been tert-butoxycarbonylated.

Synthesis Example 17

In a 2-liter flask, 100 grams of the partially hydrogenated polymer obtained in Synthesis Example 1 was dissolved in 1,000 ml of dimethylformamide, and a catalytic amount of p-toluenesulfonic acid was added. With stirring at 20° C., 18 grams of ethyl vinyl ether and 4 grams of a trivinyl ether compound of rational formula (I-22) were added to the reaction solution, which was stirred for one hour for reaction. After neutralization with conc. aqueous ammonia, the neutralized reaction solution was added dropwise to 10 liters of water whereupon white solids precipitated. The solids were collected by filtration, dissolved in 500 ml of acetone, and added dropwise to 10 liters of water whereupon solids precipitated again. The solids were collected by filtration and dried in vacuum. NMR analysis of the resulting polymer indicated that 14% of the hydrogen atom of phenolic hydroxyl groups and 6% of the hydrogen atom of alcoholic hydroxyl groups on the polymer had been ethoxyethylated, and 3% of the hydrogen atom of phenolic hydroxyl groups and 1% of the hydrogen atom of alcoholic hydroxyl groups had been crosslinked.

In 500 ml of pyridine was dissolved 50 grams of the partially crosslinked polymer thus obtained. With stirring at 45° C., 7 grams of di-tert-butyl dicarbonate was added to the reaction solution, which was stirred for one hour for reaction. The reaction solution was added dropwise to 3 liters of water whereupon white solids precipitated. The solids were collected by filtration, dissolved in 50 ml of acetone, and added dropwise to 2 liters of water whereupon solids precipitated again. The solids were collected by filtration and dried in vacuum. The resulting polymer had the structure represented by the rational formula (Polym.14). NMR analysis indicated that 14% of the hydrogen atom of phenolic hydroxyl groups and 6% of the hydrogen atom of alcoholic hydroxyl groups on the polymer had been ethoxyethylated, 3% of the hydrogen atom of phenolic hydroxyl groups and 1% of the hydrogen atom of alcoholic hydroxyl groups had been crosslinked, and 2% of the hydrogen atom of phenolic hydroxyl groups and 2% of the hydrogen atom of alcoholic hydroxyl groups had been tert-butoxycarbonylated.

Comparative Synthesis Example 1

Synthesis was carried out by the same procedure as in Synthesis Example 4 except that polyhydroxystyrene was used instead of the partially hydrogenated polyhydroxystyrene of Synthesis Example 4. There was obtained a polyhydroxystyrene derivative designated Polym.15 in which 27% and 3% of the hydrogen atom of hydroxyl groups on the polyhydroxystyrene had been ethoxyethylated and crosslinked, respectively. The polymer was measured for light transmittance at a film thickness 1 μm and a wavelength 248 nm by spin coating an ethoxypropanol solution of the polyhydroxystyrene derivative on a quartz wafer, drying the coating at 100° C. for one minute to form a polymer film of 1 μm thick, and performing measurement by means of a UV spectrometer by the transmission method, finding a transmittance of 35%.

Comparative Synthesis Example 2

In a 2-liter flask, 48 grams of partially hydrogenated polyhydroxystyrene Maruka Lyncur® PHM-C (Mw=4,500, Mw/Mn=2, percent hydrogenation ~10%) was dissolved in 460 ml of tetrahydrofuran, and a catalytic amount of p-toluenesulfonic acid was added. With stirring at 10° C., 20 grams of tert-butyl vinyl ether in 80 ml of tetrahydrofuran was slowly added dropwise to the solution. Reaction was effected for 5 hours at room temperature. The neutralized reaction solution was added dropwise to 10 liters of a water/ethanol mixture whereupon white solids precipitated.

The solids were collected by filtration, dissolved in 250 ml of acetone, added dropwise to 5 liters of water, collected by filtration, and dried in vacuo. The resulting polymer had the structure represented by the rational formula (Polym.16). NMR analysis indicated that 32% of the hydrogen atom of phenolic hydroxyl groups and 5% of the hydrogen atom of alcoholic hydroxyl groups on the polymer had been ethoxyethylated, and 1% of the hydrogen atom of phenolic hydroxyl groups and 2% of the hydrogen atom of alcoholic hydroxyl groups had been crosslinked. The polymer had a Tg of 113° C.

$U_1$ (Polym. 1~14)

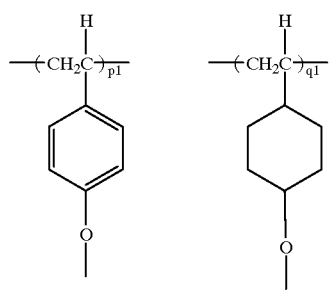

$U_2$

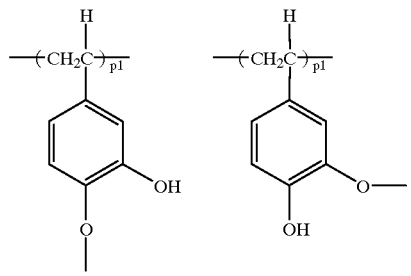

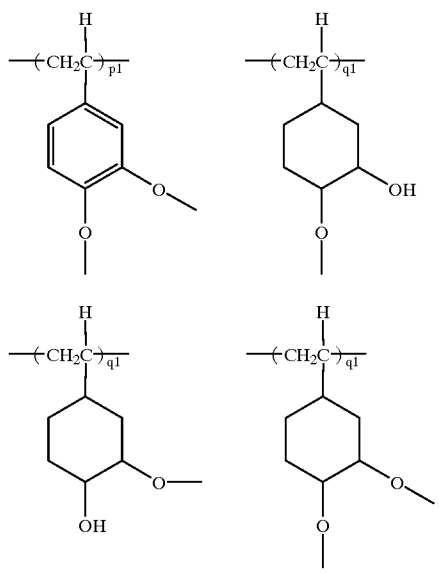

It is noted that among the rational formulae shown below, Polym.15 and Polym.16 are given for comparison purpose as well as Polym.17 to Polym.20.

Polym.1

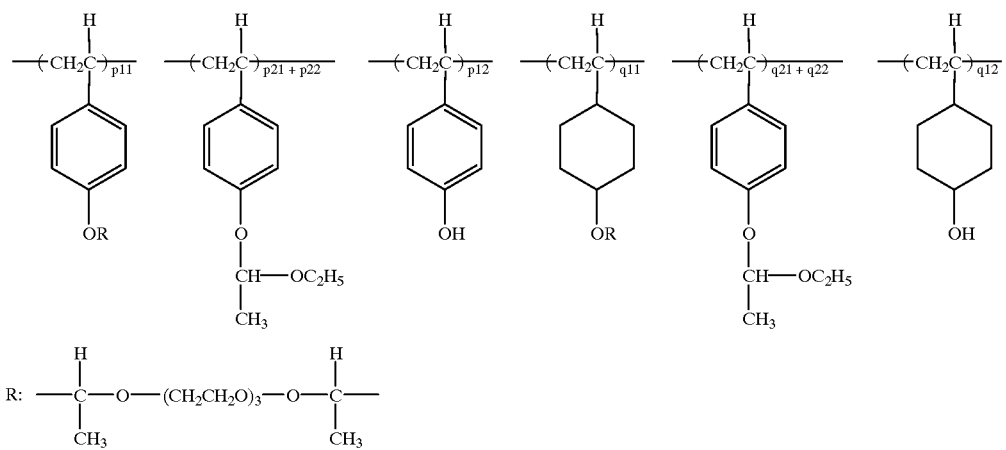

Polym.2

Polym.3
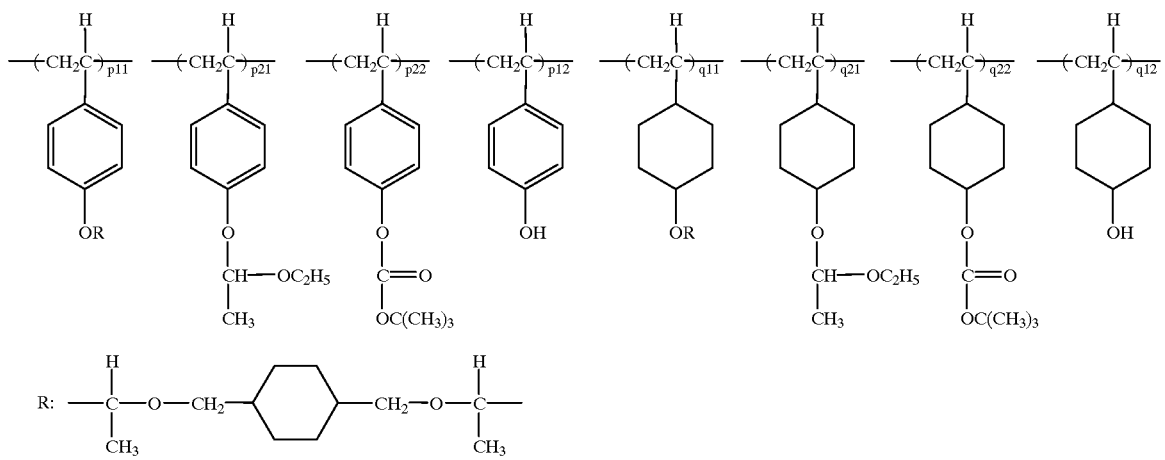
Polym.5
Polym.4
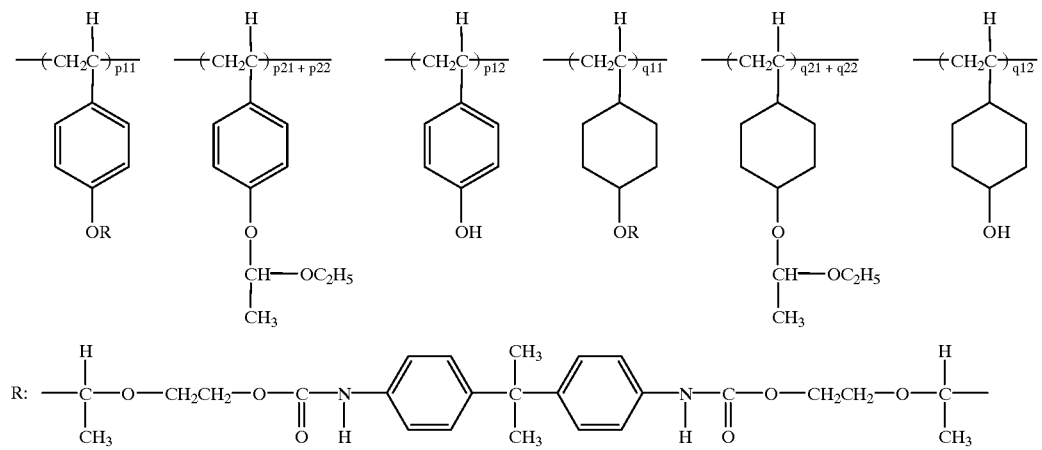
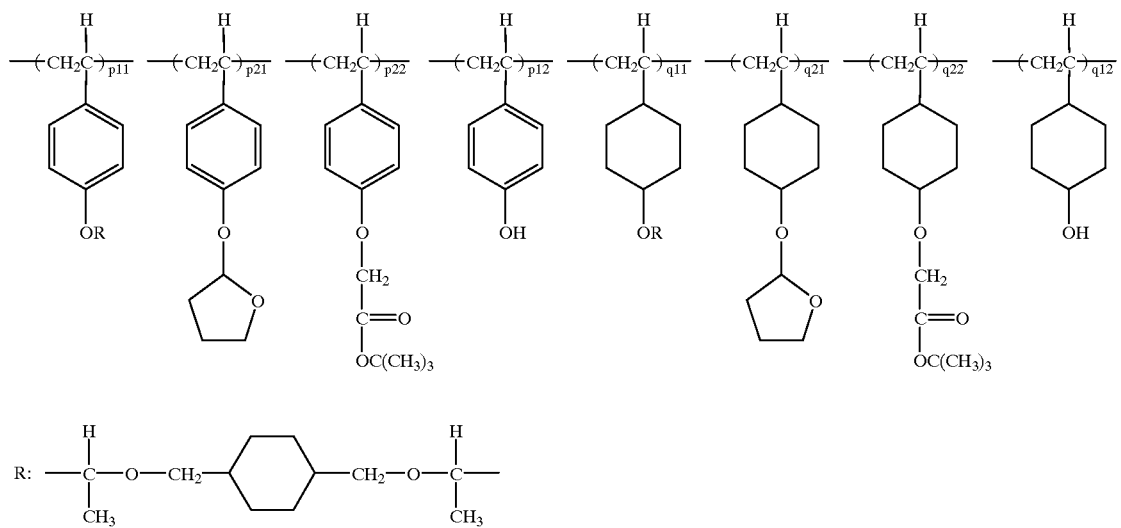

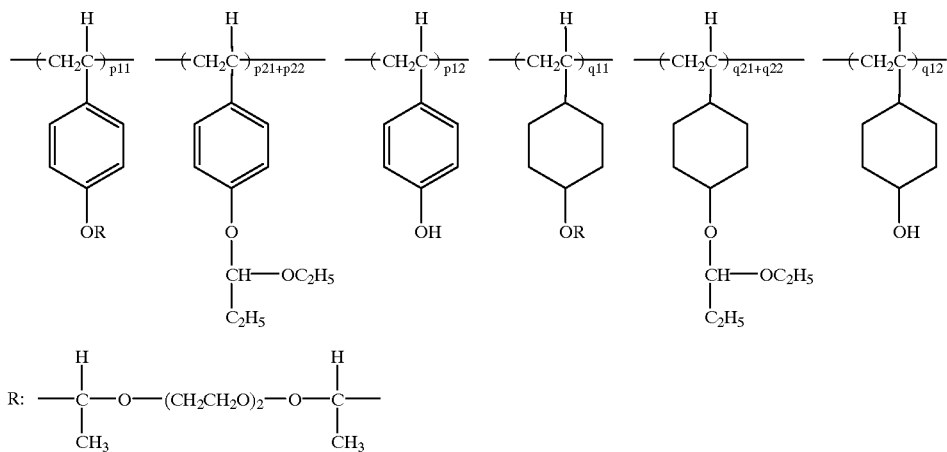
Polym.6
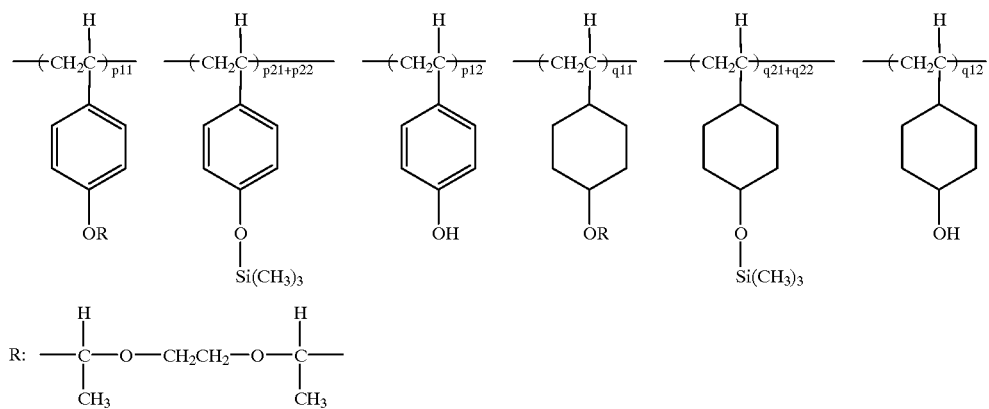
Polym.7
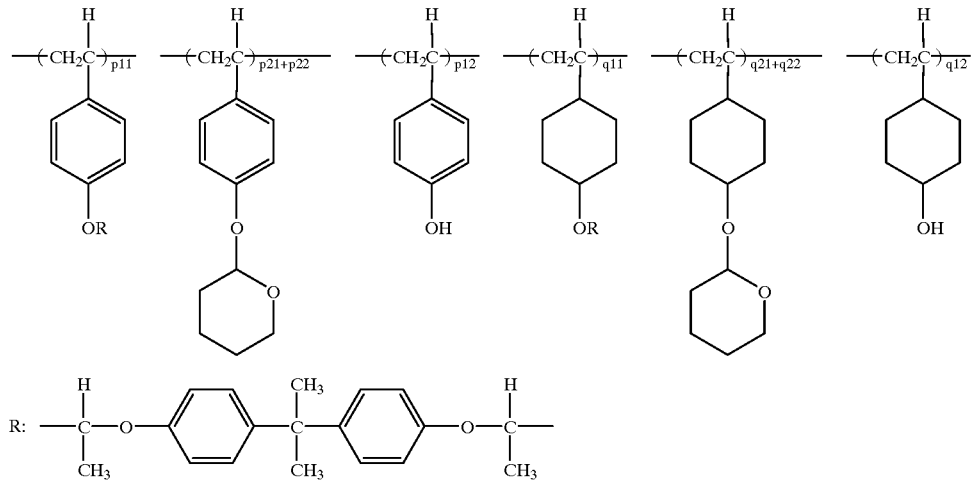
Polym.8

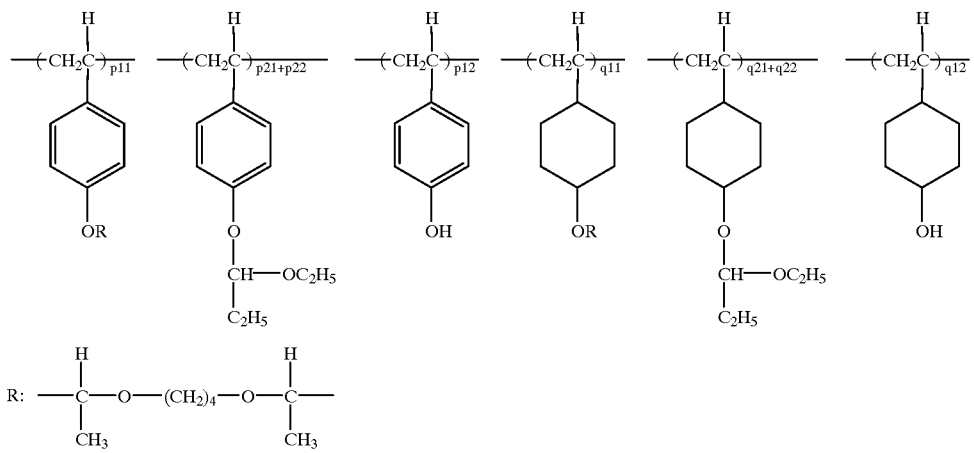
Polym.9
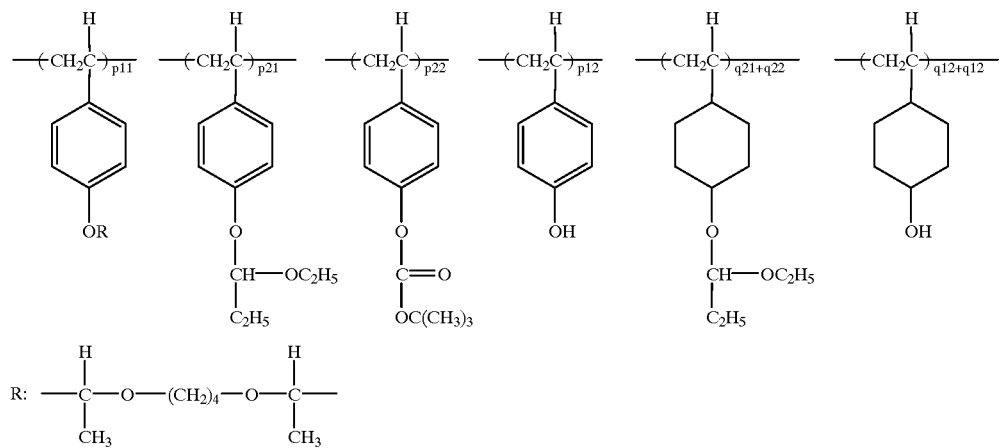
Polym.10
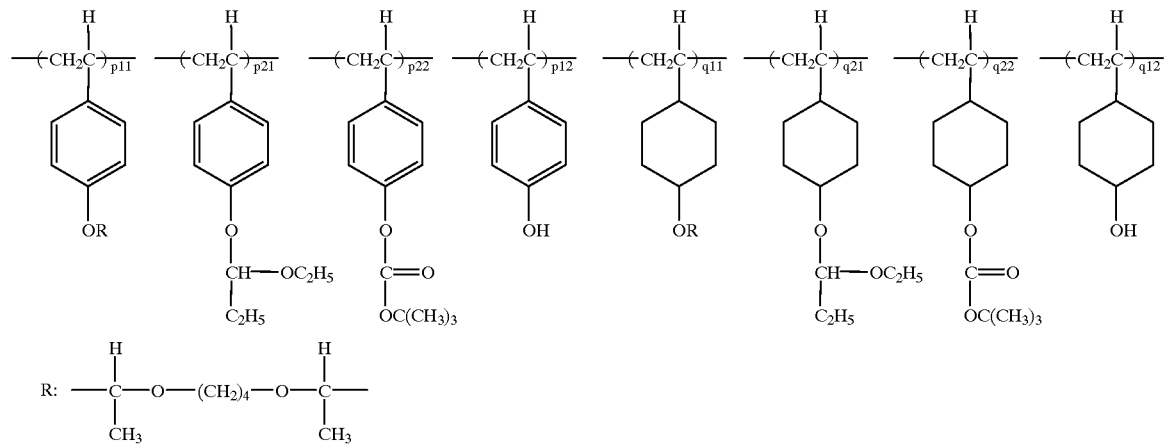

Polym.11
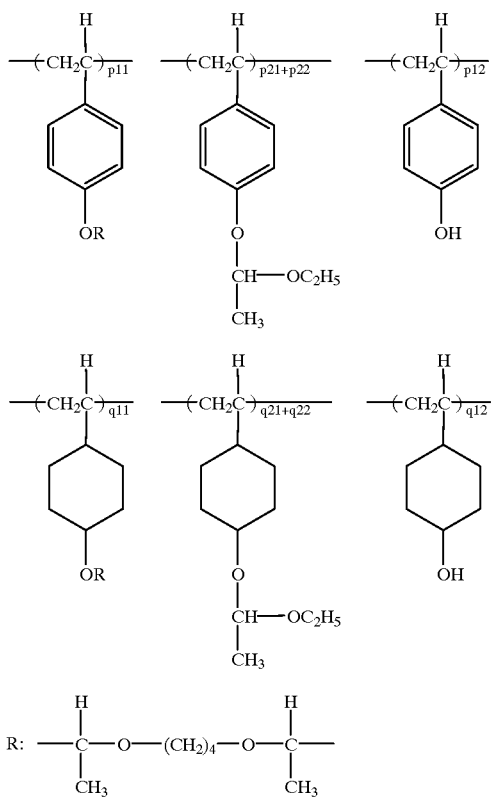
Polym.12
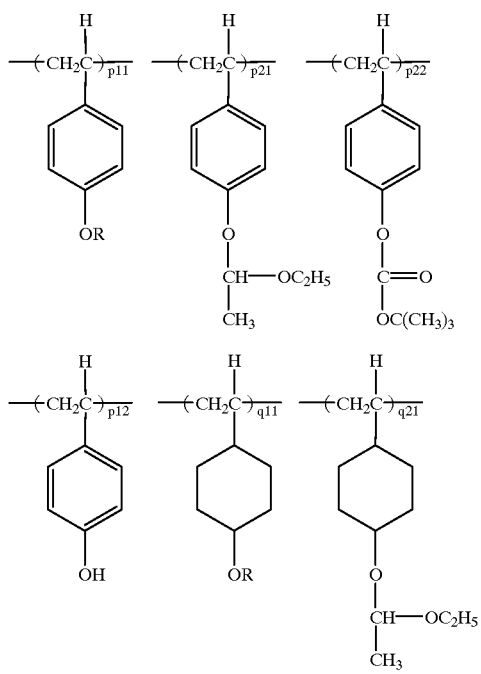
-continued
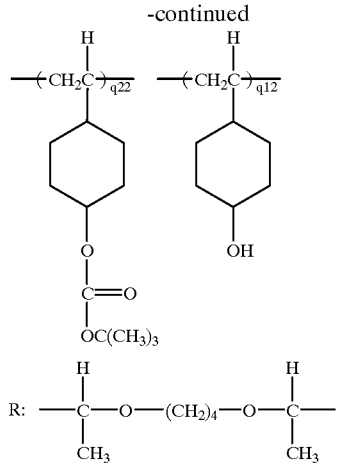
Polym.13
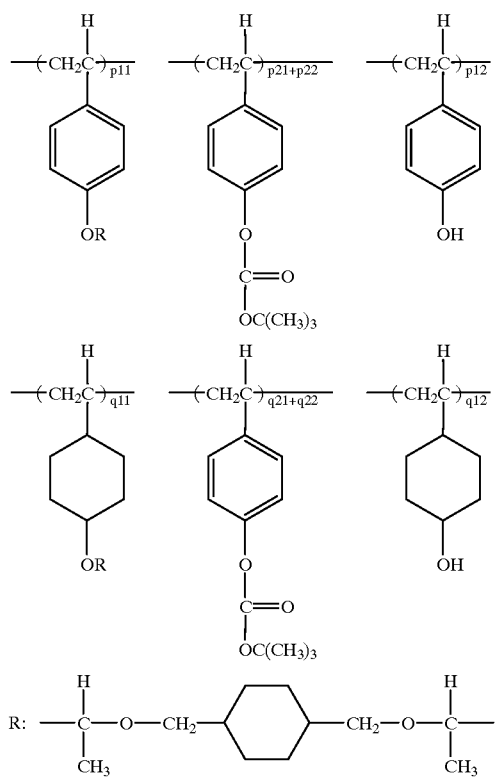
Polym.14
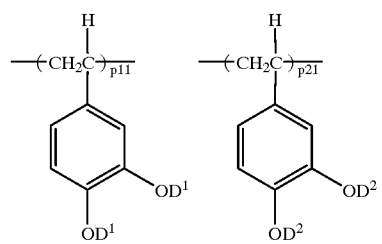

-continued
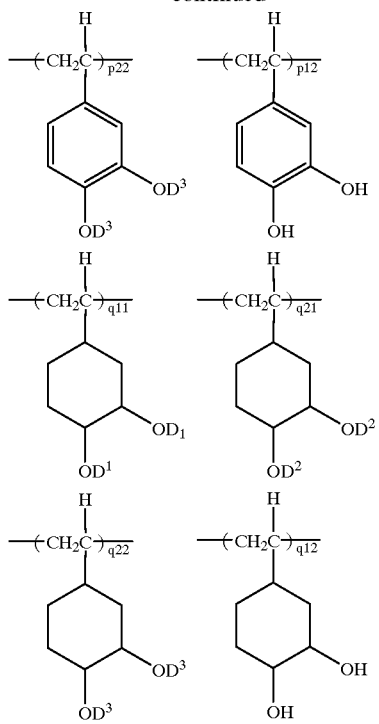
$D^1$ = H or (R)
$D^2$ = H or —CH(OC$_2$H$_5$)C$_2$H$_5$
$D^3$ = H or —C(=O)OC(CH$_3$)$_3$
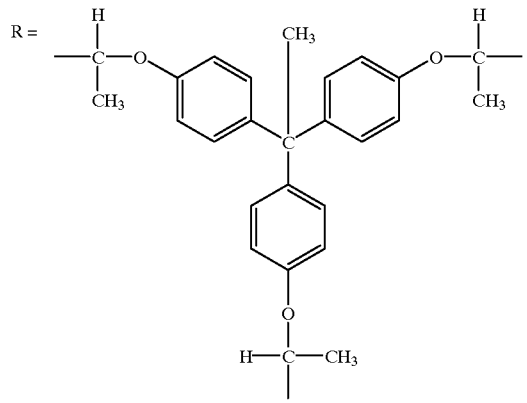
Note that at least one of $D^1$ is R, at least one of $D^2$ is
—CH(OC$_2$H$_5$)C$_2$H$_5$,
and at least one of $D^3$ is
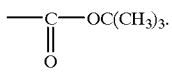
Polym.15
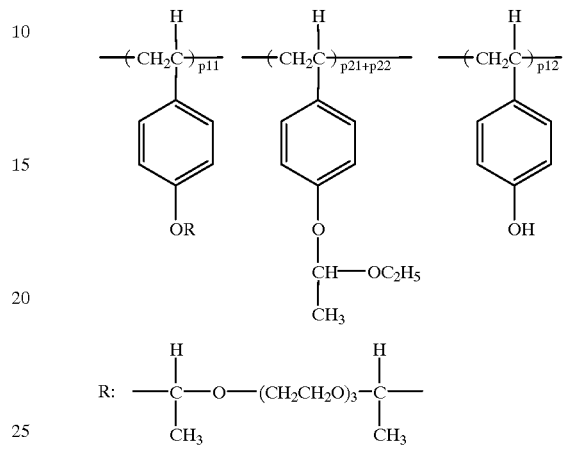
Polym.16
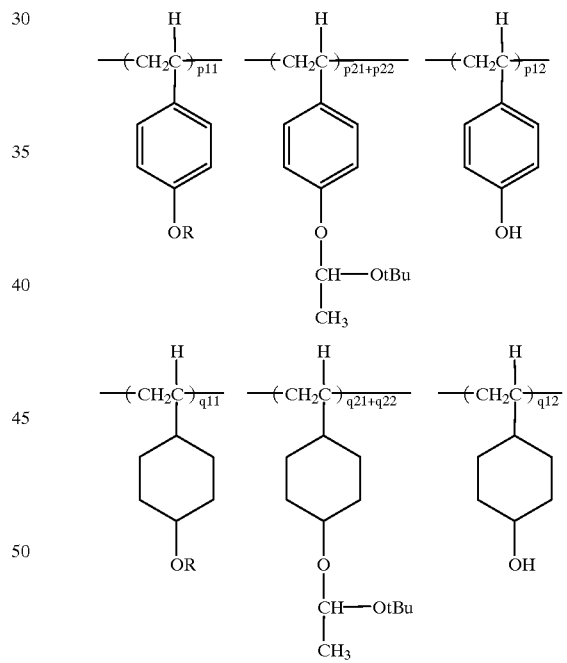

Polym.17
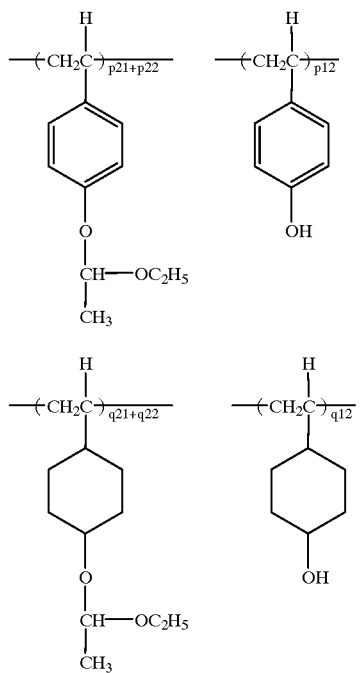
Polym.18
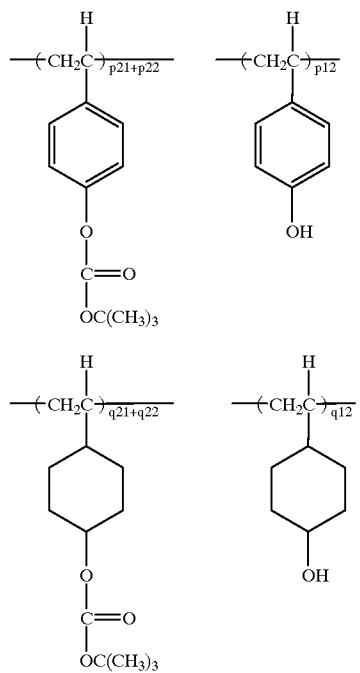
Polym.19
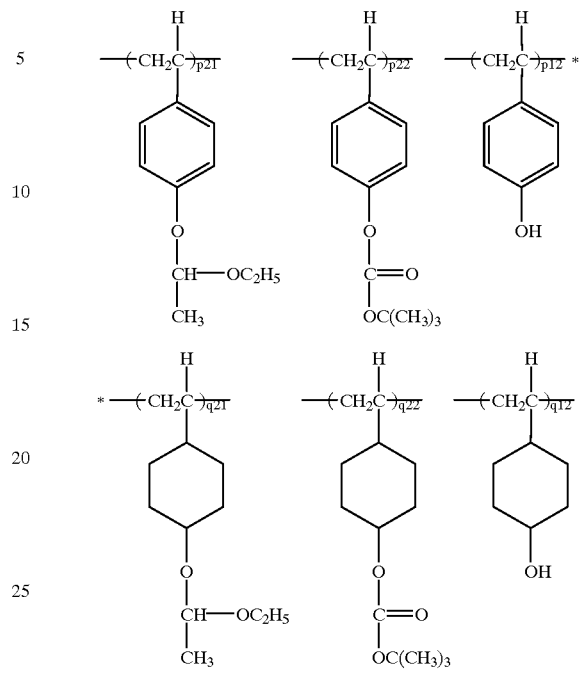
Polym.20
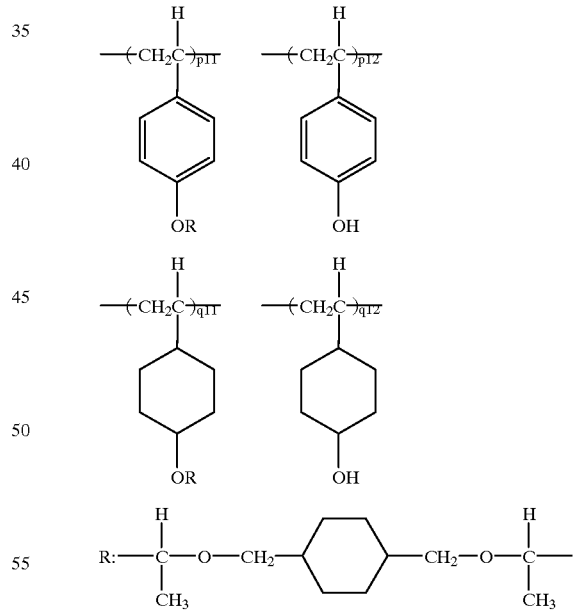

TABLE 1

| | Synthesis Example | Compositional ratio (molar ratio) | | | | | | | | Partially hydrogenated polyhydroxystyrene | | Polymer |
|---|---|---|---|---|---|---|---|---|---|---|---|---|
| | | p11 | p21 | p22 | p12 | q11 | q21 | q22 | q12 | Mw | % hydrogenation | Mw |
| Inventive polymer | 4 [Polym.1] | 2 | 21 | | 62 | 1 | 6 | | 8 | 11,000 | 15 | 22,000 |
| | 5 [Polym.2] | 2 | 21 | 4 | 58 | 1 | 6 | 4 | 4 | 11,000 | 15 | 23,000 |
| | 6 [Polym.3] | 8 | 19 | | 58 | 2 | 5 | | 8 | 11,000 | 15 | 35,000 |
| | 7 [Polym.4] | 4 | 6 | 2.5 | 59.5 | 3 | 4 | 2.5 | 18.5 | 11,000 | 28 | 28,000 |
| | 8 [Polym.5] | 2.5 | 25 | | 44.5 | 1.5 | 10 | | 16.5 | 11,000 | 28 | 23,000 |
| | 9 [Polym.6] | 4 | 17 | | 51 | 3 | 8 | | 17 | 11,000 | 28 | 28,000 |
| | 10 [Polym.7] | 6 | 14 | | 52 | 4 | 6 | | 18 | 11,000 | 28 | 35,000 |
| | 11 [Polym.8] | 4.5 | 21 | | 59.5 | 1 | 5 | | 9 | 11,000 | 15 | 23,000 |
| | 12 [Polym.9] | 2 | 21 | 4 | 58 | 0 | 5 | 4 | 6 | 11,000 | 15 | 22,000 |
| | 13 [Polym.10] | 4 | 16 | 3 | 62 | 1.5 | 5 | 4 | 4.5 | 11,000 | 15 | 23,000 |
| | 14 [Polym.11] | 4 | 24 | | 57 | 1.5 | 7 | | 6.5 | 11,000 | 15 | 24,000 |
| | 15 [Polym.12] | 4 | 15 | 3 | 63 | 1.5 | 3 | 2 | 8.5 | 11,000 | 15 | 23,000 |
| | 16 [Polym.13] | 2 | 4 | | 79 | 1 | 4 | | 10 | 11,000 | 15 | 24,000 |
| | 17 [Polym.14] | 3 | 14 | 2 | 62 | 1 | 6 | 2 | 10 | 10,000 | 19 | 25,000 |
| Comparative polymer | Comparative Synthesis Example 1 [Polym.15] | 3 | 27 | | 70 | 0 | 0 | | 0 | 11,000 | 0 | 24,000 |
| | Comparative Synthesis Example 2 [Polym.16] | 1 | 32 | | 57 | 2 | 5 | | 3 | 4,500 | 10 | 40,000 |
| | [Polym.17] | 0 | 28 | | 57 | 0 | 7 | | 8 | 11,000 | 15 | 24,000 |
| | [Polym.18] | 0 | 11 | | 74 | 0 | 9 | | 6 | 11,000 | 15 | 24,000 |
| | [Polym.19] | 0 | 19 | 4 | 62 | 0 | 5 | 4 | 6 | 11,000 | 15 | 24,000 |
| | [Polym.20] | 11 | 0 | | 74 | 4 | 0 | | 11 | 11,000 | 15 | 24,000 |

Examples 1–25 & Comparative Example 1–6

Liquid resist compositions were prepared by dissolving a polymer designated Polym.1 to Polym.14 as a base resin, a photoacid generator designated PAG.1 to PAG.15, a dissolution regulator designated DRR.1 to DRR.4, a basic compound as shown in Tables 2 and 3, an aromatic compound having a group $\equiv$C—COOH within a molecule designated ACC.1 or ACC.2, and a UV absorber designated DYE.1 or DYE.2 in a solvent in accordance with the formulation shown in Tables 2 and 3. If necessary, 0.1 part of a surfactant Florade FC-430 by Sumitomo 3M K. K. was added for facilitating film formation.

For comparison purposes, liquid resist compositions were similarly prepared in accordance with the formulation shown in Table 4 using a polymer designated Polym.15 to Polym.20 as the base resin.

Each of the compositions was passed through a 0.1-$\mu$m Teflon® filter. The liquid resist composition was then spin coated onto a silicon wafer to dry thickness of 0.7 $\mu$m. With the silicon wafer rested on a hot plate at 100° C., the coating was pre-baked for 90 seconds. The film was exposed to light by means of an excimer laser stepper model NSR-2005EX (manufactured by Nikon, K. K., numerical aperture NA=0.5) through a mask having a desired pattern, baked at 110° C. for 90 seconds, and developed with an aqueous solution of 2.38% tetramethylammonium hydroxide, obtaining a positive pattern.

The resulting resist pattern was evaluated as follows. First, a sensitivity (Eth value) was determined. Provided that the exposure dose with which the top and bottom of a 0.24-$\mu$m line-and-space pattern were resolved at 1:1 was the optimum exposure dose (sensitivity Eop), the minimum line width of a line-and-space patterns which was recognized separate at this exposure dose was the resolution of a test resist. The resolution was also determined under the same conditions except that the post-exposure delay (PED) time from exposure to heat treatment was 2 hours. The profile of the resist pattern resolved was observed under a scanning electron microscope.

In a heat resistance test, each resist pattern was heated on a hot plate at 130° C. for 10 minutes to observe any change of pattern shape before and after heating. The resist pattern was rated "O" (passed) for no change of pattern shape before and after heating and "X" (rejected) when the pattern was degraded by sagging after heating.

Tables 2 and 4 show the formulation of resist compositions. The test results of Examples and Comparative Examples are shown in Tables 5 and 6, respectively.
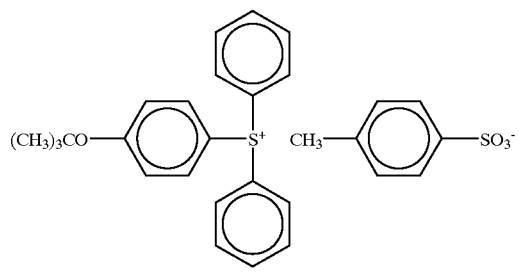
(PAG.1)
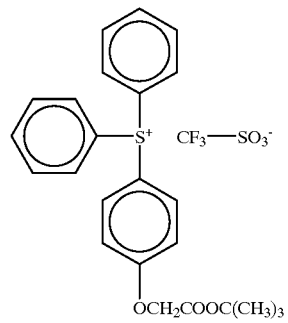
(PAG.2)
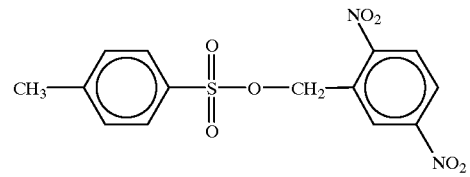
(PAG.3)
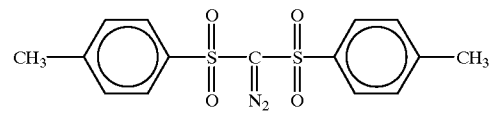
(PAG.4)
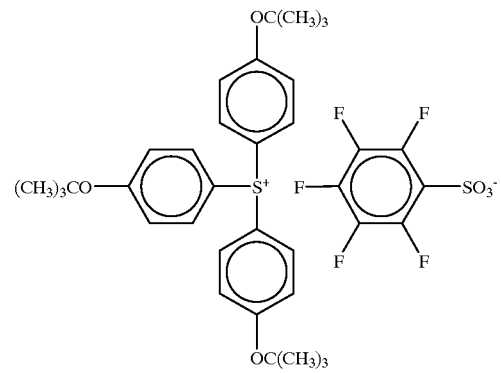
(PAG.5)

-continued
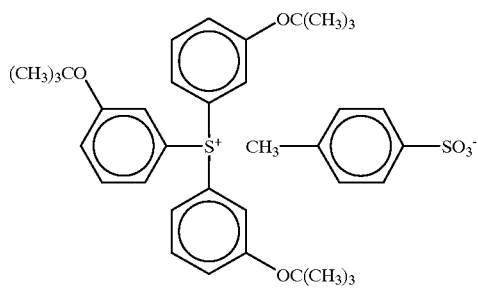
(PAG.6)
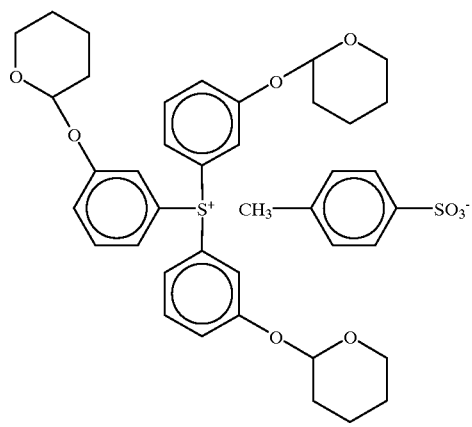
(PAG.7)
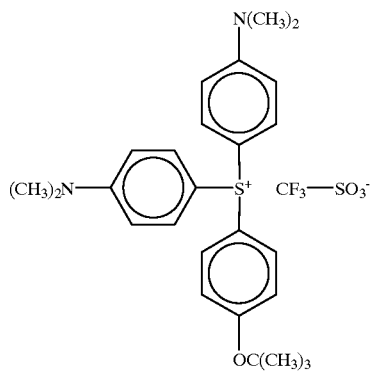
(PAG.8)
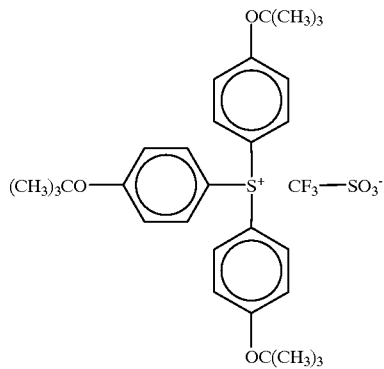
(PAG.9)

-continued
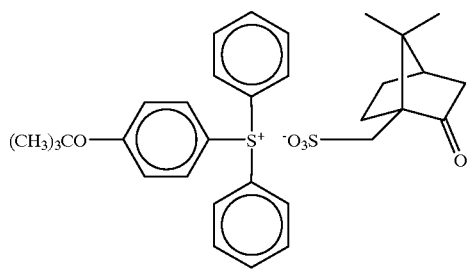
(PAG.10)
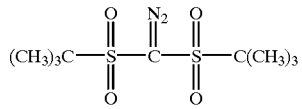
(PAG.11)
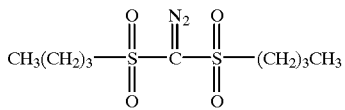
(PAG.12)
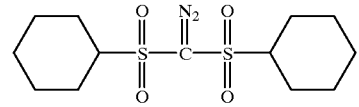
(PAG.13)
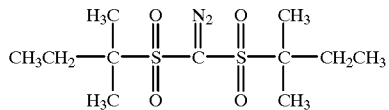
(PAG.14)
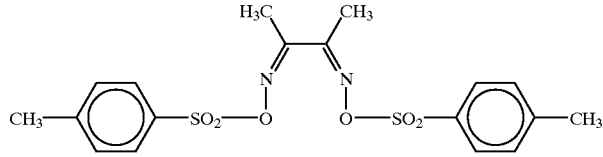
(PAG.15)
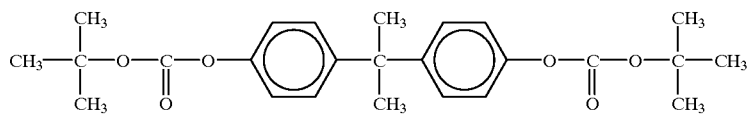
(DRR.1)
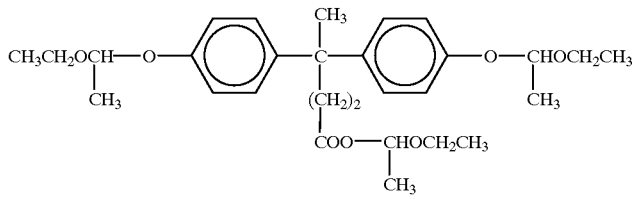
(DRR.2)

-continued
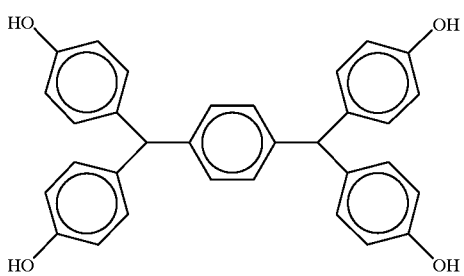
acid labile group: tert-butoxycarbonyl
average substitution: 50%
(DRR.4)
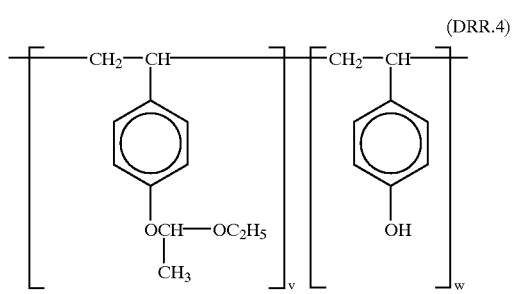
v/(v+w)=0.09
weight average molecular weight: 3,000
ACC.1
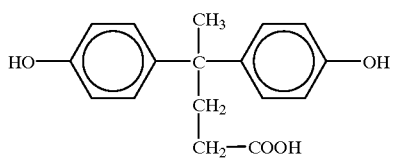
ACC.2
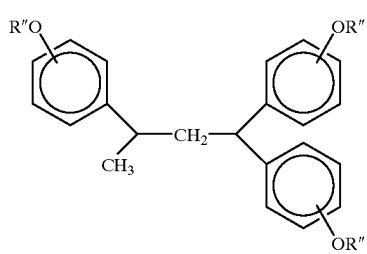
$$\left[ \begin{array}{l} R'' = H \text{ or } CH_2COOH \\ \dfrac{[CH_2COOH]}{[H] + [CH_2COOH]} = 0.5 \end{array} \right]$$
(DRR.3)
-continued
DYE.1
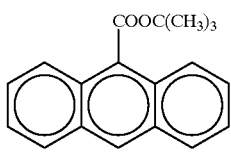
DYE.2
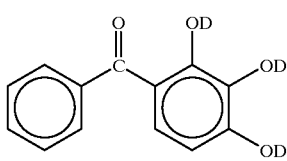
$[DNQ]/[H] + [DNQ] = 0.50$
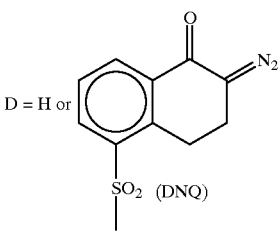
D = H or
(DNQ)

TABLE 2

| No. | Base resin | Photoacid generator | Dissolution regulator | Basic compound | Other additive | Organic solvent |
|---|---|---|---|---|---|---|
| E1 | Polym.1 (80) | PAG.1 (3) | — | — | — | PGMEA (530) |
| E2 | Polym.2 (80) | PAG.2 (3) | — | — | — | PGMEA (530) |
| E3 | Polym.3 (80) | PAG.3 (3) | — | — | — | DGLM (300) |
| E4 | Polym.4 (80) | PAG.4 (3) | — | triethanolamine (0.1) | — | PGMEA (530) |
| E5 | Polym.5 (80) | PAG.5 (3) | — | 2-hydroxypyridine (0.11) | — | PGMEA (530) |
| E6 | Polym.6 (80) | PAG.6 (3) | DRR.1 (16) | tetraethylenediamine (0.09) | — | PGMEA (530) |
| E7 | Polym.7 (80) | PAG.1 (3.5) PAG.8 (0.5) | DRR.3 (16) | quinoline (0.06) | — | EIPA (580) |
| E8 | Polym.8 (80) | PAG.1 (1) PAG.11 (2) | — | triethanolamine (0.1) piperidine ethanol (0.05) | ACC.1 (0.2) | PGMEA (530) |
| E9 | Polym.9 (80) | PAG.1 (1) PAG.11 (2) | — | triethanolamine (0.1) piperidine ethanol (0.05) | ACC.1 (0.2) | PGMEA (530) |
| E10 | Polym.10 (80) | PAG.1 (1) PAG.12 (2) | — | triethanolamine (0.1) 1,8-diazabicycloundecene (0.05) | ACC.1 (0.5) | PGMEA (530) |
| E11 | Polym.11 (80) | PAG.9 (2) PAG.7 (1) | DRR.2 (8) | N-methylpyrrolidone (0.1) | — | EL/BA (510) |
| E12 | Polym.12 (80) | PAG.9 (2) PAG.10 (1) | DRR.4 (8) | N,N-dimethylacetamide (5.0) | — | EL/BA (510) |
| E13 | Polym.11 (50) Polym.13 (30) | PAG.1 (4) | — | tributylamine (0.03) N,N-dimethylacetamide (5.0) | — | PGMEA (530) |

TABLE 3

| No. | Base resin | Photoacid generator | Dissolution regulator | Basic compound | Other additive | Organic solvent |
|---|---|---|---|---|---|---|
| E14 | Polym.11 (40) Polym.14 (40) | PAG.1 (4) | DRR.2 (4) | 2-hydroxypyridine (0.11) | ACC.1 (0.2) | PGMEA (530) |
| E15 | Polym.10 (35) Polym.19 (45) | PAG.9 (4) | — | triethanolamine (0.1) | ACC.1 (0.2) | PGMEA (530) |
| E16 | Polym.8 (80) | PAG.1 (1) PAG.11 (2) | — | triethanolamine (0.05) | DYE.1 (1.2) | PGMEA/ EL (530) |
| E17 | Polym.10 (80) | PAG.1 (1) PAG.11 (2) | — | piperidine ethanol (0.05) | DYE.2 (4) | PGMEA (530) |

TABLE 3-continued

Resist composition (pbw in parentheses)

| No. | Base resin | Photoacid generator | Dissolution regulator | Basic compound | Other additive | Organic solvent |
|---|---|---|---|---|---|---|
| E18 | Polym.11 (80) | PAG.1 (1) PAG.12 (2) | — | TMEEA (0.05) | DYE.1 (1.2) ACC.1 (0.2) | PGMEA (530) |
| E19 | Polym.12 (80) | PAG.1 (1) PAG.12 (2) | — | piperidine ethanol (0.05) | DYE.2 (4) ACC.1 (0.2) | PGMEA (530) |
| E20 | Polym.1 (80) | PAG.1 (2) | DRR.1 (4) DRR.3 (4) | N-methylpyrrolidone (0.05) | — | PGMEA/ EP (530) |
| E21 | Polym.1 (80) | PAG.1 (2) | DRR.2 (4) DRR.4 (4) | N-methylpyrrolidone (0.05) | — | PGMEA/ CH (530) |
| E22 | Polym.2 (80) | PAG.1 (2) | — | TMMEA (0.05) | — | PGMEA (530) |
| E23 | Polym.1 (80) | PAG.13 (3) | — | N,N-dimethylacetamide (5.0) | DYE.2 (4) | PGMEA (530) |
| E24 | Polym.2 (80) | PAG.14 (3) | — | TMEMEA (0.1) | DYE.2 (4) | PGMEA (530) |
| E25 | Polym.1 (80) | PAG.1 (1) PAG.15 (2) | — | triethanolamine (0.1) | — | PGME (530) |

TABLE 4

Resist composition (pbw in parentheses)

| No. | Base resin | Photoacid generator | Dissolution regulator | Basic compound | Other additive | Organic solvent |
|---|---|---|---|---|---|---|
| CE1 | Polym.15 (80) | PAG.1 (2) | — | N-methylpyrrolidone (0.05) | — | PGMEA (530) |
| CE2 | Polym.16 (80) | phenyl-cumyl-disulfone (1) | — | 4,4'-diaminodiphenyl ether (0.2) | — | 1-methoxy-2-propyl acetate |
| CE3 | Polym.17 (80) | PAG.1 (2) | — | N-methylpyrrolidone (0.05) | — | PGMEA (530) |
| CE4 | Polym.18 (80) | PAG.1 (2) | — | N-methylpyrrolidone (0.05) | — | PGMEA (530) |
| CE5 | Polym.19 (80) | PAG.1 (2) | — | N-methylpyrrolidone (0.05) | — | PGMEA (530) |
| CE6 | Polym.20 (80) | PAG.1 (2) | — | N-methylpyrrolidone (0.05) | — | PGMEA (530) |

Note: The abbreviations under the heading of "solvent" have the following meaning.
DGLM: diethylene glycol dimethyl ether
EIPA: 1-ethoxy-2-propanol
EL/BA: a 85%/15% by weight mixture of ethyl lactate and butyl acetate
PGMEA: propylene glycol monomethyl ether acetate
PGMEA/EP: a 90%/10% by weight mixture of propylene glycol monomethyl ether acetate and ethyl pyruvate
PGMEA/CH: a 90%/10% by weight mixture of propylene glycol monomethyl ether acetate and cyclohexanone
PGMEA/EL: a 70%/30% by weight mixture of propylene glycol monomethyl ether acetate and ethyl lactate
PGME: propylene glycol monomethyl ether
TMEEA: tris{2-(2-methoxyethoxy)ethyl}amine
TMMEA: tris{2-(methoxymethoxy)ethyl}amine
TMEMEA: tris [2-{(2-methoxyethoxy)methoxy}ethyl]amine

TABLE 5

| Example | Sensitivity Eop (mJ/cm²) | Resolution (μm) Instant | Resolution (μm) PED 2 hr. | Profile Instant/PED 2 hr. | Heat resistance |
|---|---|---|---|---|---|
| 1 | 6.0 | 0.20 | 0.20 | rectangular | o |
| 2 | 7.0 | 0.20 | 0.20 | rectangular | o |
| 3 | 8.0 | 0.20 | 0.20 | rectangular | o |
| 4 | 30.0 | 0.18 | 0.18 | rectangular | o |
| 5 | 35.0 | 0.18 | 0.18 | rectangular | o |
| 6 | 25.0 | 0.18 | 0.18 | rectangular | o |
| 7 | 18.0 | 0.18 | 0.18 | rectangular | o |
| 8 | 31.0 | 0.18 | 0.18 | rectangular | o |
| 9 | 30.0 | 0.20 | 0.20 | rectangular | o |
| 10 | 30.0 | 0.18 | 0.18 | rectangular | o |
| 11 | 26.0 | 0.18 | 0.18 | rectangular | o |
| 12 | 20.0 | 0.18 | 0.18 | rectangular | o |
| 13 | 24.0 | 0.18 | 0.18 | rectangular | o |
| 14 | 25.0 | 0.18 | 0.18 | rectangular | o |
| 15 | 22.0 | 0.18 | 0.18 | rectangular | o |
| 16 | 23.0 | 0.20 | 0.20 | sl. forward tapered | o |
| 17 | 24.0 | 0.20 | 0.20 | sl. forward tapered | o |
| 18 | 23.0 | 0.20 | 0.20 | sl. forward tapered | o |
| 19 | 24.0 | 0.20 | 0.20 | sl. forward tapered | o |
| 20 | 19.0 | 0.18 | 0.18 | rectangular | o |
| 21 | 20.0 | 0.18 | 0.18 | rectangular | o |
| 22 | 20.0 | 0.18 | 0.18 | rectangular | o |
| 23 | 22.0 | 0.20 | 0.20 | sl. forward tapered | o |
| 24 | 22.0 | 0.20 | 0.20 | sl. forward tapered | o |
| 25 | 23.0 | 0.20 | 0.20 | rectangular | o |

TABLE 6

| Comparative Example | Sensitivity Eop (mJ/cm²) | Resolution (μm) Instant | Resolution (μm) PED 2 hr. | Profile Instant/PED 2 hr. | Heat resistance |
|---|---|---|---|---|---|
| 1 | 20.0 | 0.22 | 0.20 | rectangular/reverse tapered | X |
| 2 | 50.0 | 0.35 | 0.35 | rectangular | X |
| 3 | 22.0 | 0.22 | not resolved | rectangular/not resolved | X |
| 4 | 21.0 | 0.22 | 0.26 | rectangular/T-top | X |
| 5 | 17.0 | 0.24 | 0.22 | rectangular/reverse tapered | o |
| 6 | 10.0 | 0.22 | 0.20 | rectangular/reverse tapered | o |

Additionally, an acetylene alcohol derivative, Surfynol E1004 (Nisshin Chemical Industry K. K.) of the structural formula shown below was added to the resist compositions of Examples 14, 16, 18 and 20 in an amount of 0.05% by weight of the composition. The Surfynol-containing compositions and Surfynol-free compositions were allowed to stand and observed whether or not particles (foreign matter) increased as a rating of storage stability. The test was an accelerated test of storage at 40° C. for 4 months. Using a counter KL-20A (Rion K. K.) for counting the number of particles in liquid, particles having a particle size of more than 0.3 μm were monitored. The results are shown in Table 7.

TABLE 7

Surfynol E1004

$$CH_3\text{-}CHCH_2\text{-}\underset{\underset{CH_3}{|}}{\overset{\overset{(CH_2CH_2O)_{m'}\text{-}H}{|}}{\overset{|}{C}}}\text{-}C{\equiv}C\text{-}\underset{\underset{O}{|}}{\overset{\overset{CH_3}{|}}{C}}\text{-}CH_2CH\overset{CH_3}{\underset{CH_3}{\diagdown\diagup}}$$

$$(CH_2CH_2O)_{n'}\text{-}H$$

$$m' + n' = 3.5$$

| | Count of particles per ml | | |
|---|---|---|---|
| | As filtered | Surfynol-free After 4 months | Surfynol added After 4 months |
| Example 14 | 4 | 31 | 8 |
| Example 16 | 3 | 25 | 7 |
| Example 18 | 3 | 30 | 1 |
| Example 20 | 5 | 37 | 12 |

Although some preferred embodiments have been described, many modifications and variations may be made thereto in the light of the above teachings. It is therefore to be understood that within the scope of the appended claims, the invention may be practiced otherwise than as specifically described.

We claim:

1. A partially hydrogenated polymer comprising recurring units of the following general formula (2), the polymer being crosslinked within a molecule and/or between molecules with at least one crosslinking group having a C—O—C linkage resulting from reaction of some of the phenolic hydroxyl groups and/or alcoholic hydroxyl groups represented by R with an alkenyl ether compound or halogenated alkyl ether compound, the amount of the acid labile group(s) and the crosslinking group(s) combined being on the average from more than 0 mol % to 80 mol % of the entirety of the phenolic hydroxyl group(s) and alcoholic hydroxyl group(s) in formula (2), the polymer having a weight average molecular weight of 1,000 to 500,000,

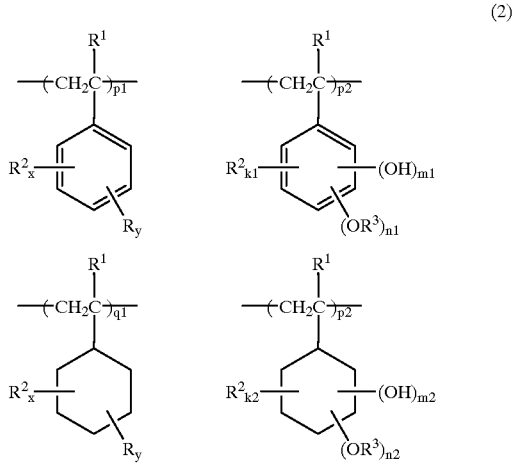

(2)

wherein R is a hydroxyl group or $OR^3$, at least one of the R groups is a hydroxyl group, $R^1$ is hydrogen or methyl, $R^2$ is a normal, branched or cyclic alkyl group of 1 to 8 carbon atoms, $R^3$ is an acid labile group, letter x is 0 or a positive integer, letter y is a positive integer, the sum of x+y is up to 5, letters k1, m1 and n1 are 0 or positive integers, the sum of k1+m1+n1 is up to 5, letters k2, m2 and n2 are 0 or positive integers, the sum of k2+m2+n2 is up to 5, with the proviso that n1 and n2 are not equal to 0 at the same time, letters p1 and 2 are 0 or positive numbers, letters q1 and q2 are 0 or positive numbers, and p1, p2, q1 and q2 satisfy $0 \leq p1/p1+p2+q1+q2) \leq 0.8$, $0 \leq q1/(p1+p2+q1+q2) \leq 0.5$, $0.5 \leq (p1+p2)/(p1+p2+q1+q2)<1$, $0<(q1+q2)/(p1+p2+q1+q2) \leq 0.5$, and p1+p2+q1+q2=1, with the proviso that p1 and q1 are not equal to 0 at the same time and p2 and q2 are not equal to 0 at the same time.

2. The partially hydrogenated polymer of claim 1 comprising recurring units of the following general formula (3), some hydrogen atoms being eliminated from phenolic hydroxyl groups and/or alcoholic hydroxyl groups represented by R to leave oxygen atoms which are crosslinked with at least one crosslinking group having a C—O—C linkage of the following general formula (4a) or (4b) within a molecule and/or between molecules, the amount of the acid labile group(s) and the crosslinking group(s) combined being on the average from more than 0 mol % to 80 mol % of the entire hydrogen atoms of the phenolic hydroxyl group)s) and alcoholic hydroxyl group(s) in formula (3)

the polymer having a weight average molecular weight of 1,000 to 500,000,

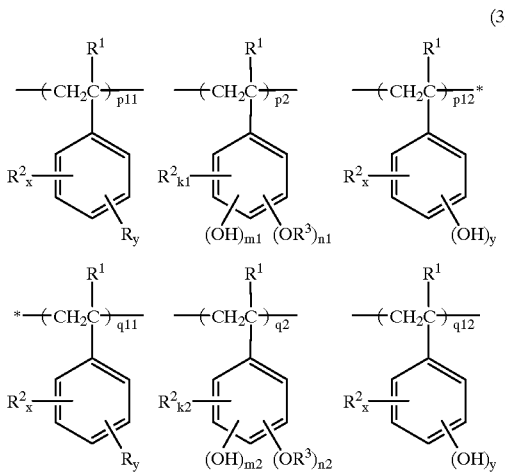

(3)

wherein R is a hydroxyl group or $OR^3$, at least one of the R groups is a hydroxyl group, $R^1$ is hydrogen or methyl, $R^2$ is a normal, branched or cyclic alkyl group of 1 to 8 carbon atoms, $R^3$ is a group of the following general formula (5), a group of the following general formula (6), a tertiary alkyl group of 4 to 20 carbon atoms, a trialkylsilyl group whose alkyl groups each have 1 to 6 carbon atoms or an oxoalkyl group of 4 to 20 carbon atoms, letters p11, p12, p2, q11, q12 and q2 are 0 or positive numbers and satisfy $0 \leq p11(p11+p12+p2+q11+q12+q2) \leq 0.8$, $0 \leq p2(p11+p12+p2+q11+q12+q2) \leq 0.8$, $0 \leq q11/(p11+p12+p2+q11+q12+q2) \leq 0.5$, $0 \leq q2/(p11+p12+p2+q11+q12+q2) \leq 0.5$, $0.5 \leq (p11+p12+p2)/(p11+p12+p2+q11+q12+q2)<1$, $0<(q11+q12+q2)/(p11+p12+p2+q11+q12+q2) \leq 0.5$, and p11+p12+p2+q11+q12+q2=1, with the proviso that p11 and q11 are not equal to 0 at the same time and p2 and q2 are not equal to 0 at the same time, letters x, y, k1, m1, n1, k2, m2 and n2 are as defined above,

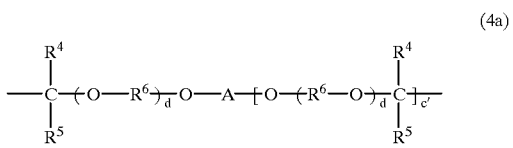

(4a)

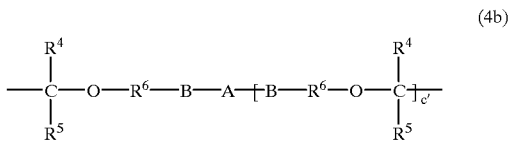

(4b)

wherein $R^4$ and $R^5$ each are hydrogen or a normal, branched or cyclic alkyl group of 1 to 8 carbon atoms, or $R^4$ and $R^5$, taken together, may form a ring, with the proviso that each of $R^4$ and $R^5$ is a normal or branched alkylene group of 1 to 8 carbon atoms when they form a ring, $R^6$ is a normal or branched alkylene group of 1 to 10 carbon atoms, letter d is 0 or an integer of 1 to 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c is an integer of 2 to 8, c' is an integer of 1 to 7,

(5)

(6)

wherein $R^7$ and $R^8$ each are hydrogen or a normal branched or cyclic alkyl group of 1 to 8 carbon atoms, $R^9$ is a monovalent hydrocarbon group of 1 to 18 carbon atoms which may have a hetero atom, or $R^7$ and $R^8$, $R^7$ and $R^9$, or $R^8$ and $R^9$, taken together, may form a ring, with the proviso that each of $R^7$, $R^8$ and $R^9$ is a normal or branched alkylene group of 1 to 6 carbon atoms when they form a ring, $R^{10}$ is a tertiary alkyl group of 1 to 12 carbon atoms, a trialkylsilyl group whose alkyl groups each have 1 to 6 carbon atoms, an oxoalkyl group of 4 to 20 carbon atoms or a group of formula (5), and letter a is an integer of 0 to 6.

3. The partially hydrogenated polymer of claim 2 wherein the at least one crosslinking group having a C—O—C linkage represented by the general formula (4a) or (4b) is represented by the following general formula (4a''') or (4b'''):

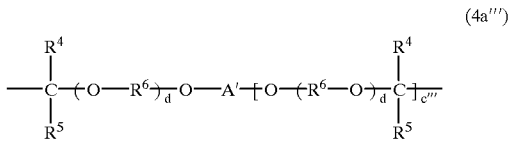

(4a''')

-continued

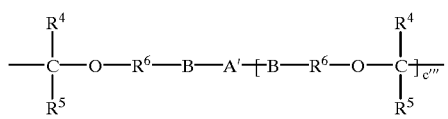
(4b''')

wherein $R^4$ and $R^5$ each are hydrogen or a normal, branched or cyclic alkyl group of 1 to 8 carbon atoms, or $R^4$ and $R^5$, taken together, may form a ring, with the proviso that each of $R^4$ and $R^5$ is a normal or branched alkylene group of 1 to 8 carbon atoms when they form a ring, $R^6$ is a normal or branched alkylene group of 1 to 10 carbon atoms, letter d is 0 or an integer of 1 to 5, A' is a c''-valent normal or branched alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —C—O—, —NHCO—O— or —NHCONH—, letter c'' is an integer of 2 to 4, and c''' is an integer of 1 to 3.

4. The partially hydrogenated polymer of claim 1, wherein the total of crosslinking group(s) having a C—O—C linkage is on the average from 0.2 to 20 mol % of the entire hydrogen atoms of phenolic hydroxyl group and alcoholic hydroxyl groups in formula (2).

5. The partially hydrogenated polymer of claim 1, wherein the total of acid labile group(s) is on the average from 10 to 50 mol % of the entire hydrogen atoms of phenolic hydroxyl group and alcoholic hydroxyl groups in formula (2).

6. The partially hydrogenated polymer of claim 1, wherein the polymer has an average molecular weight of 3,000 to 30,000.

7. The partially hydrogenated polymer of claim 1, wherein the polymer is monodisperse having a molecular weight dispersity of 1.0 to 1.5

8. A chemically amplified positive resist composition comprising (A) an organic solvent,
(B) a base resin in the form of the partially hydrogenated polymer of claim 1, and
(C) a photoacid generator.

9. The resist composition of claim 8 further comprising (D) another base resin in the form of a polymer comprising recurring units of the following general formula (1), some of the hydrogen atoms of phenolic hydroxyl groups and/or alcoholic hydroxyl groups being replaced by acid labile groups of at least one type in an average proportion of 0 mol % to 80 mol % of the entirety, said polymer having a weight average molecular weight of 3,000 to 300,000,

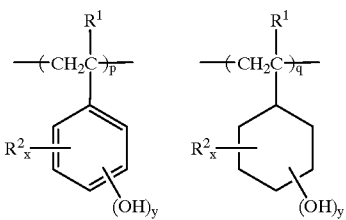
(1)

wherein $R^1$ is hydrogen or methyl, $R^2$ is a normal, branched or cyclic alkyl group of 1 to 8 carbon atoms, letter x is 0 or a positive integer, y is a positive integer, the sum of x+y is up to 5, letters p and q are positive numbers satisfying p+q=1 and $0<q/(p+q)\leq 0.5$ 10. The resist composition of claim 8 further comprising (E) a dissolution regulator.

11. The resist composition of claim 8 further comprising (F) a basic compound.

12. The resist composition of claim 8 further comprising (G) an aromatic compound having a group: ≡C—COOH in a molecule.

13. The resist composition of claim 8 further comprising (H) an acetylene alcohol derivative.

14. A chemically amplified positive resist composition comprising:

(A) an organic solvent,
(B) a base resin in the form of the partially hydrogenated polymer of claim 3, and
(C) a photoacid generator.

15. The resist composition of claim 14 further comprising (E) a dissolution regulator.

16. The resist composition of claim 14 further comprising (F) a basic compound.

17. The resist composition of claim 14 further comprising (G) an aromatic compound having a group: ≡C—COOH in a molecule.

18. The resist composition of claim 14 further comprising (H) an acetylene alcohol derivative.

19. A chemically amplified positive resist composition comprising:

(A) an organic solvent,
(B) a base resin in the form of the partially hydrogenated polymer of claim 4, and
(C) a photoacid generator.

20. The resist composition of claim 19 further comprising (E) a dissolution regulator.

21. The resist composition of claim 19 further comprising (F) a basic compound.

22. The resist composition of claim 19 further comprising (G) an aromatic compound having a group: ≡C—COOH in a molecule.

23. The resist composition of claim 19 further comprising (H) an acetylene alcohol derivative.

* * * * *